(12) United States Patent
Nii

(10) Patent No.: US 8,363,456 B2
(45) Date of Patent: Jan. 29, 2013

(54) SEMICONDUCTOR DEVICE

(75) Inventor: Koji Nii, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 210 days.

(21) Appl. No.: 12/975,400

(22) Filed: Dec. 22, 2010

(65) Prior Publication Data

US 2011/0157965 A1    Jun. 30, 2011

(30) Foreign Application Priority Data

Dec. 24, 2009   (JP) .................................. 2009-292189

(51) Int. Cl.
    *G11C 11/00*    (2006.01)
(52) U.S. Cl. ....... 365/156; 365/49.11; 365/63; 365/154; 365/188; 365/202
(58) Field of Classification Search ................... 365/156, 365/49.11, 63, 154, 188, 190, 202
    See application file for complete search history.

(56) References Cited

U.S. PATENT DOCUMENTS

| | | | | |
|---|---|---|---|---|
| 7,113,421 B2* | 9/2006 | Maeda et al. | ................. | 365/154 |
| 7,190,031 B2* | 3/2007 | Chakihara et al. | ............. | 257/365 |
| 7,977,183 B2* | 7/2011 | Koide | ............................ | 438/238 |
| 2001/0043487 A1 | 11/2001 | Nii et al. | | |
| 2002/0067637 A1 | 6/2002 | Nii | | |
| 2003/0034571 A1 | 2/2003 | Nii | | |
| 2004/0007785 A1 | 1/2004 | Okada | | |
| 2004/0218455 A1 | 11/2004 | Nii | | |
| 2006/0289945 A1 | 12/2006 | Nii | | |

FOREIGN PATENT DOCUMENTS

| | | | |
|---|---|---|---|
| JP | 2002-43441 | A | 2/2002 |
| JP | 2002-237539 | A | 8/2002 |
| JP | 2003-60089 | A | 2/2003 |
| JP | 2004-47529 | A | 2/2004 |
| JP | 2004-335535 | A | 11/2004 |
| JP | 2006-339480 | A | 12/2006 |

OTHER PUBLICATIONS

Hiroki Noguchi et al. "Which is the Best Dual-Port SRAM in 45-nm Process Technology? -8T, 10T Single End, and 10T Differential-", "Proceedings of ICICDT", 2008, pp. 55 to 58.

* cited by examiner

*Primary Examiner* — Fernando Hidalgo
(74) *Attorney, Agent, or Firm* — Miles and Stockbridge P.C.

(57) ABSTRACT

To improve reliability of a semiconductor device having an SRAM.
The semiconductor device has a memory cell including six n-channel type transistors and two p-channel type transistors formed over a silicon substrate. Over the silicon substrate, a first p well, a first n well, a second p well, a second n well, and a third p well are arranged in this order when viewed in a row direction. First and second positive-phase access transistors are disposed in the first p well, first and second driver transistors are disposed in the second p well, and first and second negative-phase access transistors are arranged in the third p well.

20 Claims, 44 Drawing Sheets

SEMICONDUCTOR DEVICE

CROSS-REFERENCE TO RELATED APPLICATION

The disclosure of Japanese Patent Application No. 2009-292189 filed on Dec. 24, 2009 including the specification, drawings and abstract is incorporated herein by reference in its entirety.

BACKGROUND OF THE INVENTION

The present invention relates to technology of a semiconductor device and particularly, to technology effective when applied to a semiconductor device having an SRAM (Static Random Access Memory).

In an electronic device desired to improve performance and increase speed, it is indispensable to mount a microcomputer and in the configuration of a microcomputer, packaging of a high-speed memory with a large capacity is desired. In particular, in order to realize higher-speed processing, it is demanded to increase the capacity of a cache memory. That is, a RAM used by a CPU (Central Processing Unit) of a computer when executing a control program etc. is desired to increase speed and capacity.

As such a RAM, a DRAM (Dynamic RAM) and an SRAM are used generally, however, at a part where high-speed processing is required, such as the above-described cache memory, an SRAM is used usually. As the structure of a memory cell of an SRAM, a high-resistance load type including four transistors and two high-resistance elements and a CMOS type including six transistors are known. In particular, the CMOS type SRAM has a very small leak current when holding data, and therefore, is highly reliable and the mainstream at present.

In general, in a memory cell, reduction in the area of element surface means not only downsizing of the memory cell array but also realization of high speed. Hence, various layouts of memory cell structure have been proposed in order to realize higher-speed operations of the SRAM. Particularly, in recent years, technology of a multiprocessor has been introduced as means for realizing high speed of a computer and it is demanded for a plurality of CPUs to share one memory region. That is, various layouts have been proposed for a two-port (also referred to as dual-port) SRAM that enables accesses to one memory cell from two ports.

For example, Japanese Patent Laid-Open No. 2002-43441 (Patent Document 1) and Japanese Patent Laid-Open No. 2002-237539 (Patent Document 2) disclose a structure in which of a P-well region and an N-well region in which each MOS transistor constituting a multi-port SRAM is disposed, the P-well region is divided into two regions and disposed on both sides of the N-well region.

For example, Japanese Patent Laid-Open No. 2004-47529 (Patent Document 3) discloses a structure in which well regions are arranged in order of P/N/P/N/P in a multi-port SRAM and in the P wells at both ends, a driver transistor is arranged, in each of the two N wells, a load transistor is arranged, and in the center P well, two access transistors are disposed.

For example, Japanese Patent Laid-Open No. 2006-339480 (Patent Document 4) discloses a structure in which a source contact of a driver transistor is short-circuited by an internal metal wire in an SRAM cell.

For example, Japanese Patent Laid-Open No. 2003-60089 (Patent Document 5) discloses a layout structure in which a P well is caused to be independent for each cell and the boundaries with cells neighboring to the right and left are constituted by an N well in an SRAM.

For example, Japanese Patent Laid-Open No. 2004-335535 (Patent Document 6) discloses a method of reducing coupling noises between word lines in a dual-port SRAM.

For example, Non-Patent Document 1 ("Proceedings of ICICDT", 2008, pp. 55 to 58) discloses a structure of an SRAM having well separation regions in three positions.

SUMMARY OF THE INVENTION

The inventors of the present invention have examined the application of the above-mentioned technology to a semiconductor device having an SRAM, and revealed the following problem. That is, it has been found that as the SRAM cell becomes finer, a soft error (multi-bit soft error, hereinafter, simply referred to as a multi-bit error) between adjacent bits becomes more likely to occur. A soft error is a phenomenon in which a number of pairs of electron and hole are generated by the collision of the alpha ray emitted from a package and the neutron beam from the universe to the silicon atoms and when electrons generated particularly in a P well are collected in an N-type diffusion layer, the potential of a storage node is reversed and thereby a malfunction is caused. Here, in the N-type diffusion layers in an identical P well, electrons are collected at the same time, and therefore, in the case of an array structure in which the P well is shared by neighboring cells, there is a possibility that the storage nodes of a two-bit cell are reversed at the same time. This is the multi-bit-error.

For example, in each of Patent Documents 1, 2 and 4 and Non-Patent Document 1, the N well is disposed at the center of the cell and the P wells are disposed on both sides thereof. That is, there are two well separation regions in the cell, which are the boundaries between the P well and the N well. However, in Non-Patent Document 1, there is an additional PMOS in a memory cell including six transistors, and therefore, there are three well separation regions in the cell. Further, except for Patent Document 4, the N-type diffusion regions corresponding to a pair of storage nodes in the memory cell are formed in the different P well regions (P well regions disposed on the right-hand and left-hand sides). In these memory cells, in memory cells neighboring each other in the row direction, the P well is shared on at least one of the right-hand and left-hand sides, and therefore, there is a possibility that the multi-bit error occurs.

As measures against the soft error, there is a method of adding an error check and correct (ECC) circuit. The inventors of the present invention have also examined in advance the error correcting method by the ECC circuit. It is made possible to detect a two-bit error and to correct one-bit error by adding the ECC circuit the inventors of the present invention have examined in advance. However, when an attempt is made to correct a two- or more-bit error, the circuit configuration is complicated and the size of the circuit is increased considerably, which is not desirable. That is, if a two-bit error occurs at the same time, it is not possible to correct the error by the normal ECC circuit, and therefore, there is a possibility that the multi-bit error occurs at the same time in neighboring cells.

FIGS. 46A and 46B are explanatory diagrams showing address mapping of memory cells arranged in an array, wherein FIG. 46A shows an eight-row, four-column memory array and FIG. 46B shows a four-row, eight-column memory array. That is, FIGS. 46A and 46B illustrate two kinds of memory array with four-bit data width and addresses 0 to 7. The numbers indicate addresses selected at the same time. For example, when 3 is selected, all the addresses to which 3 is attached are selected and others are not read even if the word line is in the selected state.

For example, even if the soft error occurs in the three successive cells on the same bit line as relevant part P01 or relevant part P03, only one bit of the four bits is erroneous in the data to be read, and therefore, it is possible to correct the error by the ECC circuit. Further, for example, even if the soft error occurs in the two successive cells on the same word line as relevant part P04, it is possible to correct the error by the ECC circuit in the four-row, eight-column memory array. However, when the soft error occurs in the two cells on the same word line in the eight-row, four-column memory array as relevant part P02 or in the three successive cells on the same word line in the four-row, eight-column memory array as relevant part P05, a very complicated circuit configuration is required to correct the error by the ECC circuit.

As described above, it has been made clear by the examination of the inventors of the present invention that the multi-bit error that occurs at the same time in the SRAM memory cells neighboring in the row direction is a cause of the reduction in reliability of a semiconductor device having an SRAM.

The present invention has been made in view of the above circumstances and provides technology to improve reliability of a semiconductor device having an SRAM.

The other purposes and the new feature of the present invention will become clear from the description of the present specification and the accompanying drawings.

The following explains briefly the outline of an embodiment among a plurality of the inventions disclosed in the present application.

A semiconductor device having a plurality of memory cells arranged in a row direction and a column direction of a semiconductor substrate and for the semiconductor substrate, a first n well and a second n well of n-conductive type extending in the column direction, and a first p well, a second p well and a third p well of p-conductive type extending in the column direction, respectively, are formed, and the first p well, the first n well, the second p well, the second n well and the third p well are arranged in this order when viewed in the row direction. The memory cell has a first inverter including a first driver transistor of n-channel type and a first load transistor of p-channel type, a second inverter including a second driver transistor of n-channel type and a second load transistor of p-channel type, and a positive-phase access transistor and a negative-phase access transistor of n-channel type. Here, cells of the memory cells, which are arranged side by side in the row direction, are connected by a word line extending along the row direction and cells arranged side by side in the column direction are connected by a positive-phase bit line and a negative-phase bit line extending along the column direction. An output terminal of the first inverter is coupled to an input terminal of the second inverter as a first storage node and an input terminal of the first inverter is coupled to an output terminal of the second inverter as a second storage node. In the positive-phase access transistor, a gate and the word line, a drain and the positive-phase bit line, and a source and the first storage node are coupled, respectively. In the negative-phase access transistor, a gate and the word line, a drain and the negative-phase bit line, and a source and the second storage node are coupled, respectively. In particular, the positive-phase access transistor is disposed in the first p well, the first load transistor is disposed in the first n well, the first driver transistor and the second driver transistor are disposed in the second p well, the second load transistor is disposed in the second n well, and the negative-phase access transistor is disposed in the third p well. And then, cells of the memory cells, which neighbor each other when viewed in the row direction, share the first p well and the third p well, respectively.

The following explains briefly a typical effect acquired by the above-mentioned embodiment among the inventions disclosed in the present application.

That is, it is possible to improve reliability in a semiconductor device having an SRAM.

BRIEF DESCRIPTION OF THE DRAWINGS

FIGS. 9A and 9B are explanatory diagrams showing a memory cell, wherein FIG. 9A is an explanatory diagram of the SRAM the inventors of the present invention have examined in advance and FIG. 9B shows the SRAM in the first embodiment;

FIGS. 46A and 46B are explanatory diagrams showing address mapping of memory cells the inventors of the present invention have examined in advance, wherein FIG. 46A shows an eight-row, four-column memory array and FIG. 46B shows a four-row, eight-column memory array.

DETAILED DESCRIPTION OF PREFERRED EMBODIMENTS

The following embodiments will be explained, divided into plural sections or embodiments, if necessary for convenience. Except for the case where it shows clearly in particular, they are not mutually unrelated and one has relationships such as a modification, details, and supplementary explanation of some or entire of another. In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically. Furthermore, in the following embodiments, it is needless to say that an element (including an element step etc.) is not necessarily indispensable, except for the case where it is clearly specified in particular and where it is considered to be clearly indispensable from a theoretical point of view, etc. Similarly, in the following embodiments, when shape, position relationship, etc. of an element etc. are referred to, what resembles or is similar to the shape substantially shall be included, except for the case where it is clearly specified in particular and where it is considered to be clearly not right from a theoretical point of view. This statement also applies to the numeric value and range described above. In all the drawings for explaining embodiments, the same symbol is attached to those having the same function and the repeated explanation thereof is omitted in so far as it is possible. Embodiments of the present invention are explained below in detail with reference to the drawings.

First Embodiment

Figure 1:
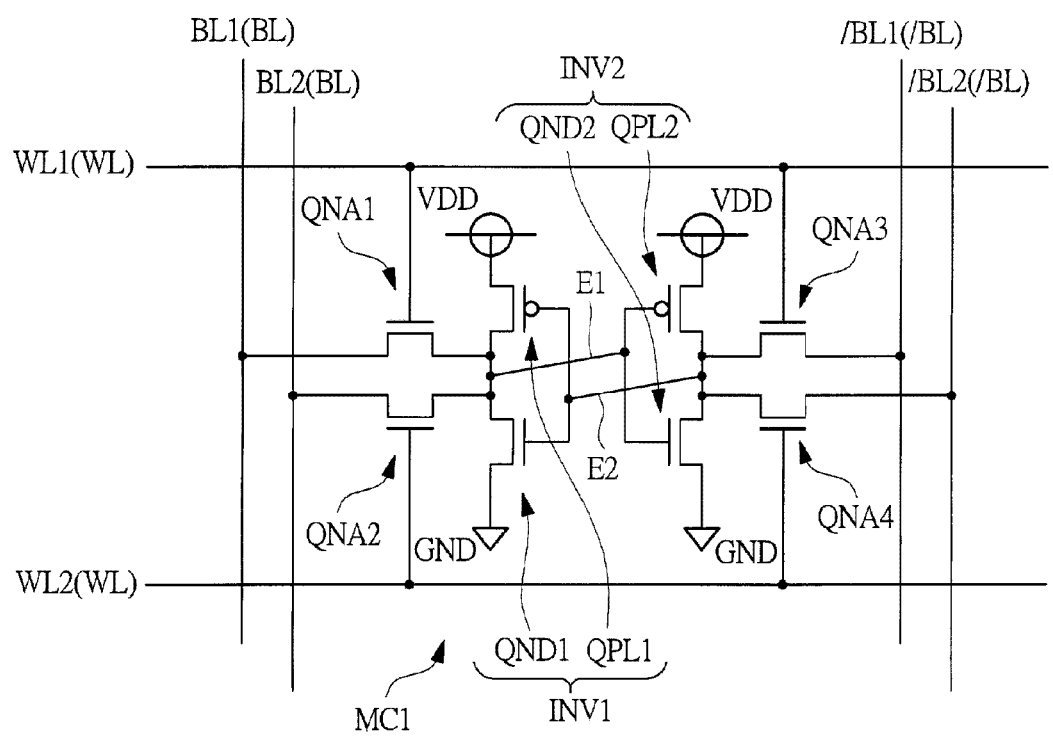
FIG. 1 is a circuit diagram showing one memory cell in an SRAM of a semiconductor device, which is a first embodiment of the present invention.
Figure 2:
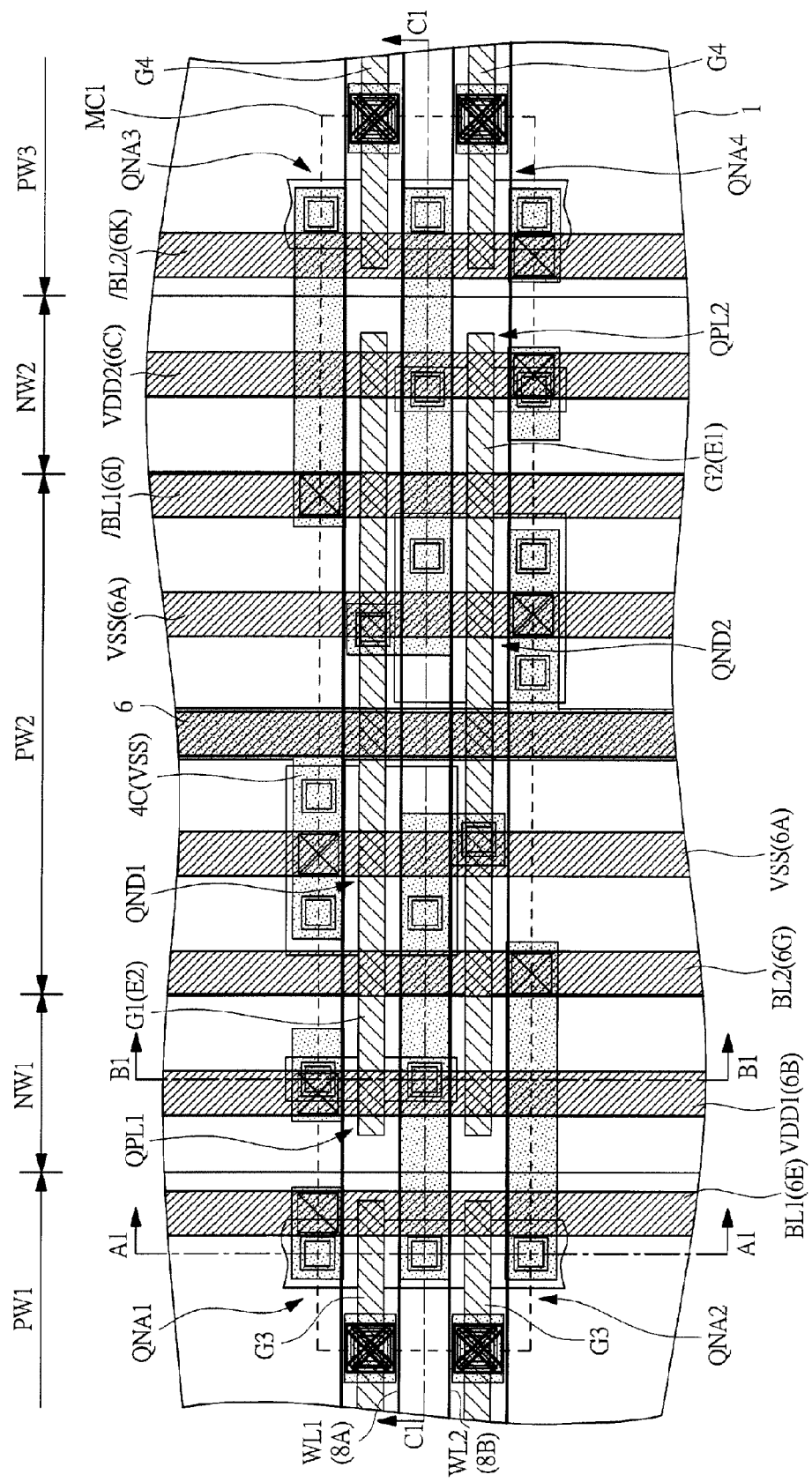
FIG. 2 is a plan view of relevant parts showing one memory cell in the SRAM of the semiconductor device, which is the first embodiment of the present invention.
Figure 3:
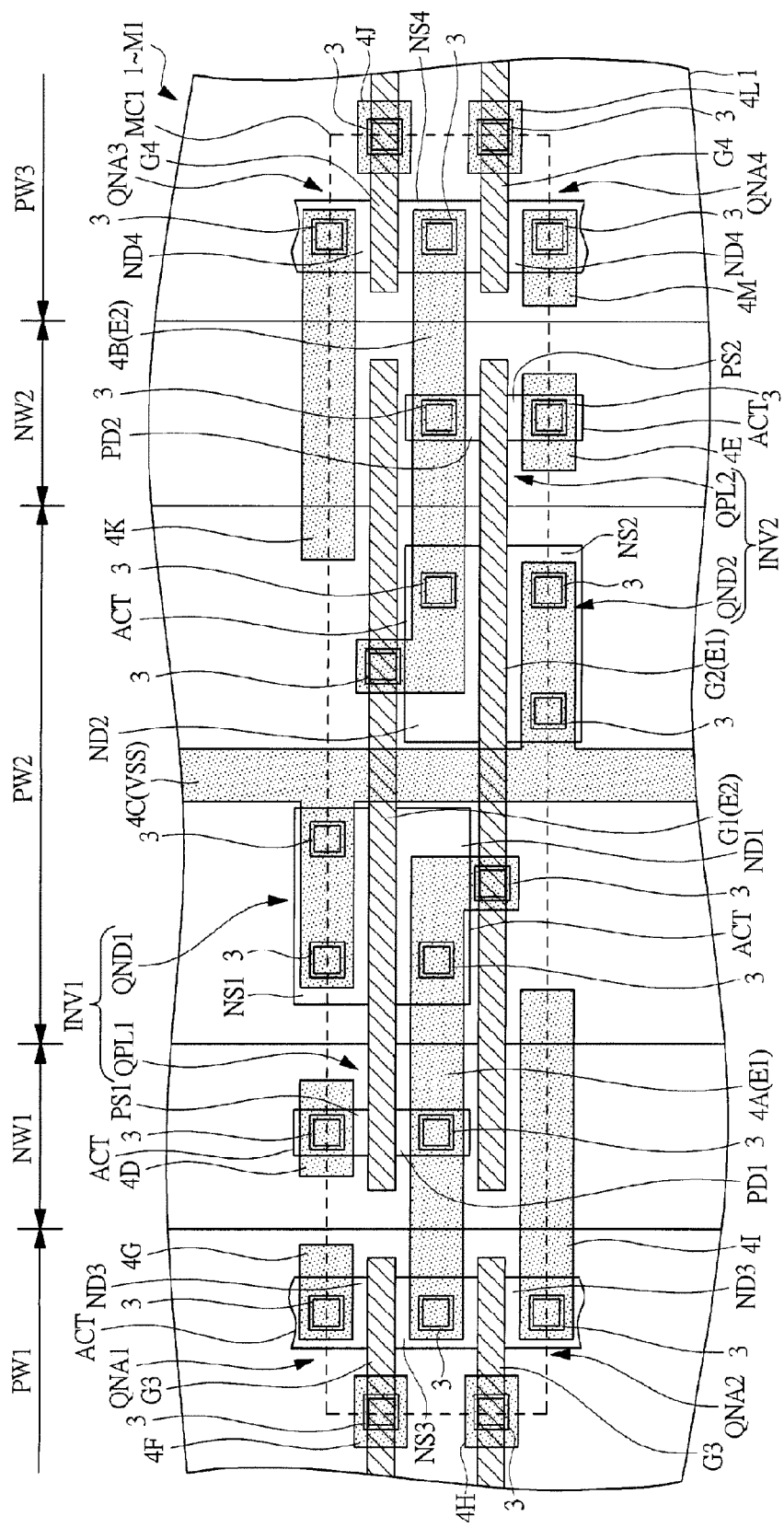
FIG. 3 is a plan view of relevant parts showing part of the plan view of relevant parts in FIG. 2.
Figure 4:
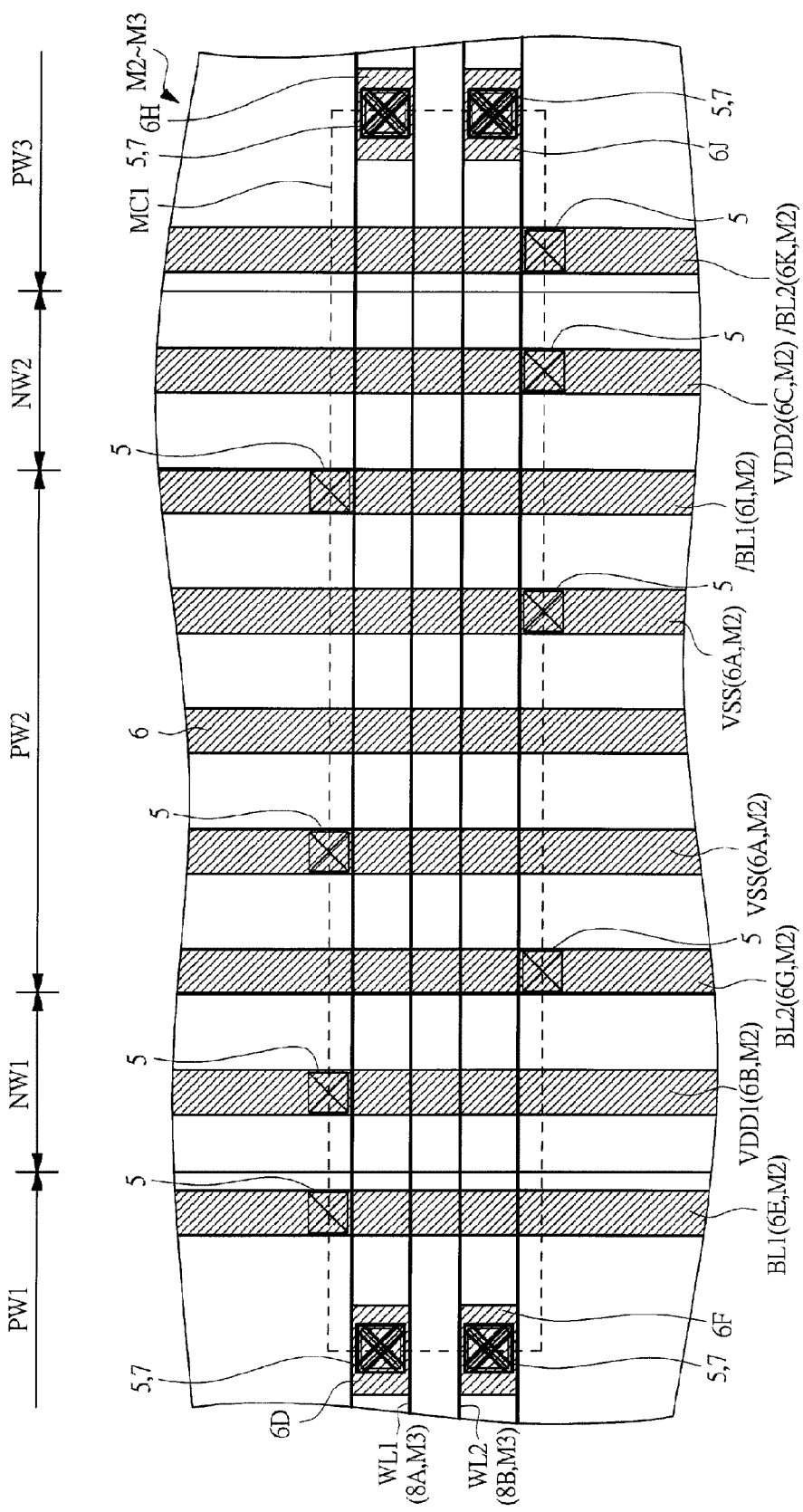
FIG. 4 is a plan view of relevant parts showing another part of the plan view of relevant parts in FIG. 2.
Figure 5:
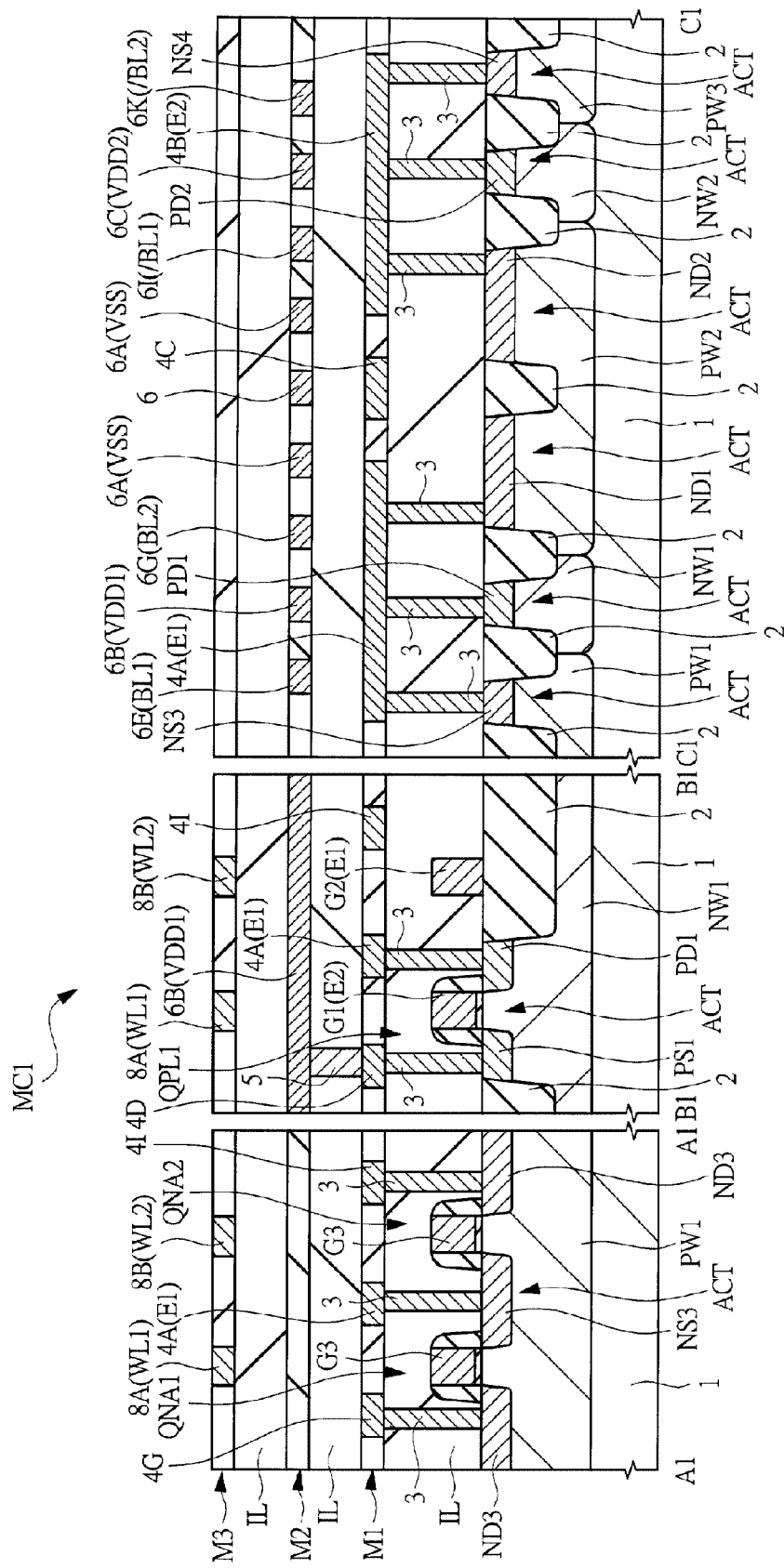
FIG. 5 is a section view of relevant parts when viewed along A1-A1 line, B1-B1 line, and C1-C1 line of the plan view of relevant parts in FIG. 2.
Figure 6:
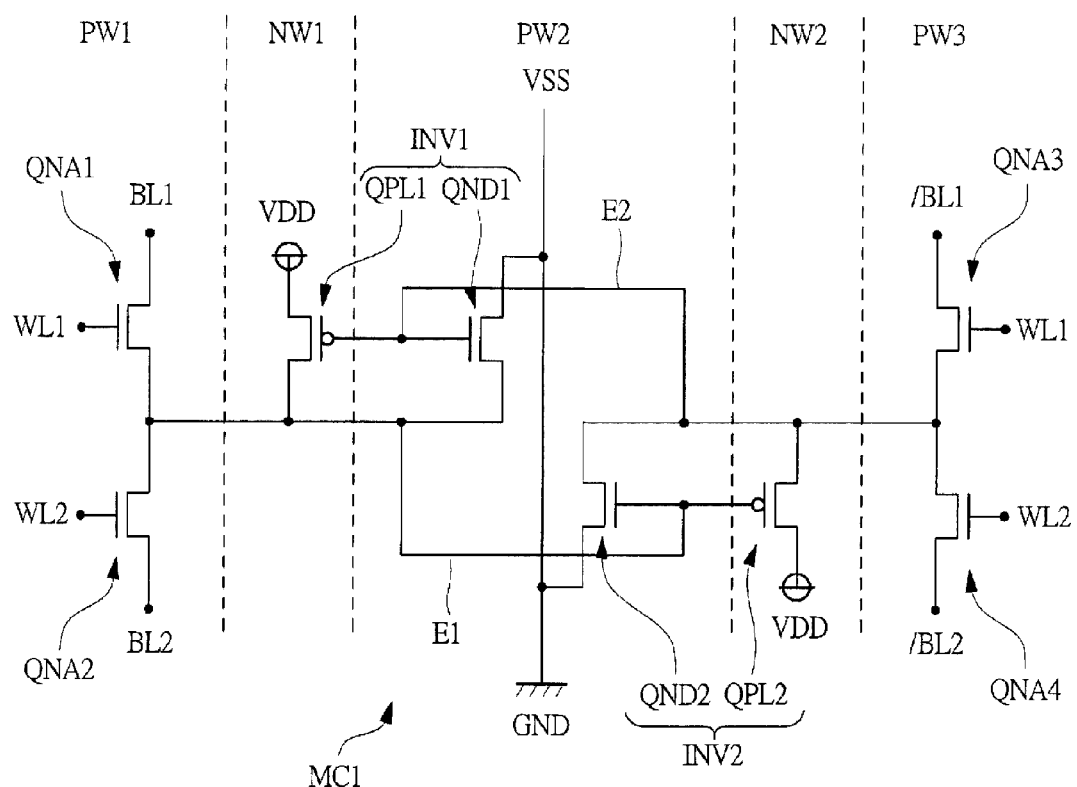
FIG. 6 is an equivalent circuit diagram of the memory cell in the first embodiment of the present invention, an equivalent circuit diagram corresponding to the circuit diagram in FIG. 1.
Figure 7:
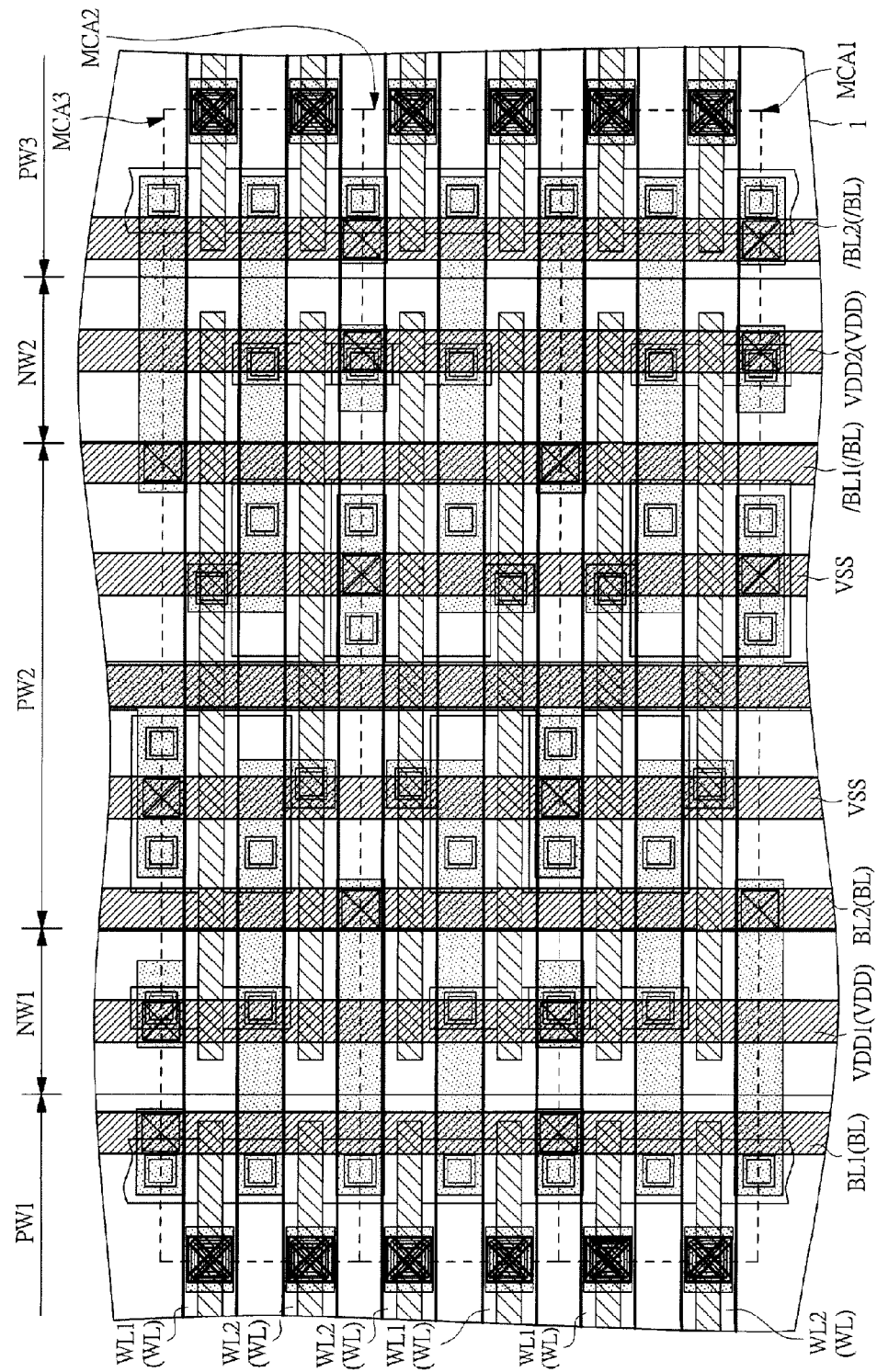
FIG. 7 is a plan view of relevant parts showing three memory cells neighboring in the column direction in the SRAM of the semiconductor device, which is the first embodiment of the present invention.
Figure 8:
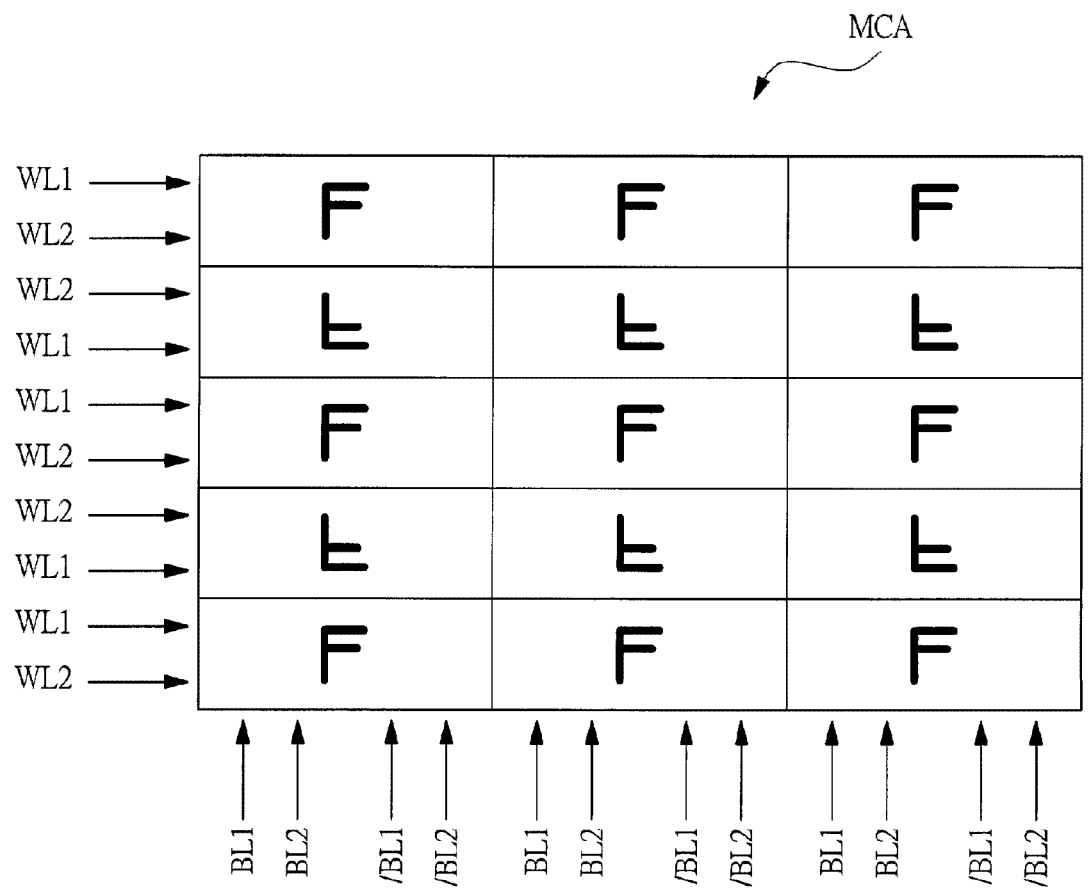
FIG. 8 is an explanatory diagram showing a plurality of memory cells arranged in the row direction and the column direction in the SRAM of the semiconductor device, which is the first embodiment of the present invention.

FIG. 1 shows a circuit diagram of one memory cell (static memory cell) MC1 in a dual-port SRAM in a first embodiment. FIG. 2 shows a plan view of relevant parts of the memory cell MC1 in the first embodiment. FIG. 3 shows a plan view of relevant parts representing from a silicon substrate (semiconductor substrate) 1 to a first wiring layer M1 of the plan view of relevant parts in FIG. 2. FIG. 4 shows a plan view of relevant parts representing from a second wiring layer M2 to a third wiring layer M3 of the plan view of relevant parts in FIG. 2. FIG. 5 shows a section view of relevant parts when viewed in the arrow direction along A1-A1 line, B1-B1 line, and C1-C1 line of the plan view of relevant parts in FIG. 2. FIG. 6 corresponds to the circuit diagram in FIG. 1, particularly, showing an equivalent circuit diagram in which each element and wire are rearranged according to an actual layout. FIG. 7 shows a plan view of relevant parts of three memory cells MCA1, MCA2 and MCA3 neighboring in the column direction in the dual-port SRAM in the first embodiment. FIG. 8 shows an explanatory diagram of a plurality of memory cells MCA arranged in the row direction and the column direction in the dual-port SRAM in the first embodiment. With reference to FIG. 1 to FIG. 8, the dual-port SRAM of a semiconductor device in the first embodiment is explained.

The SRAM of the semiconductor device in the first embodiment is a dual-port SRAM including eight MIS (Metal Insulator Semiconductor) field effect transistors (hereinafter, referred to simply as MIS transistors). The dual-port SRAM includes the memory cells MCA arranged in the row direction and the column direction over the silicon substrate 1. When the memory cells MCA are denoted individually, they are denoted as the memory cells MCA1, MCA2, MCA3, . . . . Cells of the memory cells MCA, which are arranged side by side in the row direction, are connected by word lines WL extending along the row direction. Cells of the memory cells MCA, which are arranged side by side in the column direction, are connected by positive-phase bit lines BL and negative-phase bit lines /BL extending along the column direction. In particular, the SRAM in the first embodiment is a dual-port SRAM and accessed from two ports. Consequently, the number of the word lines WL, that of the positive-phase bit lines BL, and that of the negative-phase bit lines /BL are two, respectively. That is, the word line WL has a first word line WL1 and a second word line WL2. The positive-phase bit line BL has a first positive-phase bit line BL1 and a second positive-phase bit line BL2. The negative-phase bit line /BL has a first negative-phase bit line /BL1 and a second negative-phase bit line /BL2.

Over the silicon substrate 1, a plurality of wells extending in the column direction is formed. A well is a semiconductor region formed on the surface of the silicon substrate 1, including donor impurities or acceptor impurities. Hereinafter, a well or a diffusion layer which includes a number of donor impurities and in which majority carrier is electron is denoted as an n well or an n-type diffusion layer and a well or a diffusion layer which includes a number of acceptor impurities and in which majority carrier is hole is denoted as a p well or a p-type diffusion layer.

The dual-port SRAM in the first embodiment has two n wells (first n well NW1 and second n well NW2) and three p wells (first p well PW1, second p well PW2, and third p well PW3) for each memory cell MC1. Further, the first p well PW1, the first n well NW1, the second p well PW2, the second n well NW2, and the third p well PW3 are arranged in this order when viewed in the row direction. In other words, on both adjacent sides of the second p well PW2 in the row direction, the first n well NW1 and the second n well NW2 are arranged, on the adjacent side of the first n well NW1 in the row direction, on which the second p well PW2 is not arranged, the first p well PW1 is arranged, and on the adjacent side of the second n well NW2 in the row direction, on which the second p well PW2 is not arranged, the third p well PW3 is arranged. In further other words, on both adjacent sides of the first n well NW1 in the row direction, the first p well PW1 and the second p well PW2 are arranged, and on both adjacent sides of the second n well NW2 in the row direction, the second p well PW2 and the third p well PW3 are arranged.

When a well is disposed for each memory cell MC1 as described above, the first p well PW1 and the third p well PW3 are arranged at both ends. Hence, in the dual-port SRAM in the first embodiment, cells of the memory cells MCA, which neighbor when viewed in the row direction, share the first p well PW1 and the third p well PW3, respectively.

As shown in FIG. 5, on the surface of the silicon substrate 1, separating parts 2 including an insulating film etc. having silicon oxide as its main component are formed. The inside of each of the above-described wells NW1, NW2, PW1, PW2 and PW3 is divided by the separating part 2 and active regions ACT are defined. In this active region ACT, each element, such as a MIS transistor constituting the memory cell MC1 etc., is formed. The separating part 2 may have an STI (Shallow Trench Isolation) structure in which a silicon oxide film is embedded in a shallow trench or a LOCOS (Local Oxidation of Silicon) structure in which a desired region is thermally oxidized selectively.

As shown in FIG. 1, one memory cell MC1 constituting the dual-port SRAM in the first embodiment has a flip-flop including a first inverter INV1 and a second inverter INV2 as a storage part. The flip-flop configuration is explained below in detail.

As shown in FIG. 6, the first inverter INV1 includes a first driver transistor QND1, which is an n-channel type MIS transistor, and a first load transistor QPL1, which is a p-channel type MIS transistor. The second inverter INV2 includes a second driver transistor QND2, which is an n-channel type MIS transistor, and a second load transistor QPL2, which is a p-channel type MIS transistor. An output terminal of the first inverter INV1 is coupled to an input terminal of the second inverter INV2 as a first storage node E1. Further, an input terminal of the first inverter INV1 is coupled to an output terminal of the second inverter INV2 as a second storage node E2. A source of each of the driver transistors QND1, QND2 constituting each of the inverters INV1, INV2 is coupled to a ground potential line VSS. The ground potential line VSS is coupled to a ground potential GND. A source of each of the load transistors QPL1, QPL2 constituting each of the inverters INV1, INV2 is coupled to a power source potential line VDD. In this manner, the first inverter INV1 and the second inverter INV2 configure the flip-flop.

The above-mentioned configuration is explained as an element configuration over the silicon substrate 1 using FIG. 2 to FIG. 5.

The first driver transistor QND1 and the first load transistor QPL1 constituting the first inverter INV1 share a gate G1, which is the input terminal of the first inverter INV1. The diffusion layers on the respective drain sides, which are the output terminals of the first inverter INV1, that is, an n-type drain diffusion layer ND1 of the first driver transistor QND1 and a p-type drain diffusion layer PD1 of the first load transistor QPL1 are electrically coupled to each other via a contact plug 3 (also referred to as a coupling plug) and a first metal wire 4A in the first wiring layer M1. Similarly, the second driver transistor QND2 and the second load transistor QPL2 constituting the second inverter INV2 share a gate G2, which is the input terminal of the second inverter INV2. The diffusion layers on the respective drain sides, which are the output terminals of the second inverter INV2, that is, an n-type drain diffusion layer ND2 of the second driver transistor QND2 and a p-type drain diffusion layer PD2 of the second load transistor QPL2 are electrically coupled to each other via the contact plug 3 and a first metal wire 4B in the first wiring layer M1. Here, the gates G1 and G2 are a conductive film including polycrystalline silicon (also referred to as polysilicon) formed over the silicon substrate 1 via a gate insulating film and disposed so as to extend in the row direction. Between the silicon substrate 1 and the first wiring layer M1, an interlayer insulating film IL, such as an insulating film including silicon oxide as its main component, is disposed. The interlayer insulating film IL is also disposed between layers, such as the second wiring layer M2 and the third wiring layer M3 to be explained later.

Further, n-type source diffusion layers NS1, NS2, which are the sources of the respective driver transistors QND1, QND2 constituting the respective inverters INV1, INV2, are electrically coupled to the ground potential line VSS. In more detail, the n-type source diffusion layers NS1, NS2 of the respective driver transistors QND1, QND2 are electrically coupled to the ground potential line VSS, which is a second metal wire 6A in the second wiring layer M2, via the contact plug 3, a first metal wire 4C in the first wiring layer M1, and a first via plug 5. The ground potential line VSS is disposed in the second wiring layer M2 so as to extend in the column direction.

Furthermore, p-type source diffusion layers PS1, PS2, which are the sources of the respective load transistors QPL1, QPL2 constituting the respective inverters INV1, INV2, are electrically coupled to the power source potential line VDD. In more detail, the p-type source diffusion layer PS1 of the first load transistor QPL1 is electrically coupled to a first power source potential line VDD1, which is a second metal wire 6B in the second wiring layer M2, via the contact plug 3, a first metal wire 4D in the first wiring layer M1, and the first via plug 5. The p-type source diffusion layer PS2 of the second load transistor QPL2 is electrically coupled to a second power source potential line VDD2, which is a second metal wire 6C in the second wiring layer M2, via the contact plug 3, a first metal wire 4E in the first wiring layer M1, and the first via plug 5. The first power source potential line VDD1 and the second power source potential line VDD2 are wires constituting the same power source potential line VDD and to which an identical power source potential is applied. The first power source potential line VDD1 and the second power source potential line VDD2 are disposed in the second wiring layer M2 so as to extend in the column direction.

Further, the first metal wire 4A that leads to the respective drain diffusion layers ND1, PD1, which are the output terminals of the first inverter INV1, is coupled to the gate G2, which is the input terminal of the second inverter INV2, via the contact plug 3, constituting the first storage node E1. Further, the gate G1, which is the input terminal of the first inverter is coupled to the first metal wire 4B that leads to the respective drain diffusion layers ND2, PD2, which are the output terminals of the second inverter INV2, via the contact plug 3, constituting the second storage node E2.

Further, as shown in FIG. 6, one memory cell MC1 constituting the dual-port SRAM in the first embodiment has a pair of n-channel type MIS transistors QNA1 and QNA2 and a pair of n-channel type MIS transistors QNA3 and QNA4 to access the flip-flop including the above-mentioned pair of the inverters INV1, INV2. Here, the MIS transistors that access the first inverter INV1 are referred to as the positive-phase access transistors QNA1, QNA2 and the MIS transistors that access the second inverter INV2 are referred to as the negative-phase access transistors QNA3, QNA4. The SRAM in the first embodiment is a dual-port SRAM and accessed from two ports. Hence, the positive-phase access transistor has the first positive-phase access transistor QNA1 and the second positive-phase access transistor QNA2 as two n-channel type MIS transistors. Similarly, the negative-phase access transistor has the first negative-phase access transistor QNA3 and the second negative-phase access transistor QNA4 as two n-channel type MIS transistors.

In the positive-phase access transistors QNA1, QNA2, a gate G3 and the word line WL, the drain and the positive-phase bit line BL, and the source and the first storage node E1 are electrically coupled, respectively. More specifically, in the first positive-phase access transistor QNA1, the gate G3 and the first word line WL1, the drain and the first positive-phase bit line BL1, and the source and the first storage node E1 are coupled. In the second positive-phase access transistor QNA2, the gate G3 and the second word line WL2, the drain and the second positive-phase bit line BL2, and the source and the first storage node E1 are coupled.

The above-mentioned configuration is explained as an element configuration over the silicon substrate 1 using FIG. 2 to FIG. 5.

The gate G3 of the first positive-phase access transistor QNA1 is electrically coupled to the first word line WL1, which is a third metal wire 8A in the third wiring layer M3, via the contact plug 3, a first metal wire 4F in the first wiring layer M1, the first via plug 5, a second metal wire 6D in the second wiring layer M2, and a second via plug 7. An n-type drain diffusion layer ND3, which is the drain of the first positive-phase access transistor QNA1, is electrically coupled to the first positive-phase bit line BL1, which is a second metal wire 6E in the second wiring layer M2, via the contact plug 3, a first metal wire 4G in the first wiring layer M1, and the first via plug 5. An n-type source diffusion layer NS3, which is the source of the first positive-phase access transistor QNA1, is electrically coupled to the first metal wire 4A constituting the above-described first storage node E1 among the metal wires in the first wiring layer M1 via the contact plug 3. The gate G3 of the second positive-phase access transistor QNA2 is electrically coupled to the second word line WL2, which is a third metal wire 8B in the third wiring layer M3, via the contact plug 3, a first metal wire 4H in the first wiring layer M1, the first via plug 5, a second metal wire 6F in the second wiring layer M2, and the second via plug 7. The n-type drain diffusion layer ND3, which is the drain of the second positive-phase access transistor QNA2, is electrically coupled to the second positive-phase bit line BL2, which is a second metal wire 6G in the second wiring layer M2, via the contact plug 3, a first metal wire 4I in the first wiring layer M1, and the first via plug 5. The second positive-phase access transistor QNA2 shares the n-type source diffusion layer NS3, which is the source, with the above-described first positive-phase access transistor QNA1 and is electrically coupled to the first metal wire 4A constituting the above-described first storage node E1 among the metal wires in the first wiring layer M1 via the contact plug 3.

As shown in FIG. 6, in the negative-phase access transistors QNA3, QNA4, a gate G4 and the word line WL, the drain and the negative-phase bit line /BL, and the source and the second storage node E2 are electrically coupled, respectively. More specifically, in the first negative-phase access transistor QNA3, the gate G4 and the first word line WL1, the drain and the first negative-phase bit line /BL1, and the source and the second storage node E2 are coupled. In the second negative-phase access transistor QNA4, the gate G4 and the second word line WL2, the drain and the second negative-phase bit line /BL2, and the source and the second storage node E2 are coupled.

The above-mentioned configuration is explained as an element configuration over the silicon substrate 1 using FIG. 2 to FIG. 5.

The gate G4 of the first negative-phase access transistor QNA3 is electrically coupled to the first word line WL1, which is the third metal wire 8A in the third wiring layer M3, via the contact plug 3, a first metal wire 4J in the first wiring layer M1, the first via plug 5, a second metal wire 6H in the second wiring layer M2, and the second via plug 7. An n-type drain diffusion layer ND4, which is the drain of the first negative-phase access transistor QNA3, is electrically coupled to the first negative-phase bit line /BL1, which is a second metal wire 6I in the second wiring layer M2, via the contact plug 3, a first metal wire 4K in the first wiring layer M1, and the first via plug 5. An n-type source diffusion layer NS4, which is the source of the first negative-phase access transistor QNA3, is electrically coupled to the first metal wiring layer 4B constituting the above-described second storage node E2 among the metal wires in the first wiring layer M1 via the contact plug 3. The gate G4 of the second negative-phase access transistor QNA4 is electrically coupled to the second word line WL2, which is the third metal wire 8B in the third wiring layer M3, via the contact plug 3, a first metal wire 4L in the first wiring layer M1, the first via plug 5, a second metal wire 6J in the second wiring layer M2, and the second via plug 7. The n-type drain diffusion layer ND3, which is the drain of the second negative-phase access transistor QNA4, is electrically coupled to the second negative-phase bit line /BL2, which is a second metal wire 6K in the second wiring layer M2, via the contact plug 3, a first metal wire 4M in the first wiring layer M1, and the first via plug 5. The second negative-phase access transistor QNA4 shares the n-type source diffusion layer NS4, which is the source, with the above-described first negative-phase access transistor QNA3 and is electrically coupled to the first metal wire 4B constituting the above-described second storage node E2 among the metal wires in the first wiring layer M1 via the contact plug 3.

In the dual-port SRAM in the first embodiment, it may also be possible to dispose a metal wire that is not brought into electrical conduction with the memory cell MC1 (not relating to the circuit configuration) in the second wiring layer 2. Hereinafter, such a metal wire in the second wiring layer M2 is described as a second metal wire 6.

As described above, the memory cell MC1 in the first embodiment is a dual-port SRAM configured by wiring the eight MIS transistors as described above, that is, the two n-channel type driver transistors QND1, QND2, the four n-channel type access transistors QNA1, QNA2, QNA3 and QNA4, and the two p-channel type load transistors QPL1, QPL 2. In other words, the memory cell MC1 in the first embodiment is a dual-port SRAM in which the flip-flop including a pair of the inverters INV1, INV2 is accessed by two ports via the two word lines WL1, WL2, the two positive-phase bit lines BL1, BL2, and the two negative-phase bit lines /BL1, /BL2.

Particularly, in the memory cell MC1 in the first embodiment, the two positive-phase access transistors, that is, the first positive-phase access transistor QNA1 and the second positive-phase access transistor QNA2 are disposed in the first p well PW1. Further, the first load transistor QPL1 is disposed in the first n well NW1. Further, the two driver transistors, that is, the first driver transistor QND1 and the second driver transistor QND2 are disposed in the second p well PW2. Further, the second load transistor QPL2 is disposed in the second n well NW2. Further, the two negative-phase access transistors, that is, the first negative-phase access transistor QNA3 and the second negative-phase access transistor QNA4 are disposed in the third p well PW3.

In other words, in the memory cell MC1 in the first embodiment, the two positive-phase access transistors QNA1, QNA2 and the first driver transistor QND1 are disposed in the different p wells (the first p well PW1 and the second p well PW2, respectively) separated by the first n well NW1. Similarly, the two negative-phase access transistors QNA3, QNA4, which are the n-channel type MIS transistors, and the second driver transistor QND2 are disposed in the different p wells (the third p well PW3 and the second p well PW2, respectively) separated by the second n well NW2. The effect of the arrangement of transistors in this manner in the memory cell MC1 in the first embodiment is explained below in detail.

Figure 9A:
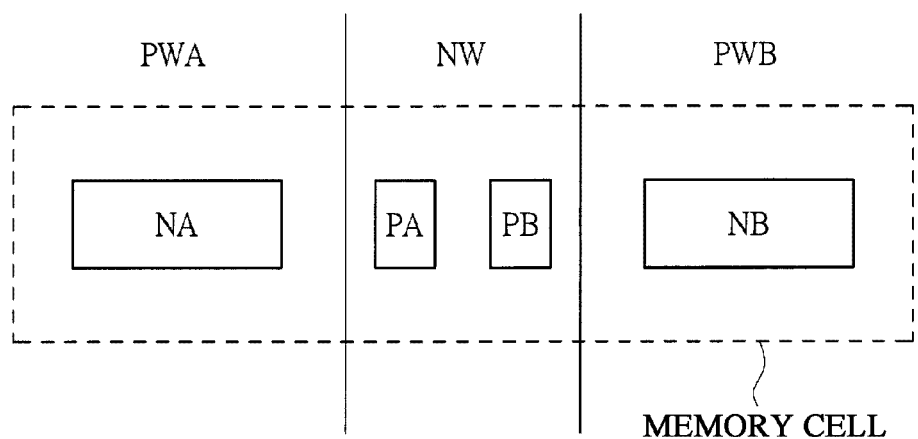
Figure 9B:
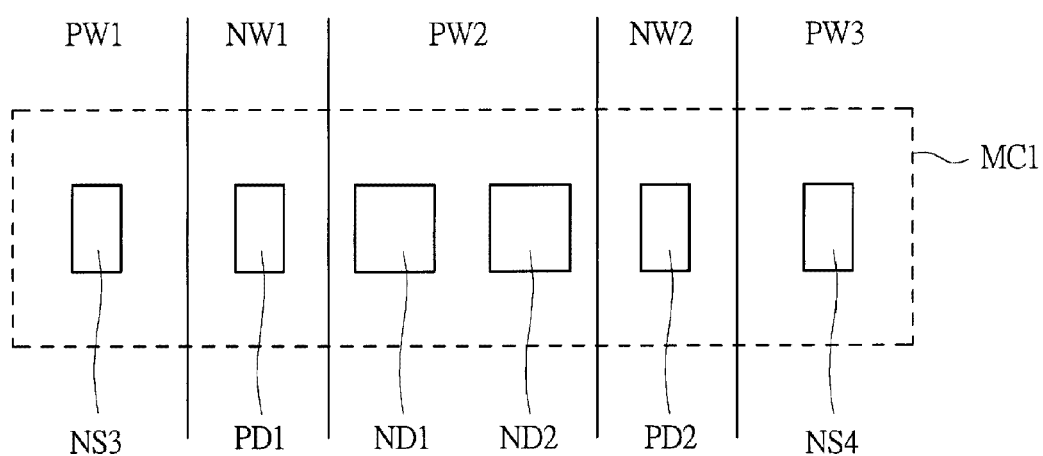

As described above, the n-type source diffusion layer NS3 of the positive-phase access transistors QNA1, QNA2 is electrically coupled with the n-type drain diffusion layer ND1 of the first driver transistor QND1, which is the first storage node E1 of the first inverter INV1. Consequently, in the configuration in the first embodiment, the n-type diffusion layers (NS3 and ND1) constituting the first storage node E1 are formed separately in the different p wells (PW1 and PW2). That is, by separately forming each of the n-type diffusion layers (NS3 and ND1) in each of the p wells (PW1 and PW2) as in the configuration in the first embodiment, it is possible to reduce the planar area of the individual n-type diffusion layers to smaller than that in the structure in which the n-type diffusion layers are shared and formed in the same p well. This point is explained in detail using FIGS. 9A and 9B. FIGS. 9A and 9B are explanatory diagrams showing the arrangement of each well and each diffusion layer in one memory cell constituting the SRAM, wherein FIG. 9A shows an explanatory diagram corresponding to the SRAM the inventors of the present invention have examined in advance and FIG. 9B shows an explanatory diagram corresponding to the SRAM in the first embodiment.

As shown in FIG. 9A, there is an SRAM having a well structure in which two p wells PWA, PWB are disposed on both sides of one n well NW. In such an SRAM, two p-channel type load transistors are disposed in the n well NW at the center. FIG. 9A shows the arrangement of a positive-phase p-type diffusion layer PA and a negative-phase p-type diffusion layer PB as a diffusion layer of the p-channel type load transistor. Further, in each of the p wells PWA, PWB on both sides, an n-channel type access transistor and an n-channel type driver transistor are formed. FIG. 9A shows the arrangement of a positive-phase n-type diffusion layer NA in the p well PWA on the left-hand side and a negative-phase n-type diffusion layer NB in the p well PWB on the right-hand side as a diffusion layer of the n-channel type access transistor and driver transistor. The n-type diffusion layers NA, NB share the diffusion layers of the two transistors (access transistor and drive transistor) constituting the storage node, respectively.

In contrast to this, in the memory cell MC1 in the first embodiment, as shown in FIG. 9B, in the access transistor and the drive transistor, n-type diffusion layers constituting the same storage node are disposed separately in the different p wells. For example, the n-type source diffusion layer NS3 of the positive-phase access transistor (QNA1, QNA2 in FIG. 1) and the n-type drain diffusion layer ND1 of the first driver transistor (QND1 in FIG. 1) are disposed separately in the first p well PW1 and the second p well PW2 different from each other. With this arrangement, it is possible to reduce the planar area of each n-type diffusion layer than when both the n-type diffusion layers are disposed in a sharing manner as shown in FIG. 9A. This also applies to the n-type source diffusion layer NS4 of the negative-phase access transistor (QNA3 and QNA4 in FIG. 1) and the n-type drain diffusion layer ND2 of the second driver transistor (QND2 in FIG. 1).

According to the verification of the inventors of the present invention, the soft error due to the alpha ray or the neutron beam explained in the above-mentioned problem depends on the planar area of the n-type diffusion layer. That is, the soft error is caused when electrons of the pairs of electron and hole generated by the alpha ray or the neutron beam are collected in the n-type diffusion layer and the storage node is reversed, and therefore, the larger the planar area of the n-type diffusion layer, the more likely the soft error occurs. From this viewpoint, in the structure of the memory cell MC1 in the first embodiment, the n-type diffusion layers constituting the same storage node are separated in different p wells and thus the individual planar areas are reduced. Consequently, it is possible to make the soft error hard to occur.

Particularly, in the memory cell MC1 in the first embodiment, it is possible to reduce the planar area of the n-type diffusion layers (n-type source diffusion layers NS3, NS4 of the access transistor) to be disposed in the first p well PW1 and the third p well PW3. As described above, the first p well PW1 and the third p well PW3 are shared by other memory cells neighboring in the row direction. Then, in the memory cell MC1 in the first embodiment, it is possible to make it hard to cause the soft error caused by the n-type diffusion layer in the p well shared with other memory cells. Consequently, it is possible to make it hard to cause the soft error that occurs at the same time in the memory cells neighboring in the row direction, that is, the multi-bit error in the row direction. As a result, it is possible to improve the reliability of a semiconductor device by applying the SRAM in the first embodiment.

Further, in the memory cell MC1 in the first embodiment, the two driver transistors QND1, QND2 are disposed in the second p well PW2 at the center. The two driver transistors QND1, QND2 are components of the two complementary inverters INV1, INV2 configuring a flip-flop in the SRAM. That is, the n-type drain diffusion region ND1 of the first driver transistor QND1 and the n-type drain diffusion region ND2 of the second driver transistor QND2 constituting the storage nodes E1, E2 complementary to each other are disposed in the same second p well PW2. The effect of such a configuration is explained below in detail.

For example, suppose that pairs of electron and hole are generated by the alpha ray or the neutron beam in the second p well PW2. The electrons are collected in the n-type diffusion layer and if the storage node is reversed, the soft error may be caused. However, in the structure in the first embodiment, in the second p well PW2, the two n-type drain diffusion layers ND1, ND2 corresponding to the complementary storage nodes E1, E2 are disposed. Consequently, the electrons generated in the second p well PW by the alpha ray or the neutron beam are collected in the two n-type drain diffusion layers ND1, ND2 in about the same amount, and therefore, it is unlikely that a difference in voltage drop between the two nodes is caused. That is, in the structure in the first embodiment, even if electrons are generated in the second p well PW2 by the alpha ray or the neutron beam and collected in the n-type drain diffusion layers ND1, ND2, only the voltage drops of substantially the same magnitude occur in the complementary storage nodes and the soft error that reverses only one of the storage nodes is unlikely to occur (common mode noise effect). In this manner, in the memory cell MC1 in the first embodiment, it is possible to further suppress the occurrence of the soft error.

Further, it may also be possible to dispose the positive-phase access transistors QNA1, QNA2 and the negative-phase access transistors QNA3, QNA4 in the second p well PW2, and to dispose the first driver transistor QND1 in the first p well PW1 and dispose the second driver transistor QND2 in the third p well PW3.

Usually, the gate width of the driver transistor is greater compared to that of the access transistor. Consequently, in the memory cell MC1 in the first embodiment, the planar areas of the n-type drain diffusion layers ND1, ND2 of the respective driver transistors QND1, QND2 are larger than the planar areas of the n-type source diffusion layers NS3, NS4 of the respective access transistors QNA1, QNA2, QNA3 and QNA4.

Hence, when the first driver transistor QND1 is disposed in the first p well PW1 and the second driver transistor QND2 is disposed in the third p well PW3 as described above, the n-type drain diffusion layers ND1, ND2 having areas relatively larger than those of the n-type source diffusion layers NS3, NS4 come to neighbor each other between cells neighboring in the row direction compared to the structure explained in FIG. 9B described above.

Hence, the improvement of the multi-bit error in the row direction is more excellent in the structure explained in FIG. 9B.

However, even when the first driver transistor QND1 is disposed in the first p well PW1 and the second driver transistor QND2 is disposed in the third p well PW3, the multi-bit error is improved more compared to the structure in FIG. 9A described above, in which both the driver transistor and the access transistor are disposed in the same p well.

That is, despite the arrangement or shape of the well, it is possible to improve the soft error by arranging the transistors in order shown in FIG. 6 etc.

In the memory cell MC1 in the first embodiment, as shown in FIG. 2 to FIG. 4, it is possible to configure the ground potential line VSS by two upper and lower layers by applying the first metal wire 4C in the first wiring layer M1 and the second metal wire 6A in the second wiring layer. With this configuration, the ground potential line VSS can be coupled commonly in the memory cell MC1, and therefore, the voltage drop (so-called IR drop) due to the resistive component of the wire can be suppressed. Consequently, the deterioration of the operating margin can be prevented.

In the memory cell MC1 in the first embodiment, as shown in FIG. 2 to FIG. 4, the first power source potential line VDD1 is disposed between the first positive-phase bit line BL1 and the second positive-phase bit line BL2. Further, the second power source potential line VDD2 is disposed between the first negative-phase bit line /BL1 and the second negative-phase bit line /BL2. For example, if dust etc. comes into contact with between the first power source potential line VDD1 and the first positive-phase bit line BL1 and both lines are short-circuited, it is restored by a redundant circuit. The potential of the first positive-phase bit line BL1 and the potential of the second positive-phase bit line BL2 are the same because of the pre-charge of the power source potential line VDD, and therefore, it is restored by a column (not used). At this time, for example, when the ground potential line VSS etc. is disposed between the first positive-phase bit line BL1 and the second positive-phase bit line BL2, even in a state of not being used, a leak current to the ground potential will flow. In contrast to this, in the structure in the first embodiment, what is disposed between respective bit lines (for example, between the first positive-phase bit line BL1 and the second positive-phase bit line BL2) is the power source potential line (for example, the first power source potential line VDD1), and therefore, the leak current hardly flows. Such a wiring structure is, as that of the memory cell MC1 in the first embodiment, a structure in which the p wells PW1, PW3 forming the access transistors QNA1, QNA2, QNA3 and QNA4 are those different from the p wells of the driver transistors QND1, QND2, and which is realized by disposing the n wells NW1, NW2 for disposing the load transistors QPL1, QPL2 separately from each other.

In the memory cell MC1 in the first embodiment, as shown in FIG. 2 to FIG. 4, the active region ACT, in which the first driver transistor QND1 is disposed in the second p well PW2, is disposed at a position nearer to the first n well NW1 than the second n well NW2. Further, the active region ACT, in which the second driver transistor QND2 is disposed, is disposed at a position nearer to the second n well NW2 than the first n well NW1. Then, the active region ACT, in which the first driver transistor QND1 is disposed, is disposed so that no part overlaps the active region ACT in which the second driver transistor QND2 is disposed when viewed in the column direction. With such a structure, it is possible to arrange both the active regions ACT in a positional relationship in which the distance in the column direction between both the active regions ACT is reduced and parts of them overlap each other when viewed from the section in the row direction while maintaining both the active regions ACT independent of each other (separated by the separating part 2). In other words, it is possible to arrange both the active regions ACT in a positional relationship in which both do not overlap in a planar manner but parts of them overlap when viewed from the section in the row direction. In further other words, it is possible to set up a configuration in which both the active regions ACT are not located side by side in parallel in the row direction, that is, both are located side by side in series in the column direction. With this arrangement, it is possible to reduce the dimension of the memory cell MC1 in the column direction.

Figure 10:
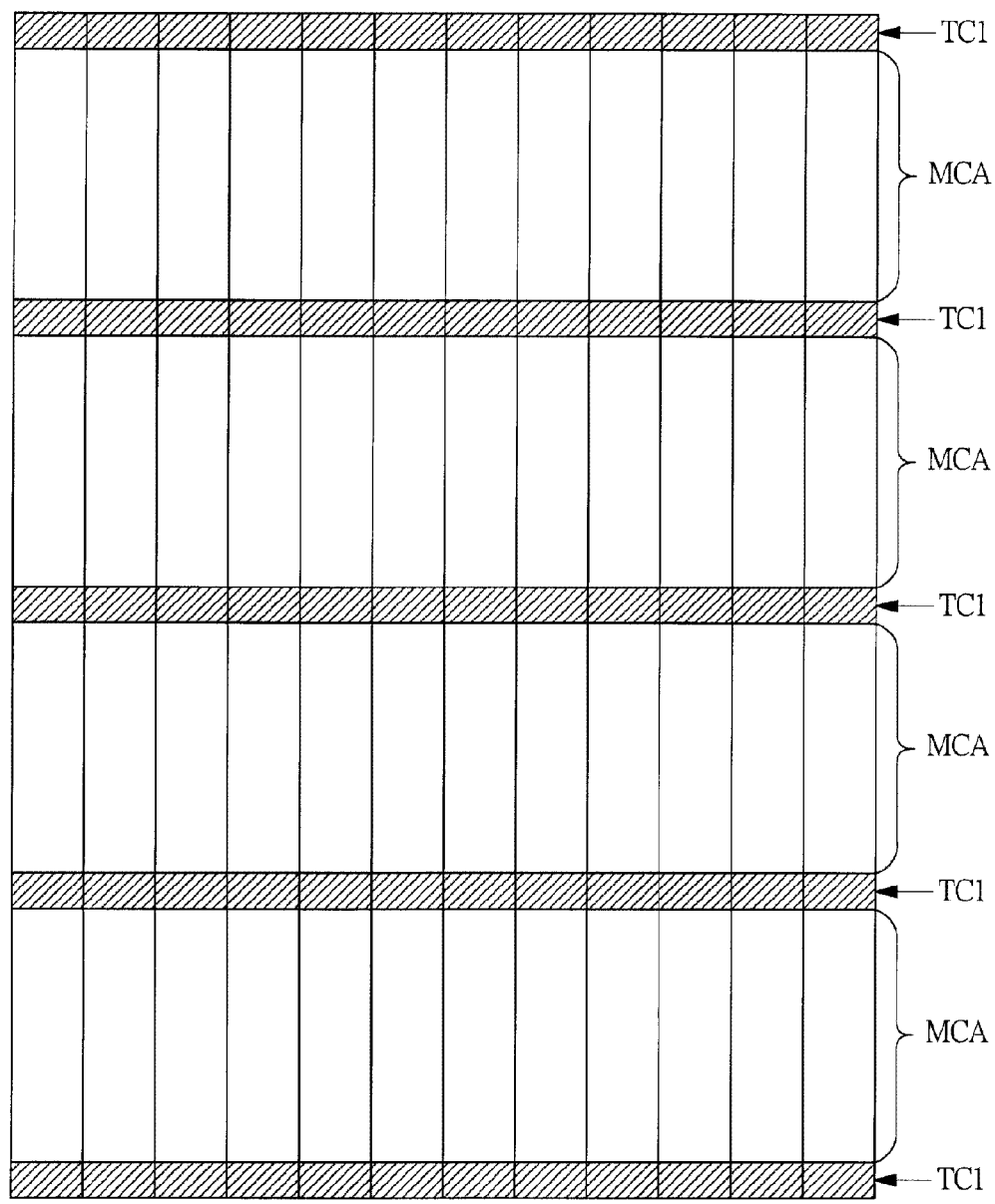
FIG. 10 is an explanatory diagram showing an arranging method of the memory cell arrays in the first embodiment of the present invention.

Next, a tap cell TC1 is explained using FIG. 10 to FIG. 13, which is applied to the dual-port SRAM in the first embodiment. FIG. 10 is an explanatory diagram showing an arranging method of the memory cell arrays in the first embodiment. The tap cell TC1 is a component used to fix the well potential of an element. In the SRAM, the tap cell TC1 is disposed between a plurality of memory cells MCA disposed in the column direction and thus the well potentials of the memory cells MCA are fixed. In other words, the well potentials of the bit cells in a plurality of rows of the memory cells MCA disposed in an array are fixed by the tap cell TC1. Then, in the first embodiment, as described above, the layout of each of the wells NW1, NW2, PW1, PW2 and PW3 extending in the column direction is changed, and therefore, the layout of the tap cell is also changed.

Figure 11:
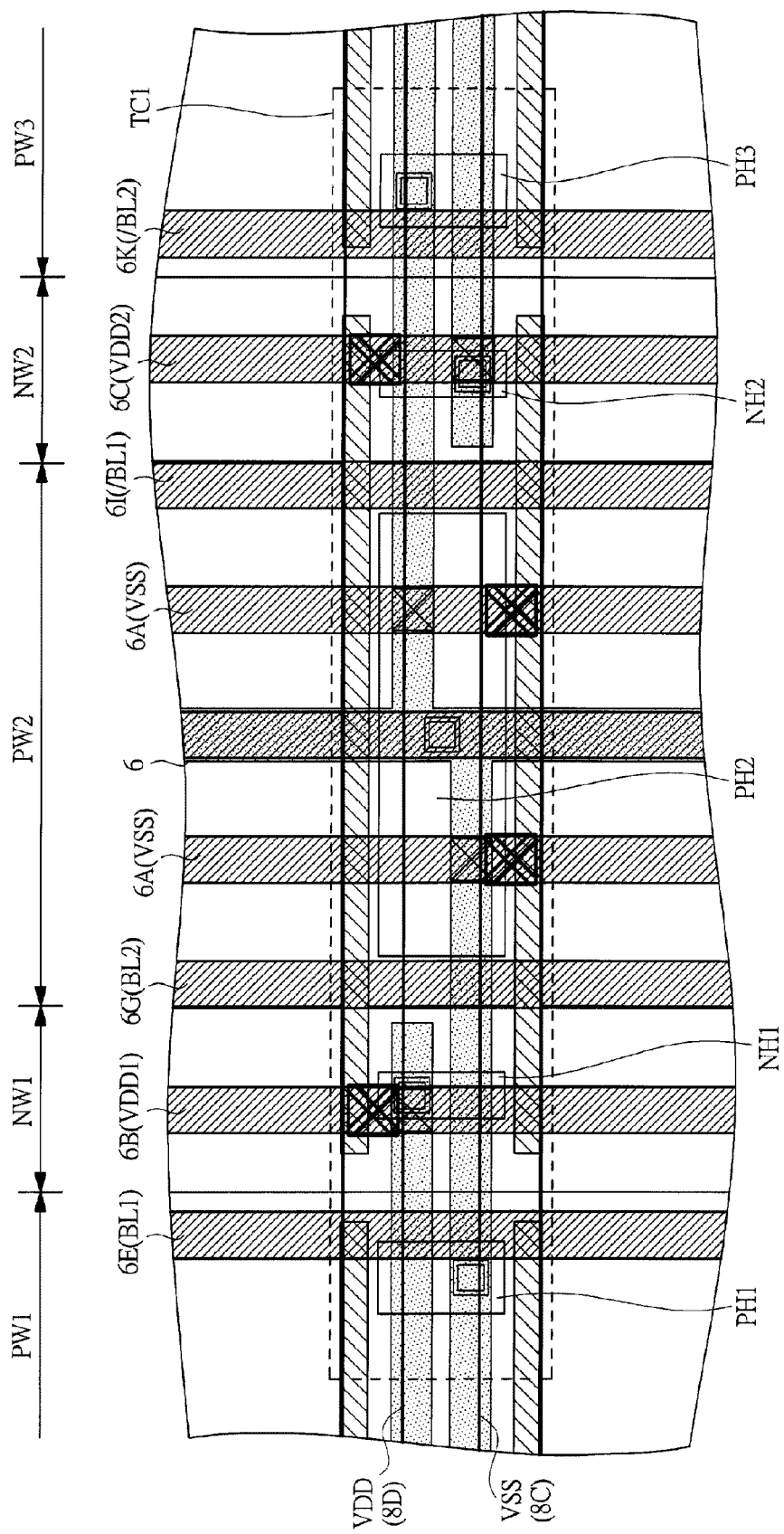
FIG. 11 is a plan view of relevant parts showing a tap cell of the semiconductor device, which is the first embodiment of the present invention.
Figure 12:
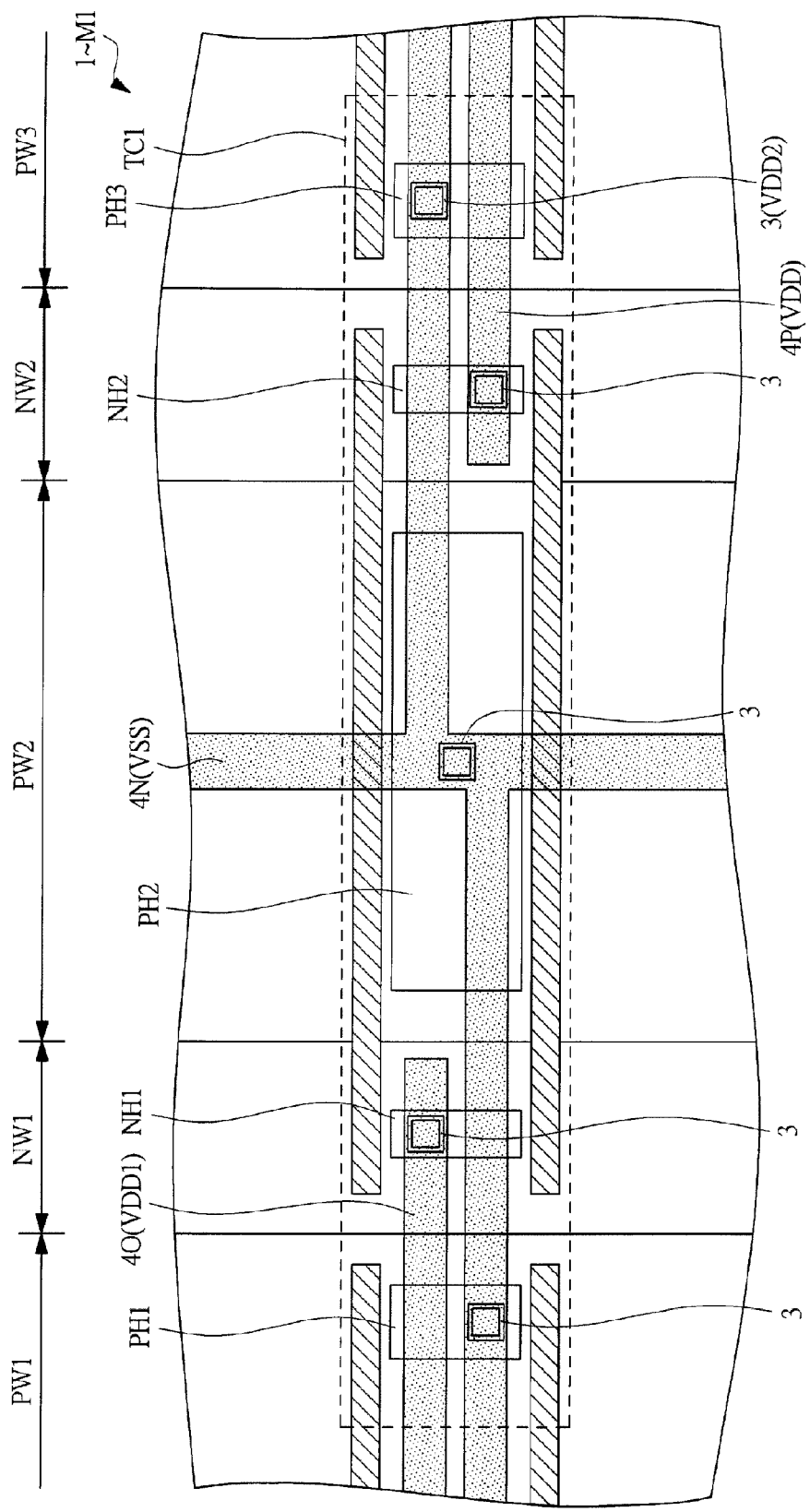
FIG. 12 is a plan view of relevant parts showing part of the plan view of relevant parts in FIG. 11.
Figure 13:
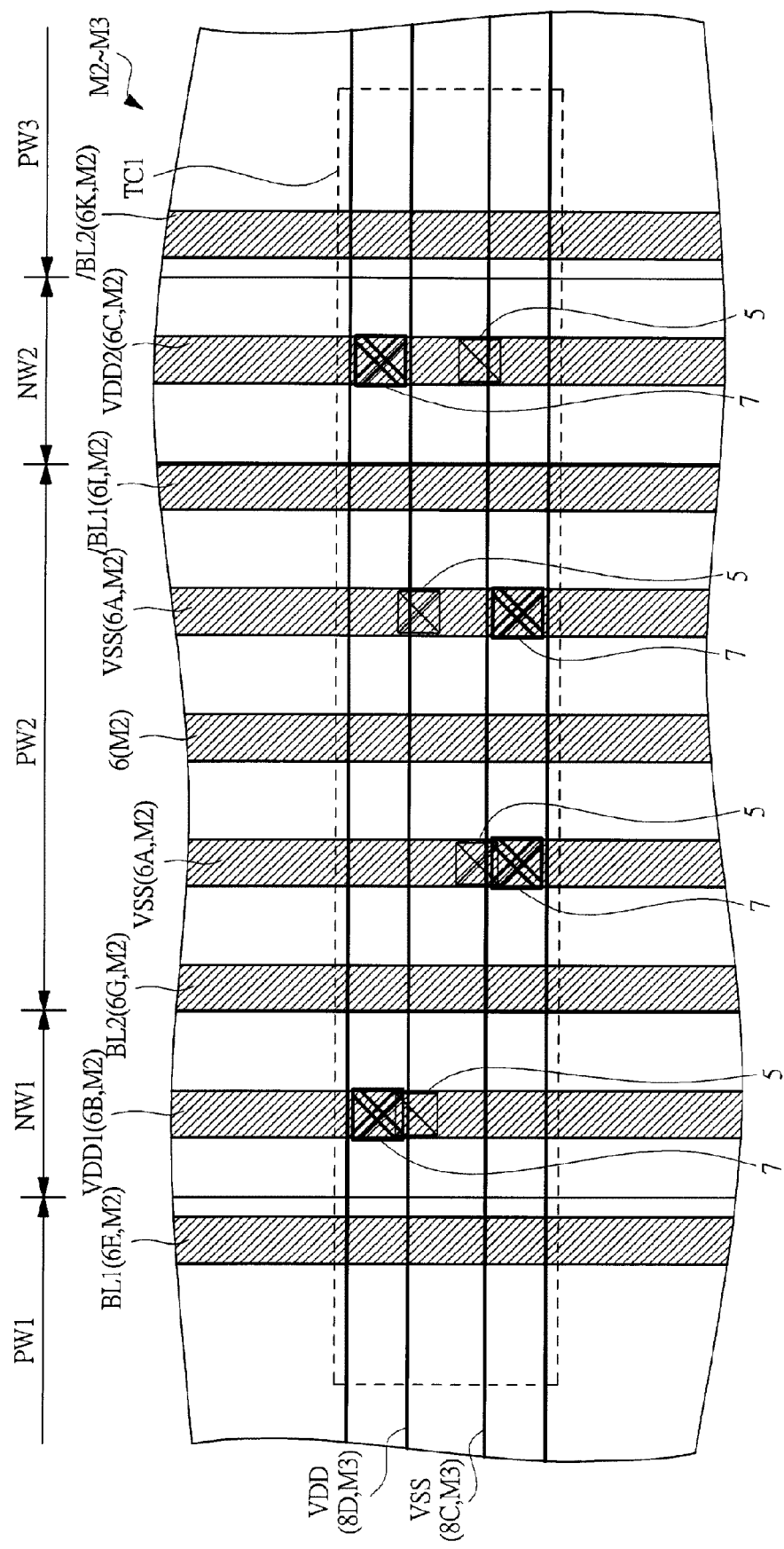
FIG. 13 is a plan view of relevant parts showing another part of the plan view of relevant parts in FIG. 11.

FIG. 11 shows a plan view of relevant parts of the tap cell TC1 in the first embodiment. FIG. 12 is a plan view of relevant parts representing from the silicon substrate 1 to the first wiring layer M1 of the plan view of relevant parts in FIG. 11. FIG. 13 shows a plan view of relevant parts representing from the second wiring layer M2 to the third wiring layer M3 of the plan view of relevant parts of FIG. 11.

In the first p well PW1 of the tap cell TC1, a p-type high concentration diffusion layer PH1 is formed. Then, the p-type high concentration diffusion layer PH1 is electrically coupled to the ground potential line VSS, which is the second metal wire 6A in the second wiring layer M2, via the contact plug 3, a first metal wire 4N in the first wiring layer M1, and the first via plug 5. In the second p well PW2 of the tap cell TC1, a p-type high concentration diffusion layer PH2 is formed and in the third p well PW3, a p-type high concentration diffusion layer PH3 is formed, and these are also electrically coupled to the ground potential line VSS, which is the second metal wire 6A in the second wiring layer M2, similarly. Here, the first metal wire 4N in the first wiring layer M1 to which each of the p-type high concentration diffusion layers PH1, PH2 and PH3 is coupled extends along the row direction and is also coupled to another tap cell TC1 neighboring in the row direction.

In the first n well NW1 of the tap cell TC1, an n-type high concentration diffusion layer NH1 is formed. Then, the n-type high concentration diffusion layer NH1 is electrically coupled to the first power source potential line VDD1, which is the second metal wire 6B in the second wiring layer M2, via the contact plug 3, a first metal wire 4O in the first wiring layer M1, and the first via plug 5. In the second n well NW2 of the tap cell TC1, an n-type high concentration diffusion layer NH2 is formed. Further, the n-type high concentration diffusion layer NH2 is electrically coupled to the second power source potential line VDD2, which is the second metal wire 6C in the second wiring layer M2, via the contact plug 3, a first metal wire 4P in the first wiring layer M1, and the first via plug 5. Here, the first metal wires 4O, 4P in the first wiring layer M1 coupled to each of the n-type high concentration diffusion layers NH1, NH2 extend along the row direction and are also coupled to another tap cell TC1 neighboring in the row direction.

Further, the ground potential line VSS, which is the second metal wire 6A in the second wiring layer M2, is electrically coupled to the ground potential line VSS, which is a third metal wire 8C in the third wiring layer M3, via the second via plug 7. Further, the ground potential line VSS in the third wiring layer M3 is disposed so as to extend along the row direction. Similarly, the first power source potential line VDD1 and the second power source potential line VDD2, which are the second metal wires 6B and 6C in the second wiring layer M2, are electrically coupled to the power source potential line VDD, which is a third metal wire 8D in the third wiring layer M3, via the second via plug 7. As described above, the first power source potential line VDD1 and the second power source potential line VDD2 in the second wiring layer M2 are coupled to the power source potential line VDD in the same third wiring layer M3 and the same power source potential is supplied. Further, the power source potential line VDD in the third wiring layer M3 is disposed so as to extend along the row direction.

As described above, the tap cell TC1 causes the power source potential line VDD and the ground potential line VSS to shunt in the row direction in the third wiring layer M3. The first power source potential line VDD1, the second power source potential line VDD2, and the ground potential line VSS in the second wiring layer M2 extend along the column direction. Consequently, the power source potential lines and the ground potential lines form a mesh (grating), and therefore, the IR drop can be reduced.

Figure 14:
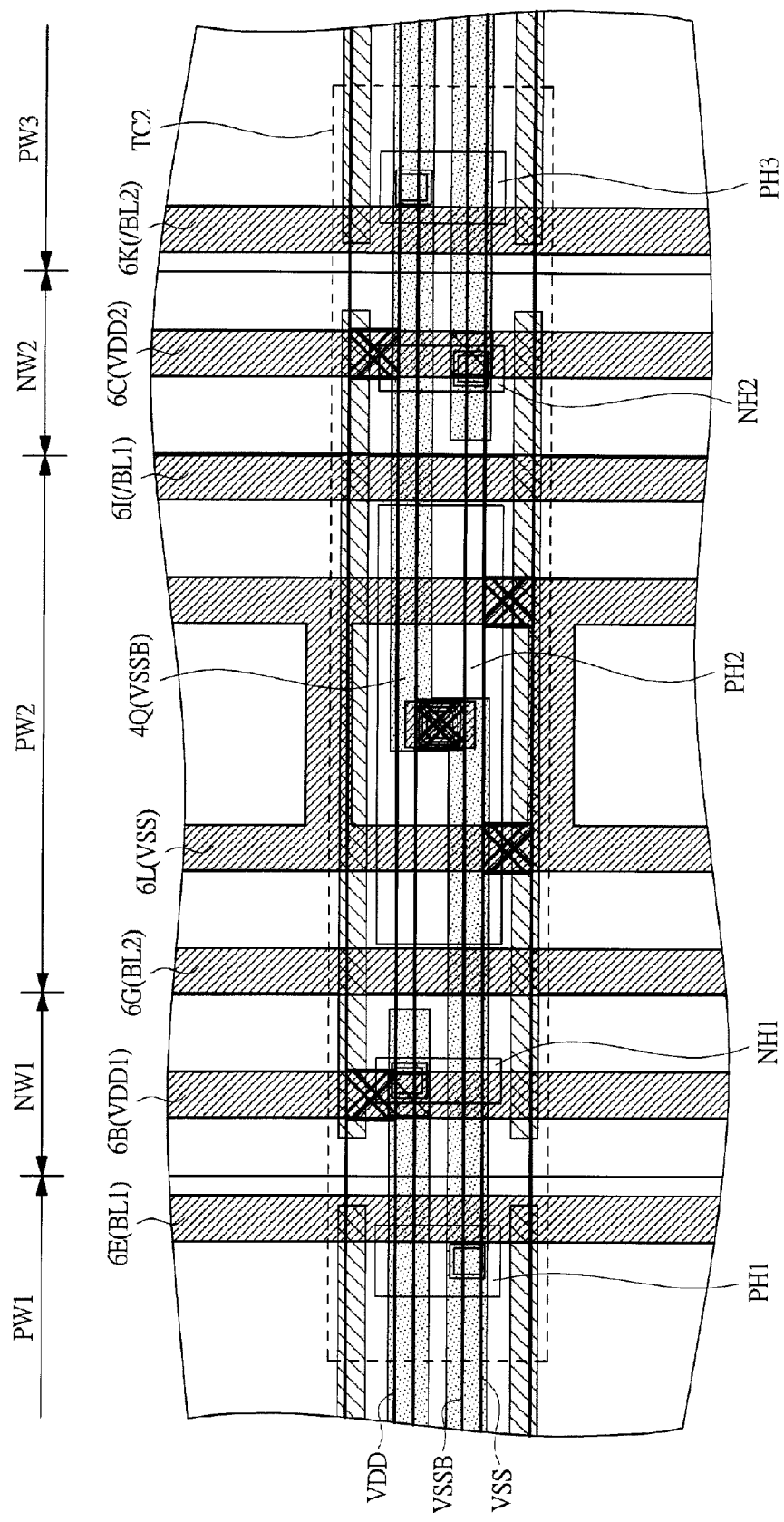
FIG. 14 is a plan view of relevant parts showing another tap cell of the semiconductor device, which is the first embodiment of the present invention.
Figure 15:
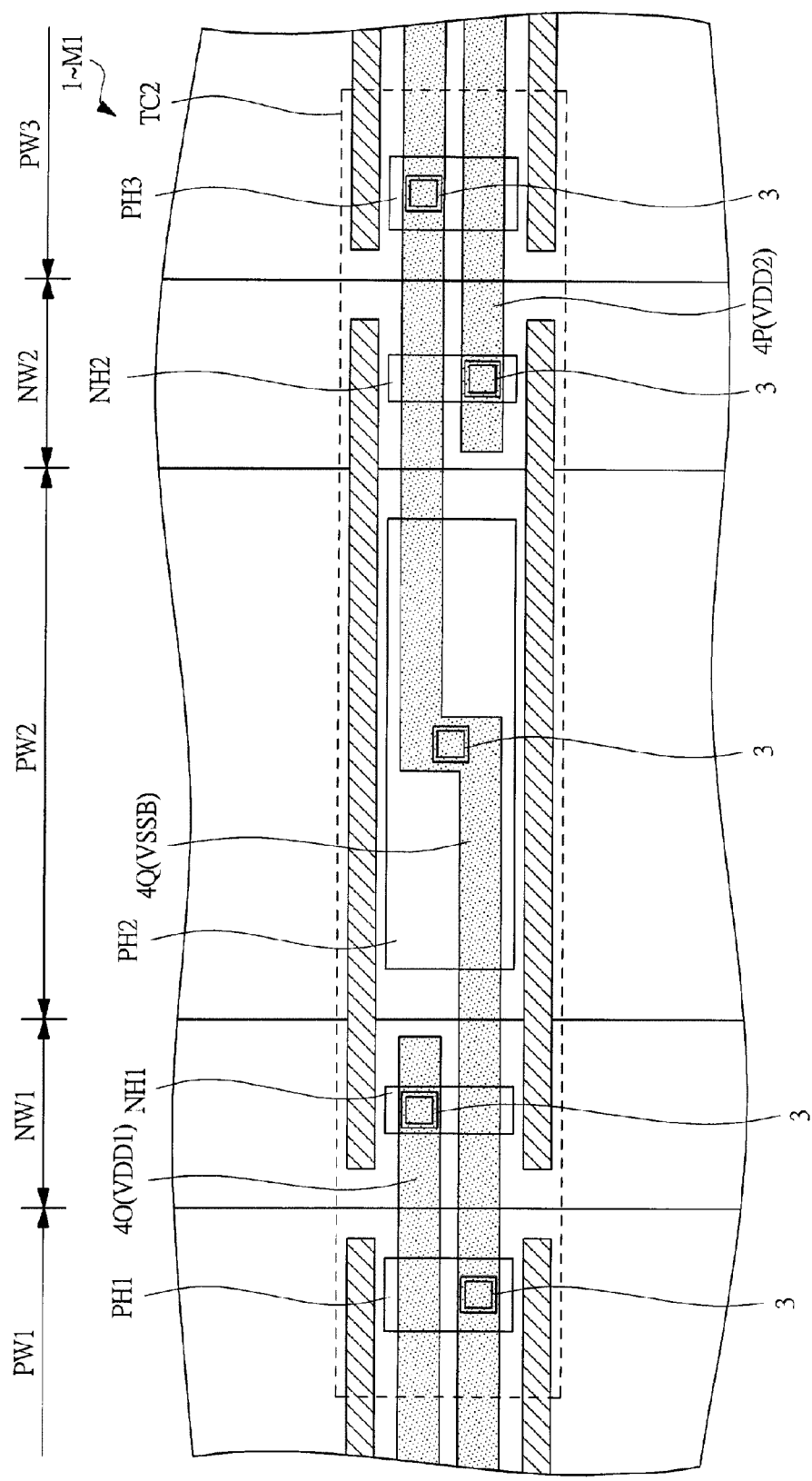
FIG. 15 is a plan view of relevant parts showing part of the plan view of relevant parts in FIG. 14.
Figure 16:
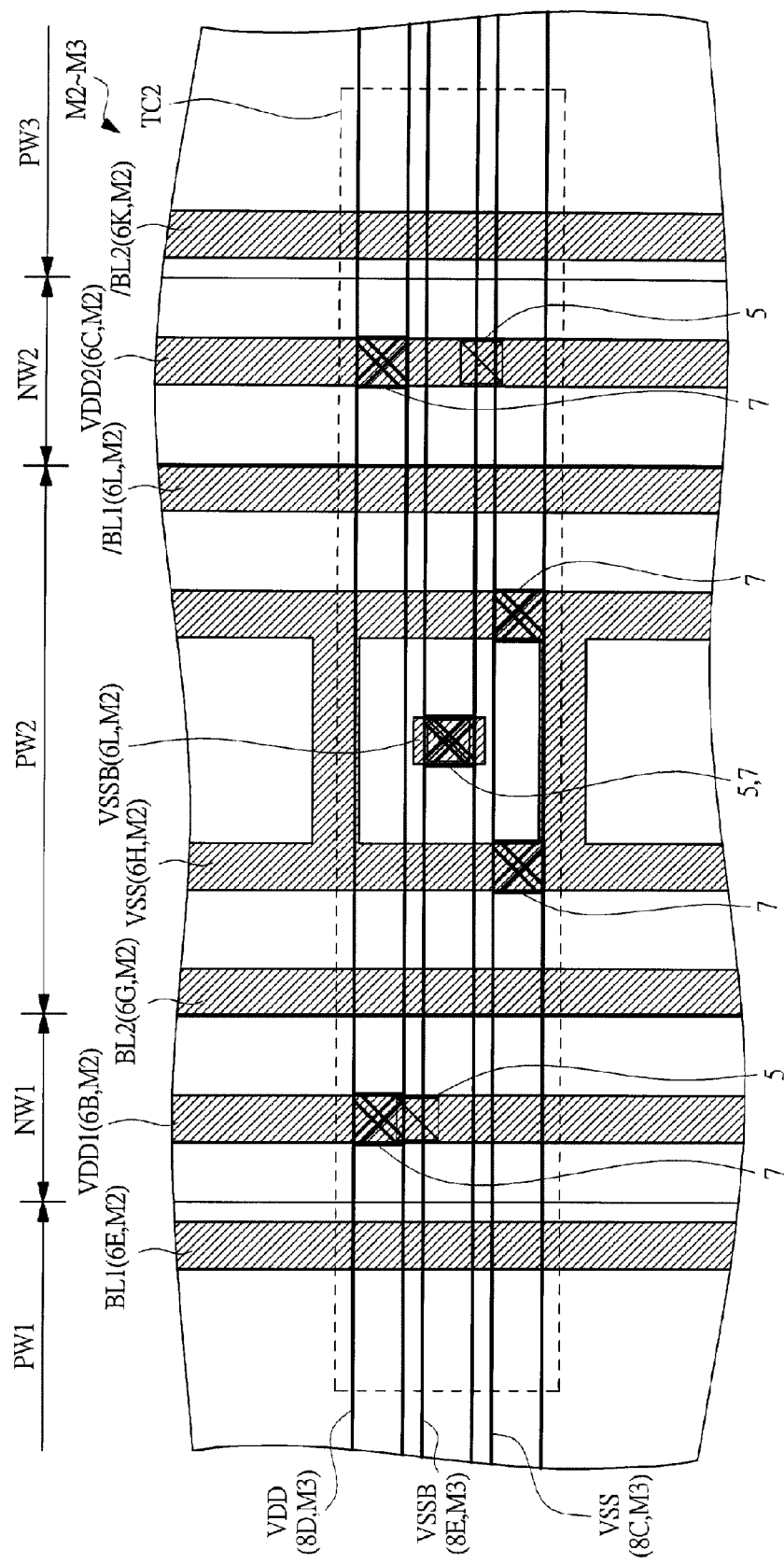
FIG. 16 is a plan view of relevant parts showing another part of the plan view of relevant parts in FIG. 14.

A structure of another tap cell TC2 is explained using FIG. 14 to FIG. 16. FIG. 14 shows a plan view of relevant parts of the other tap cell TC2 in the first embodiment. FIG. 15 shows a plan view of relevant parts representing from the silicon substrate 1 to the first wiring layer M1 of the plan view of relevant parts in FIG. 14. FIG. 16 shows a plan view of relevant parts representing from the second wiring layer M2 to the third wiring layer M3 of the plan view of relevant parts in FIG. 14.

In the tap cell TC2, the p-type high concentration diffusion layers PH1, PH2 and PH3 of each of the p wells PW1, PW2 and PW3 are electrically coupled to a substrate potential line VSSB, which is a third metal wire 8E in the third wiring layer M3, via the contact plug 3, a first metal wire 4Q in the first wiring layer M1, the first via plug 5, a second metal wire 6L in the second wiring layer M2, and the second via plug 7. The substrate potential line VSSB is disposed separately from the ground potential line VSS, and therefore, to the p-type high concentration diffusion layers PH1, PH2 and PH3 in the tap cell TC2, a potential different from the ground potential line VSS is supplied as a result. Then, to the memory cell, a potential is supplied by the ground potential line VSS similar to the above. As described above, the ground potential line VSS in the memory cell is a wire to supply electricity to the sources of the n-channel type driver transistors QND1, QND2. Consequently, it is possible to control the source potential of the driver transistors QND1, QND2 in the memory cell separately from the substrate potential (well potential). Due to this, it is possible to reduce the channel leak current of the driver transistors QND1, QND2.

Second Embodiment

Figure 17:
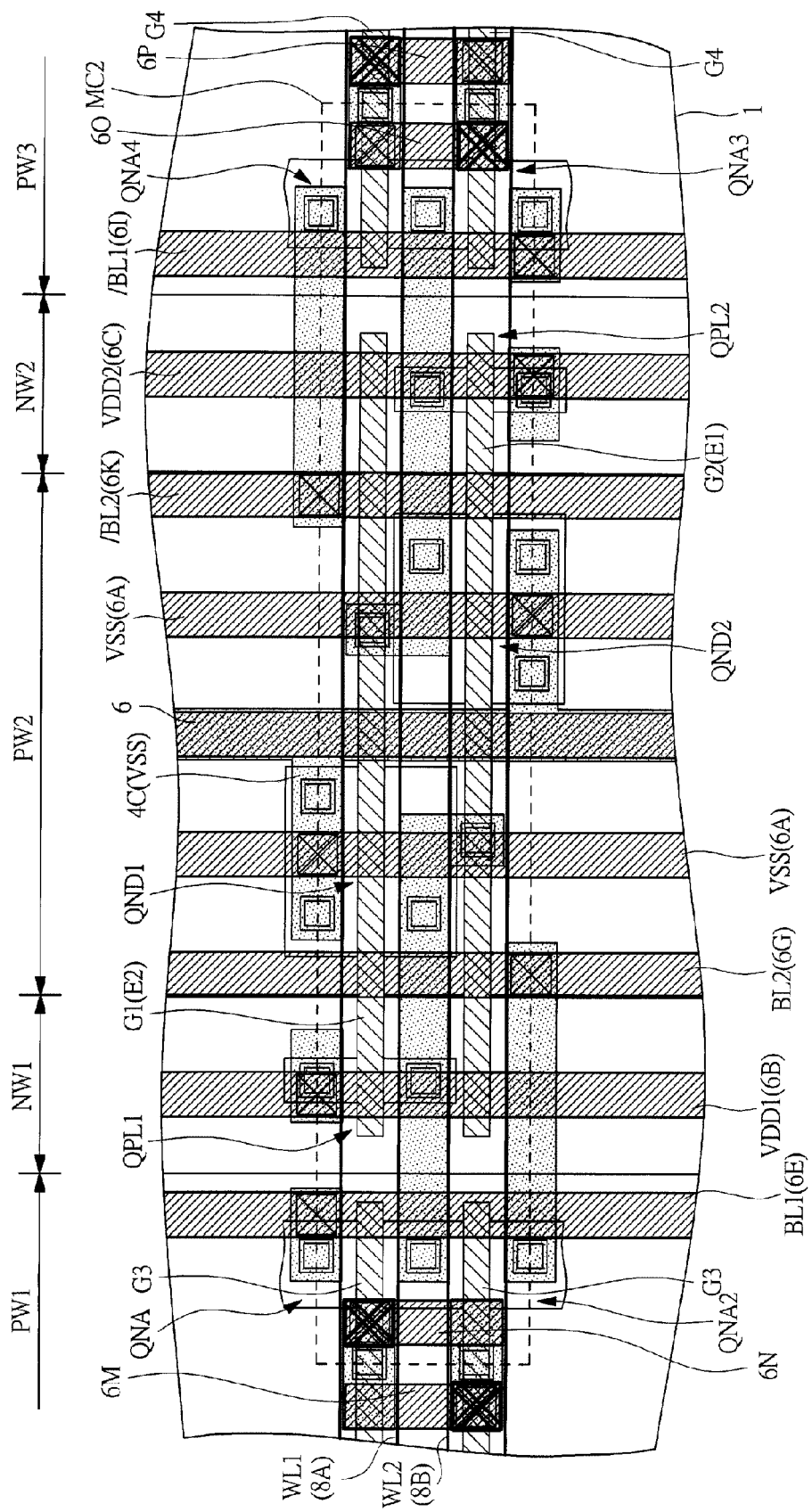
FIG. 17 is a plan view of relevant parts showing one memory cell in an SRAM of a semiconductor device, which is a second embodiment of the present invention.
Figure 18:
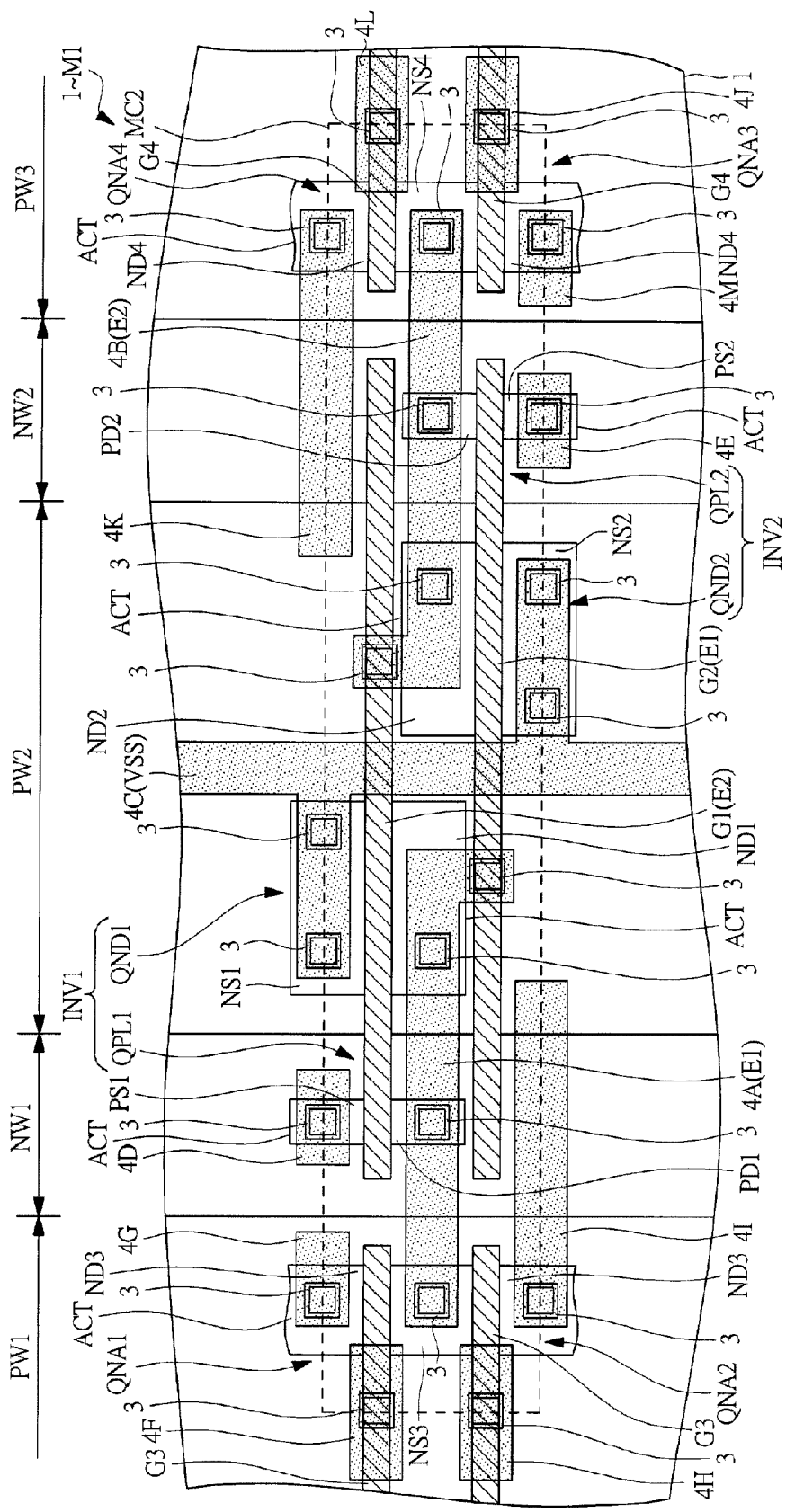
FIG. 18 is a plan view of relevant parts showing part of the plan view of relevant parts in FIG. 17.
Figure 19:
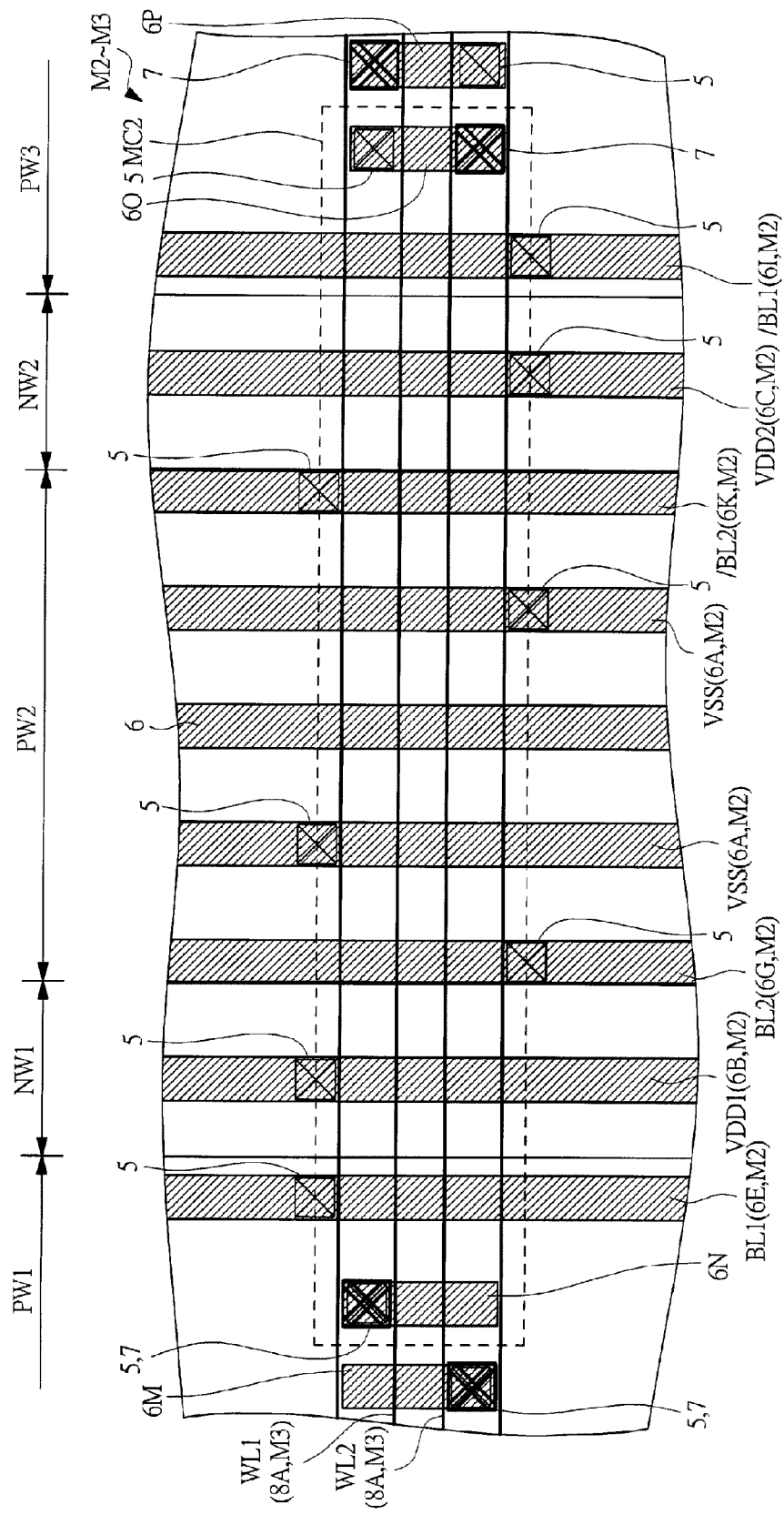
FIG. 19 is a plan view of relevant parts showing another part of the plan view of relevant parts in FIG. 17.
Figure 20:
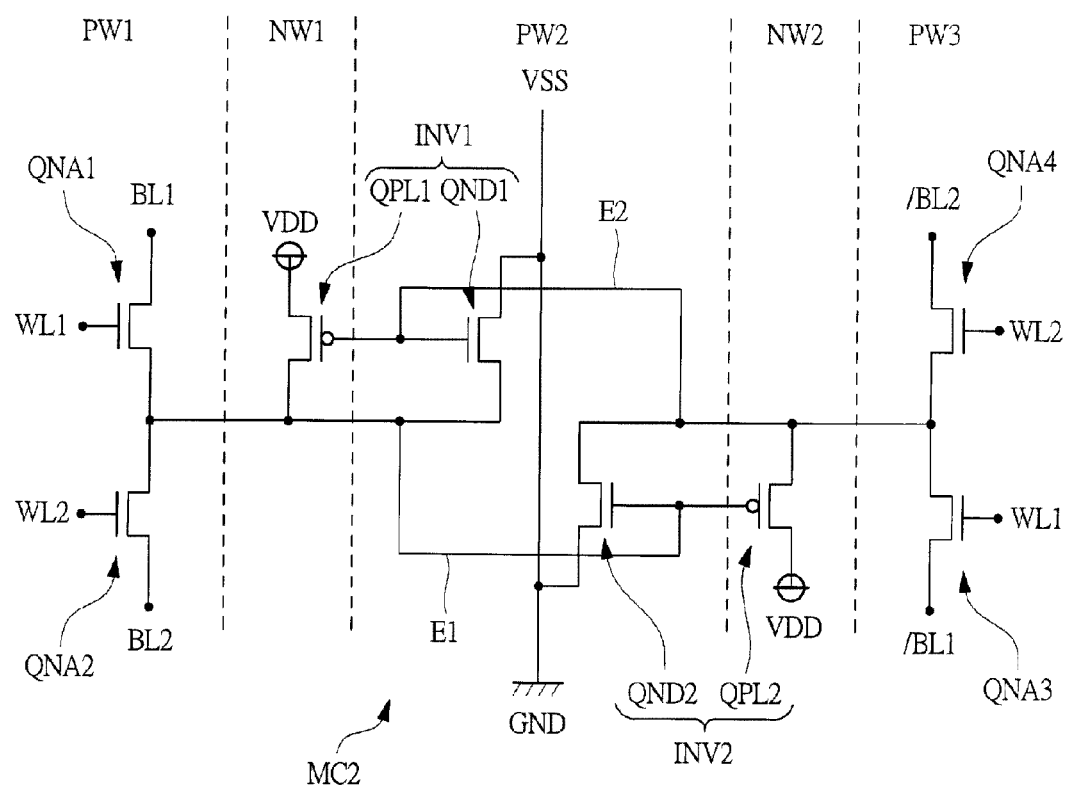
FIG. 20 is an equivalent circuit diagram of the memory cell in the second embodiment of the present invention.
Figure 21:
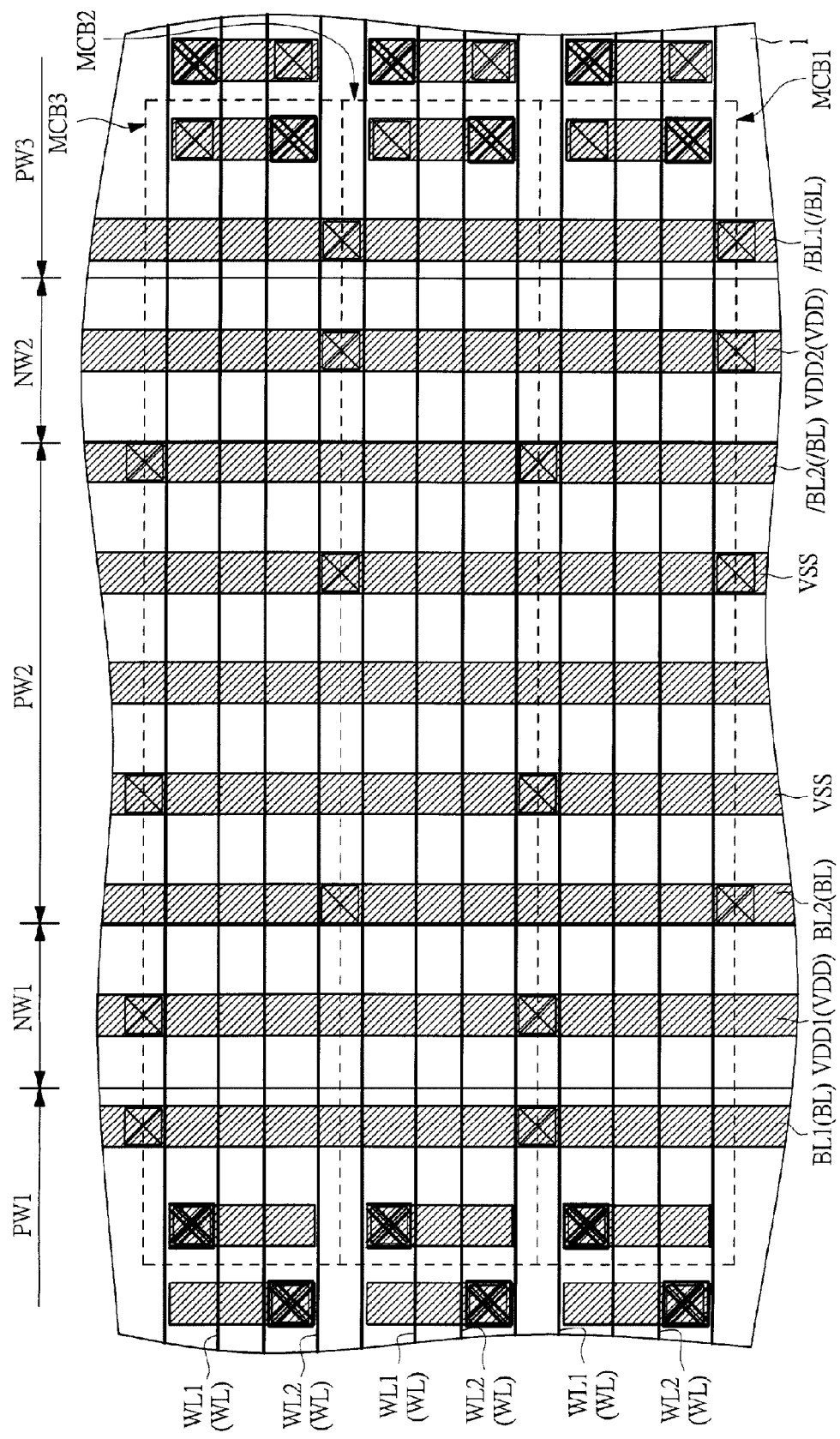
FIG. 21 is a plan view of relevant parts showing three memory cells neighboring in the column direction in the SRAM of the semiconductor device, which is the second embodiment of the present invention.
Figure 22:
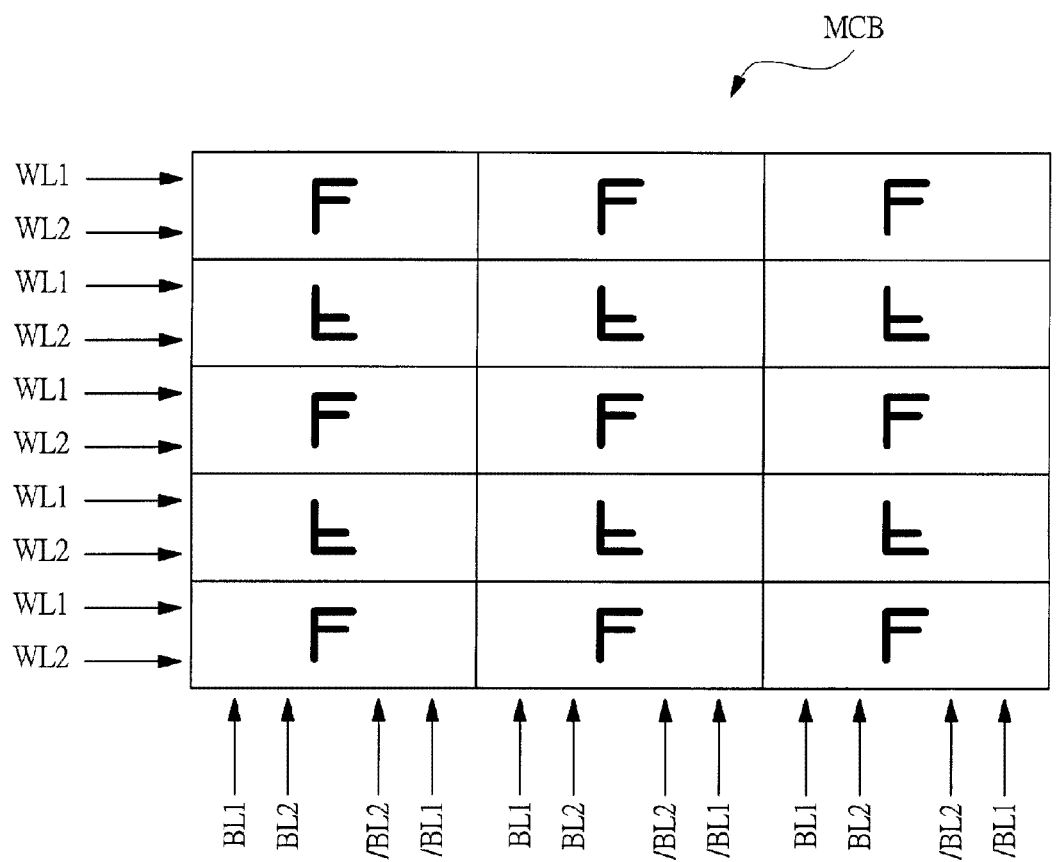
FIG. 22 is an explanatory diagram showing a plurality of memory cells arranged in the row direction and the column direction in the SRAM of the semiconductor device, which is the second embodiment of the present invention.

FIG. 17 shows a plan view of relevant parts of one memory cell (static memory cell) MC2 in a dual-port SRAM in a second embodiment. FIG. 18 shows a plan view of relevant parts representing from the silicon substrate 1 to the first wiring layer M1 of the plan view of relevant parts in FIG. 17. FIG. 19 shows a plan view of relevant parts representing from the second wiring layer M2 to the third wiring layer M3 of the plan view of relevant parts in FIG. 17. FIG. 20 shows an equivalent circuit diagram in which each element and wire are arranged according to an actual layout of the memory cell MC2 in the second embodiment. FIG. 21 shows a plan view of relevant parts of three memory cells MCB1, MCB2 and MCB3 neighboring in the column direction in the dual-port SRAM in the second embodiment. FIG. 22 shows an explanatory diagram of a plurality of memory cells MCB arranged in the row direction and the column direction in the dual-part SRAM in the second embodiment. The dual-port SRAM of a semiconductor device in the second embodiment is explained with reference to FIG. 17 to FIG. 22.

In the dual-port SRAM of the semiconductor device in the second embodiment, the circuit configuration itself of one memory cell MC2 is the same as that of the memory cell MC1 in the first embodiment. The memory cell MC2 in the second embodiment differs from the memory cell MC1 in the first embodiment in the following points of the layout of the elements and wires over the silicon substrate 1. That is, as shown in FIG. 20, by exchanging the layout of the first negative-phase access transistor QNA3 and the second negative-phase access transistor QNA4, the arrangements of the respective negative-phase bit lines /BL1, /BL2 disposed in the second wiring layer M2 are interchanged. This is explained below in more detail.

In the memory cell MC1 in the first embodiment, as shown in FIG. 2 and FIG. 3, the first positive-phase access transistor QNA1 in the first p well PW1 and the first negative-phase access transistor QNA3 in the third p well PW3 are arranged in the positions in line symmetry with respect to the column direction. Similarly, the second positive-phase access transistor QNA2 in the first p well PW1 and the second negative-phase access transistor QNA4 in the third p well PW3 are arranged in the positions in line symmetry with respect to the column direction.

In contrast to this, in the memory cell MC2 in the second embodiment, as shown in FIG. 17 and FIG. 18, the first negative-phase access transistor QNA3 and the second negative-phase access transistor QNA4 in the third p well PW3 are disposed so that their positions are exchanged. The exchange of the positions of the positive-phase access transistors QNA1, QNA2 in the first p well PW1 has relatively the same effect. Hence, in the memory cell MC2 in the second embodiment, the first positive-phase access transistor QNA1 in the first p well PW1 and the second negative-phase access transistor QNA4 in the third p well PW3 are arranged in the positions in line symmetry with respect to the column direction. Similarly, the second positive-phase access transistor QNA2 in the first p well PW1 and the first negative-phase access transistor QNA3 in the third p well PW3 are arranged in the positions in line symmetry with respect the column direction.

In this state, the patterns of the first metal wires 4A, 4B and 4F to 4L in the first wiring layer M1 relating to each of the access transistors QNA1, QNA2, QNA3 and QNA4 are not changed. Consequently, as shown in FIG. 19, the second metal wires 6I, 6K in the second wiring layer M2 are arranged so that the first negative-phase bit line /BL1 and the second negative-phase bit line /BL2 are exchanged. In other words, the second metal wires 6A, 6B, 6C, 6E, 6G, 6I and 6K in the second wiring layer M2 are arranged in order of the first positive-phase bit line BL1 (6E), the first power source potential line VDD1 (6B), the second positive-phase bit line BL2 (6G), the ground potential line VSS (6A), the second negative-phase bit line /BL2 (6K), the second power source potential line VDD2 (6C), and the first negative-phase bit line /BL1 (6I) when viewed in the row direction. The effect of such a wiring structure is explained below in detail.

In the memory cell MC2 in the second embodiment, the degree of symmetry of each of the bit lines BL1, BL2, /BL1 and /BL2 is increased by the arrangement of the above-mentioned second wiring layer M2. More specifically, as shown in FIG. 19, with the two ground potential lines VSS at the center when viewed in the row direction as axes, the second positive-phase bit line BL2 and the second negative-phase bit line /BL2 are arranged on both the first adjacent sides. Then, with the power source potential lines VDD1, VDD2 in between, the first positive-phase bit line BL1 and the first negative-phase bit line /BL1 are arranged. In other words, when the memory cell MC2 is viewed in the row direction, the second positive-phase bit line BL2 and the second negative-phase bit line /BL2 are arranged on the inner side and the first positive-phase bit line BL1 and the first negative-phase bit line /BL1 are arranged on the outer side.

As described above, by arranging a pair of complementary bit lines of the same port, that is, the first positive-phase bit line BL1 and the first negative-phase bit line /BL1, and the second positive-phase bit line BL2 and the negative-phase bit line /BL2 in symmetric positions, it is possible to reduce the difference in wire capacitance between the pair of bit lines. Due to this, it is made easier to secure the margin of the sense amplifier.

Further, the first positive-phase bit line BL1 and the first negative-phase bit line /BL1 are separated and the wire capacitance between both is reduced, and therefore, it is possible to increase the operation speed of the first port.

As described above, in the memory cell MC2 in the second embodiment, the first positive-phase access transistor QNA1 in the first p well PW1 and the second negative-phase access transistor QNA4 in the third p well PW3 are arranged in the positions in line symmetry with respect to the column direction. Similarly, the second positive-phase access transistor QNA2 and the first negative-phase access transistor QNA3 in the first p well PW1 are arranged in the positions in line symmetry with respect to the column direction.

Hence, it is made easier to arrange the wires in the memory cell MC2 and the wires coupled to the memory cell MC2 in a symmetric layout in the column direction when viewed from the second p well PW2.

Further, in the memory cell MC2 in the second embodiment, as described above, the positions of the first negative-phase access transistor QNA3 and the second negative-phase access transistor QNA4 in the third p well PW3 are exchanged, and therefore, the positions of the gates G4 of the respective negative-phase access transistors QNA3, QNA4 are also exchanged as a result. Here, as described above, because of the circuit configuration, it is necessary to couple the gate G4 of the first negative-phase access transistor QNA3 to the first word line WL1 and the gate G4 of the second negative-phase access transistor QNA4 to the second word line WL2, and therefore, it is also necessary to interchange the layouts of these two word lines WL1, WL2. However, the word lines WL1, WL2 are coupled also to the gates G3 of the positive-phase access transistors QNA1, QNA2 in the first p well PW1 the layouts of which are not exchanged, and therefore, it is not preferable to interchange the layouts of the two word lines WL1, WL2.

Hence, in the memory cell MC2 in the second embodiment, second metal wires 6M, 6N, 6O and 6P in the second wiring layer M2 are arranged by taking their wiring patterns into consideration so that each of the gates G3, G4 of each of the access transistors QNA1, QNA2, QNA3 and QNA4 can be coupled to the desired word lines WL1, WL2. For example, as shown in FIG. 17 to FIG. 19, by disposing the second metal wire 6O so as to extend along the column direction, it is possible to make both ends of the second metal wire 6O in the column direction overlap the gate G4 of the first negative-phase access transistor QNA3 and the first word line WL1 in a planar manner. Due to this, it is possible to electrically couple both via the second metal wire 6O. Further, as shown in FIG. 17 to FIG. 19, by disposing the second metal wire 6P so as to extend along the column direction, it is possible to make both ends of the second metal wire 6P in the column direction overlap the gate G4 of the second negative-phase access transistor QNA4 and the second word line WL2 in a planar manner. Due to this, it is possible to electrically couple both via the second metal wire 6P. In FIG. 17 to FIG. 19, the case is shown, where the layouts of the negative-phase access transistors QNA3, QNA4 are exchanged, however, even in the case where the layouts of the positive-phase access transistors QNA1, QNA2 are exchanged, it is also possible to couple the desired gate G3 and the word lines WL1, WL2 by similarly applying the second metal wires 6M, 6N extending in the column direction. As described above, by disposing the second metal wires 6M, 6N, 6O and 6P so as to extend in the column direction, it is possible to realize desired wiring without interchanging the layouts of both the word lines WL1, WL2 even if the layouts of the positive-phase access transistors QNA1, QNA2 or the layouts of the negative-phase access transistors QNA3, QNA4 are interchanged. Hence, it is possible to realize a desired circuit configuration while realizing the reduction of capacitance between bit lines as described above.

In this manner, with the memory cell MC2 in the second embodiment, it is possible to couple the respective gates to the desired word lines WL1, WL2 by using the second metal wires 6M, 6N, 6O and 6P in the second wiring layer M2 as described above. This means that it is possible to arbitrarily interchange the positional relationship of the two word lines WL1, WL2. This is because it is possible to couple the word lines WL1, WL2 with the gates G3, G4 of the desired access transistors QNA1, QNA2, QNA3 and QNA4 by using the second metal wires 6M, 6N, 6O and 6P in the second wiring layer M2 regardless of the positional relationship of the word lines WL1, WL2. Consequently, in the SRAM in the second embodiment, as shown in FIG. 22, it is made possible to arrange the first word line WL1 and the second word line WL2 alternately side by side in the column direction. Due to this, it is possible to reduce the coupling noise between word lines.

In the memory cell MC2 in the second embodiment, as in the memory cell MC1 in the first embodiment, the first word line WL1 and the second word line WL2 are disposed in the third wiring layer M3. Further, the first word line WL1 is coupled to the gate G3 of the first positive-phase access transistor QNA1 and the gate G4 of the first negative-phase access transistor QNA3 via the second via plug 7, the second metal wires 6N, 6P, the first via plug 5, the first metal wires 4F, 4J, and the contact plug 3. The second word line WL2 is coupled to the gate G3 of the second positive-phase access transistor QNA2 and the gate G4 of the second negative-phase access transistor QNA4 via the second via plug 7, the second metal wires 6M, 6O, the first via plug 5, the first metal wires 4H, 4L, and the contact plug 3. Then, in the above, it is explained that the second metal wires 6M, 6N, 6O and 6P in the second wiring layer M2 are arranged by taking their wiring patterns into consideration in order to couple the gates G3, G4 of each of the access transistors QNA1, QNA2, QNA3 and QNA4 with the desired word lines WL1, WL2. From a similar viewpoint, it may also be possible to dispose the first metal wires 4F, 4H, 4J and 4L in the first wiring layer M1 by taking their wiring patters into consideration. A specific method thereof is explained below.

Figure 23:
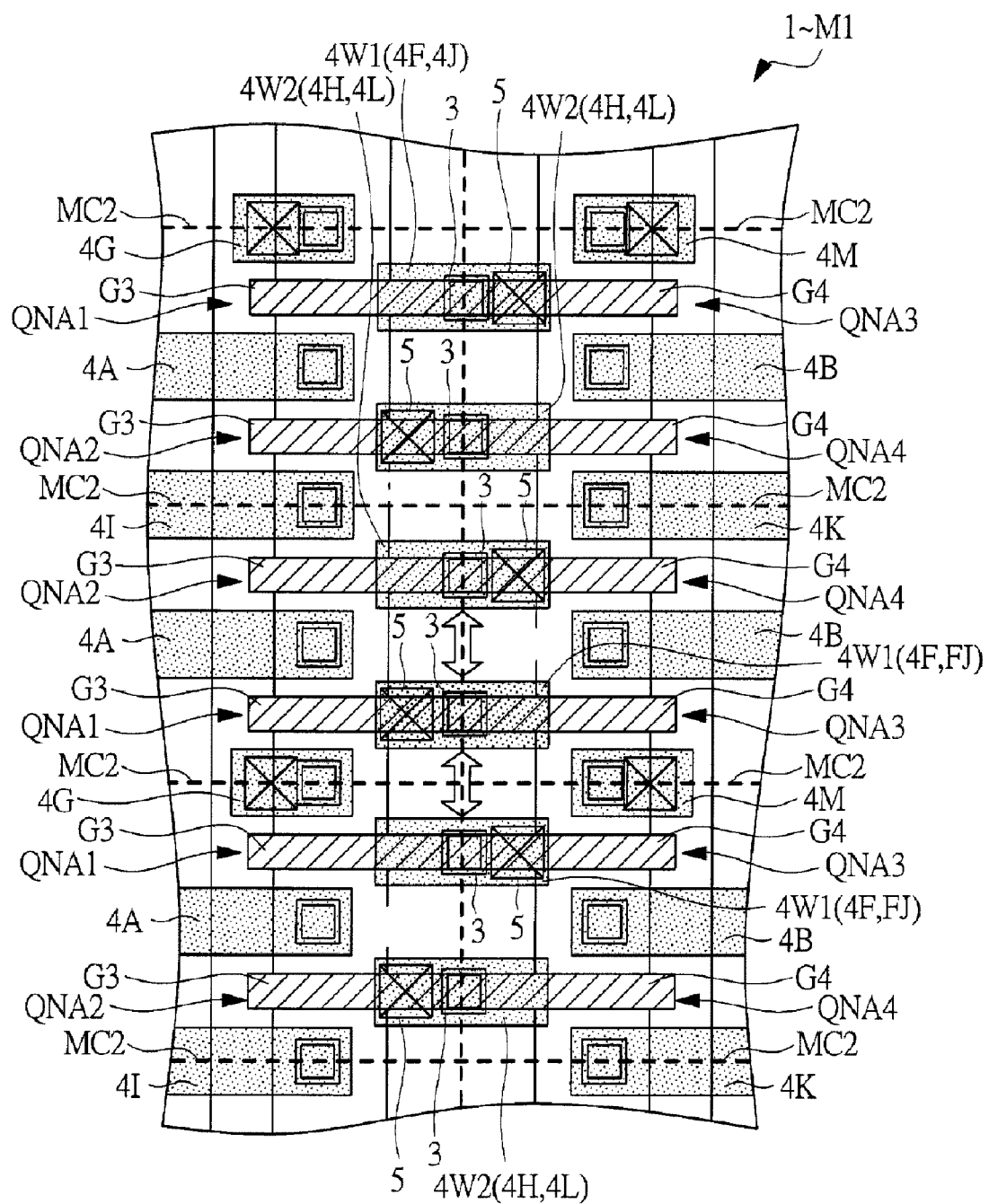
FIG. 23 is a plan view of relevant parts showing a boundary part of neighboring memory cells in the SRAM of the semiconductor device, which is the second embodiment of the present invention.

FIG. 23 shows a plan view of relevant parts, which are the boundary regions of the neighboring memory cells MC2 extracted from the SRAM of the semiconductor device in the second embodiment. The neighboring memory cells MC2 share the gates G3, G4 of each of the access transistors QNA1, QNA2, QNA3 and QNA4. Then, to the gates G3, G4, the first metal wires 4F, 4H, 4J and 4L in the first wiring layer M1 are coupled via the contact plug 3. As described above, relayed by the first metal wires 4F, 4H, 4J and 4L and via the first via plug 5, the second metal wires 6M, 6N, 6O and 6P, and the second via plug 7, the gates G3, G4 are coupled to each of the word lines WL1, WL2 in the third wiring layer M3. Here, the first metal wires 4F, 4H, 4J and 4L in the first wiring layer M1 that relay the electrical coupling between each of the word lines WL1, WL2 and the gates G3, G4 are referred to, in particular, as a first word coupling wire 4W1 and a second word coupling wire 4W2. The first metal wires 4F, 4J in the first wiring layer M1 that relay the gate G3 of the first positive-phase access transistor QNA1 and the gate G4 of the first negative-phase access transistor QNA3 to the first word line WL1 are the first word coupling wire 4W1. The first metal wires 4H, 4L in the first wiring layer M1 that relay the gate G3 of the second positive-phase access transistor QNA2 and the gate G4 of the second negative-phase access transistor QNA4 to the second word line WL2 are the second word coupling wire 4W2.

In the example in FIG. 23 showing the memory cell MC2 in the second embodiment explained in FIG. 18 to FIG. 21, the first word coupling wire 4W1 and the second word coupling wire 4W2 are arranged so as to extend in the row direction. Then, in order to couple the gates G3, G4 with the desired word lines WL1, WL2, the second metal wires 6M, 6N, 6O and 6P in the second wiring layer M2 are arranged by taking their wiring patterns into consideration as described above.

Figure 24:
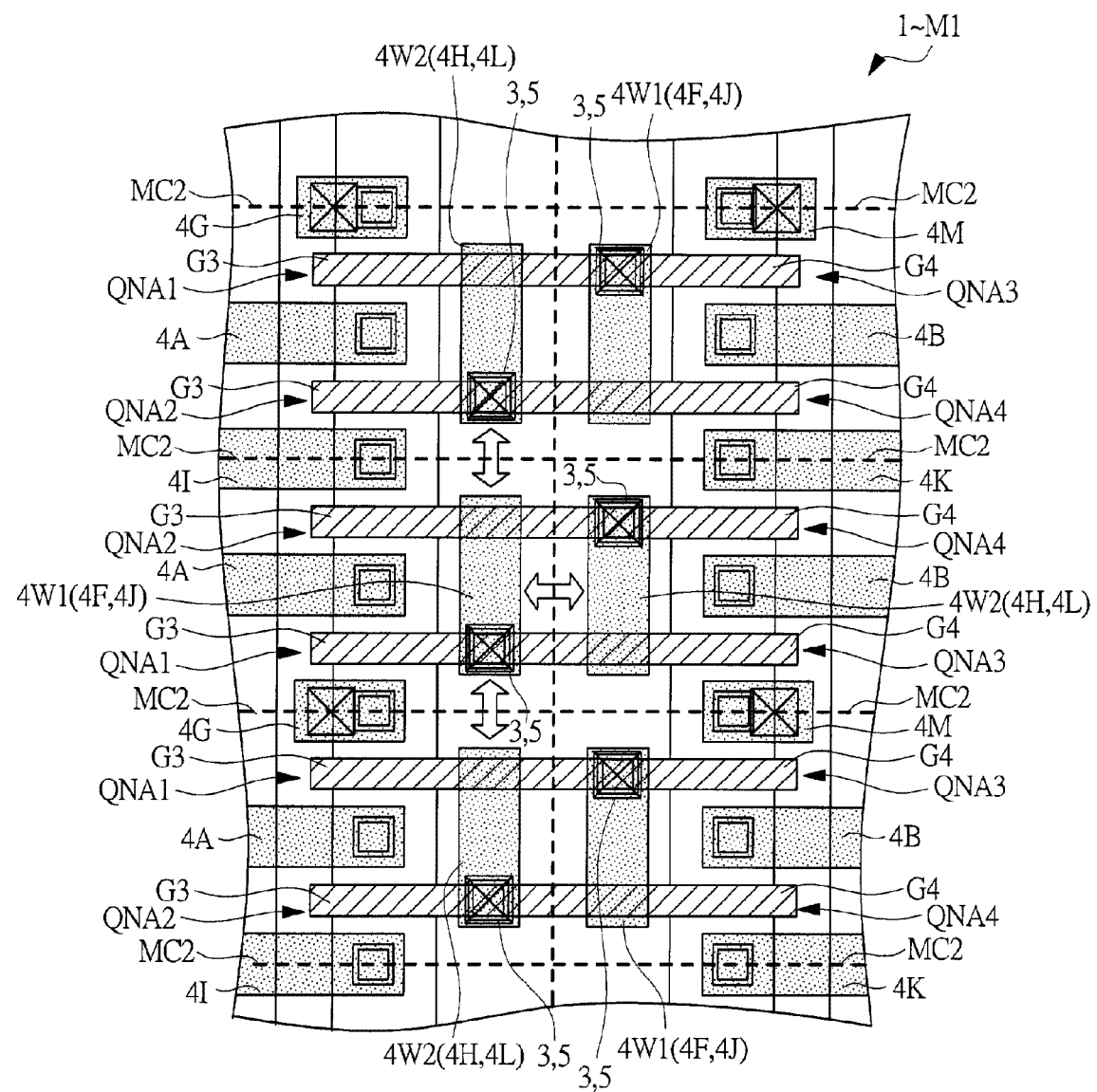
FIG. 24 is a plan view of relevant parts showing a boundary part of neighboring memory cells in another SRAM of the semiconductor device, which is the second embodiment of the present invention.

In contrast to this, in the example shown in FIG. 24, the first word coupling wire 4W1 and the second word coupling wire 4W2, which are the first metal wires 4F, 4H, 4J and 4L in the first wiring layer M1, are arranged by taking their wiring patterns into consideration in order to couple the gates G3, G4 with the desired word lines WL1, WL2. FIG. 24 shows a plan view of relevant parts, which are the boundary regions of the neighboring memory cells MC2 extracted from another SRAM of the semiconductor device in the second embodiment. As shown in FIG. 24, the first word coupling wire 4W1 and the second word coupling wire 4W2 are arranged so as to extend along the column direction. By arranging in this manner, the first word coupling wire 4W1 and the second word coupling wire 4W2 are arranged side by side when the memory cells MC2 neighboring in the row direction are viewed or the memory cells MC2 neighboring in the column direction are viewed. In other words, at the boundary region of the memory cell MC2, the first word coupling wire 4W1 and the second word coupling wire 4W2 are arranged alternately both in the row direction and in the column direction. The effect of such an arrangement of the word coupling wires 4W1, 4W2 in the first wiring layer M1 is explained below.

For example, in the structure explained in FIG. 23, between the neighboring memory cells MC2, the first word coupling wires 4W1 or the second word coupling wires 4W2 are arranged neighboring each other. In this case, there is a possibility that the first word coupling wires 4W1 (or the second word coupling wires 4W2) are selected at the same time in the neighboring memory cells MC2, and there is a possibility of the influence of coupling noises. In contrast to this, in the structure explained in FIG. 24, by arranging the word coupling wires 4W1, 4W2 alternately as described above in the first wiring layer M1, what is arranged adjacent to the first word coupling wire 4W1 is the second word coupling wire 4W2 when viewed both in the row direction and in the column direction. Similarly, what is arranged adjacent to the second word coupling wire 4W2 is the first word coupling wire 4W1 when viewed both in the row direction and in the column direction. In other words, the first word coupling wires 4W1 are arranged oblique to each other and this also applies to the second word coupling wires 4W2. Due to this, it is possible to reduce the coupling noises between the first word coupling wires 4W1 (or the second word coupling wires 4W2) that may be selected at the same time in some cases.

On the other hand, the structure explained using FIG. 23 in comparison to the structure in FIG. 24 that can reduce the coupling noises as described above is a structure in which the word coupling wires 4W1, 4W2 can be shared by the memory cells MC2 neighboring in the row direction by extending the word coupling wires 4W1, 4W2 in the row direction. Due to this, it is possible to keep the distance between the memory cells MC2 neighboring in the row direction to a minimum. That is, the structure explained using FIG. 23 is a structure the dimension of which can be reduced in the row direction.

Figure 25:
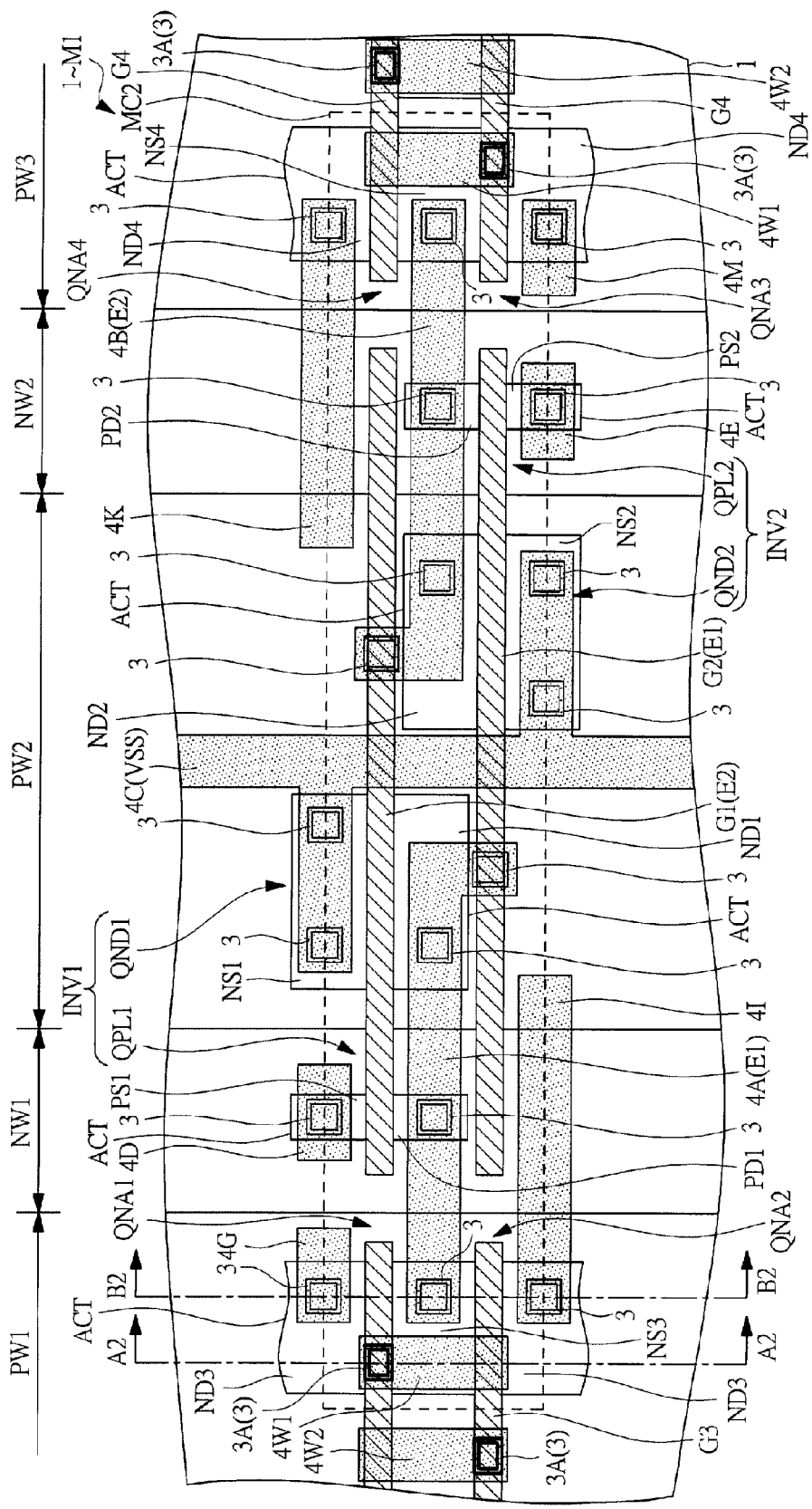
FIG. 25 is a plan view of relevant parts showing a modified example of the SRAM of the semiconductor device in FIG. 24.
Figure 26:
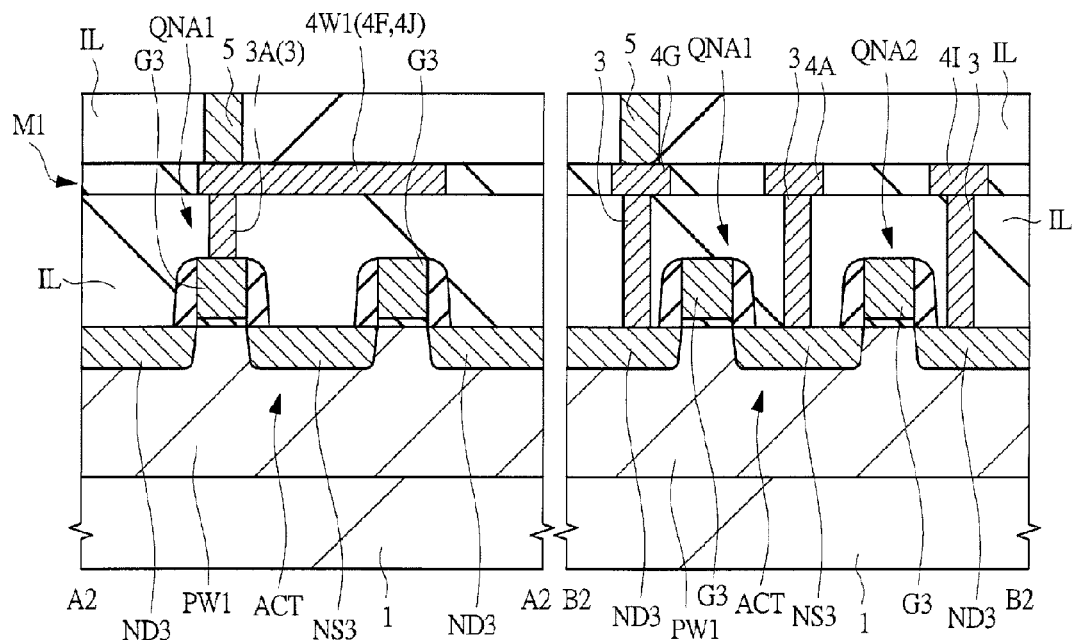
FIG. 26 is a section view of relevant parts when viewed in the arrow direction along A2-A2 line and B2-B2 line of the plan view of relevant parts in FIG. 25.

FIG. 25 shows a plan view of relevant parts showing a modified example of the memory cell MC2 explained in FIG. 24. FIG. 26 shows a section view of relevant parts when viewed in the arrow direction along A2-A2 line and B2-B2 line of the plan view of relevant parts in FIG. 25. The memory cell MC2 has a structure in which the active region ACT in which the two positive-phase access transistors QNA1, QNA are disposed is wider in the row direction than that in the memory cell MC2 explained using FIG. 18 etc. Similarly, the structure is such that the active region ACT in which the two negative-phase access transistors QNA3, QNA4 are disposed is wider in the row direction than that in the memory cell MC2 explained using FIG. 18 etc. The active region ACT of each of the access transistors QNA1, QNA2, QNA3 and QNA4 is widened by utilizing a space corresponding to an increase in distance between the neighboring memory cells MC2 by employing the pattern in which the word coupling wires 4W1, 4W2 in the first wiring layer M1 are extended in the column direction as described above. Widening the active region ACT of each of the access transistors QNA1, QNA2, QNA3 and QNA4 has the same effect as that obtained when increasing the gate width of each of the access transistors QNA1, QNA2, QNA3 and QNA4. By increasing the gate width, it is possible to increase the operation speed of each of the access transistors QNA1, QNA2, QNA3 and QNA4. Further, by increasing the gate width of each of the access transistors QNA1, QNA2, QNA3 and QNA4, it is possible to reduce local variations.

Here, the above-mentioned structure in which the active region ACT of each of the access transistors QNA1, QNA2, QNA3 and QNA4 is extended in the row direction can be realized by a coupling mechanism to the gates G3, G4 as follows. That is, the structure is such that a contact plug (coupling plug) 3A coupled to the gates G3, G4 of each of the access transistors QNA1, QNA2, QNA3 and QNA4 is dropped to the gates G3, G4 over the active region ACT in which a channel is formed. More specifically, the contact plug 3A that couples the first word coupling wire 4W1 with the gate G3 of the first positive-phase access transistor QNA1 or the gate G4 of the first negative-phase access transistor QNA3 is formed in a position that overlaps in a planar manner the active region ACT in which each of the access transistors QNA1, QNA3 is disposed. Similarly, the contact plug 3A that couples the second word coupling wire 4W2 with the gate G3 of the second positive-phase access transistor QNA2 or the gate G4 of the second negative-phase access transistor QNA4 is formed in a position that overlaps in a planar manner the active region ACT in which each of the access transistors QNA2, QNA4 is arranged. The contact plug 3A that couples the second word coupling wire 4W2 with the gate G3 or the gate G4 is disposed so as to overlap in a planar manner the equivalent active region ACT in the cell neighboring the memory cell MC2 shown in FIG. 25 in the row direction. Consequently, in FIG. 25, the second word coupling wire 4W2 and the contact plug 3A coupled thereto are disposed outside the memory cell MC2 shown schematically, and therefore, it seems that they are not disposed so as to overlap the active region ACT in a planar manner. In fact, it is assumed that the second word coupling wire 4W2 and the contact plug 3A coupled thereto are disposed so as to overlap in a planar manner the equivalent active region ACT in the neighboring cell, not shown schematically, as described above.

As described above, by forming the contact plug 3A for the gates G3, G4 over the active region ACT, which will be a channel region of each of the access transistors QNA1, QNA2, QNA3 and QNA4, it is possible to obtain a structure in which the active region ACT extends in the row direction. Then, due to this structure, it is made possible to increase the gate width of each of the access transistors QNA1, QNA2, QNA3 and QNA4 as described above. As a result, it is possible to increase the operation speed of each of the access transistors QNA1, QNA2, QNA3 and QNA4 or to reduce variations.

The configuration over the silicon substrate 1 of the memory cell MC2 in the second embodiment is the same as the configuration of the memory cell MC1 in the first embodiment except for the contents described above. That is, in the memory cell MC2 in the second embodiment also, the access transistors QNA1, QNA2, QNA3 and QNA4 and the driver transistors QND1, QND2 that share the same storage nodes E1, E2 are arranged in different p wells. More specifically, the positive-phase access transistors QNA1, QNA2 and the first driver transistor QND1 that share the first storage node E1 are arranged respectively in different p wells separated by the first n well NW1, such as the first p well PW1 and the second p well PW2. The negative-phase access transistors QNA3, QNA4 and the second driver transistor QND2 that share the second storage node E2 are arranged respectively in different p wells separated by the second n well NW2, such as the third p well PW3 and the second p well PW2. Due to this, in the memory cell MC2 in the second embodiment also, it is possible to obtain the same effect as that explained using FIG. 9 in the first embodiment. That is, it is possible to make it hard to cause the soft error (multi-bit error in the row direction) that occurs at the same time in the memory cells neighboring in the row direction. As a result, it is possible to improve reliability of a semiconductor device by applying the SRAM in the second embodiment.

Third Embodiment

In the above-mentioned first and second embodiments, the example is shown, in which the structure of the present invention is applied to the dual-port SRAM. In a third embodiment, an example is shown, in which the structure of the present invention is applied to a single-port SRAM.

Figure 27:
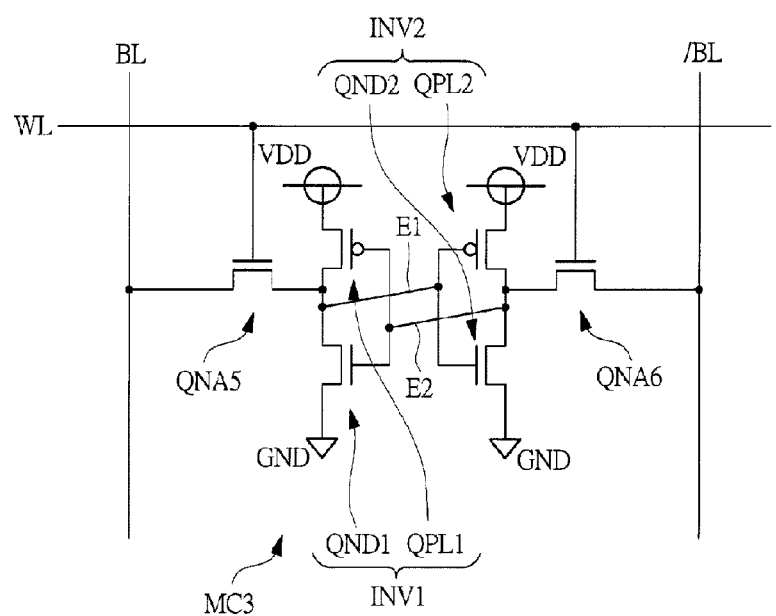
FIG. 27 is a circuit diagram showing one memory cell in an SRAM of a semiconductor device, which is a third embodiment of the present invention.
Figure 28:
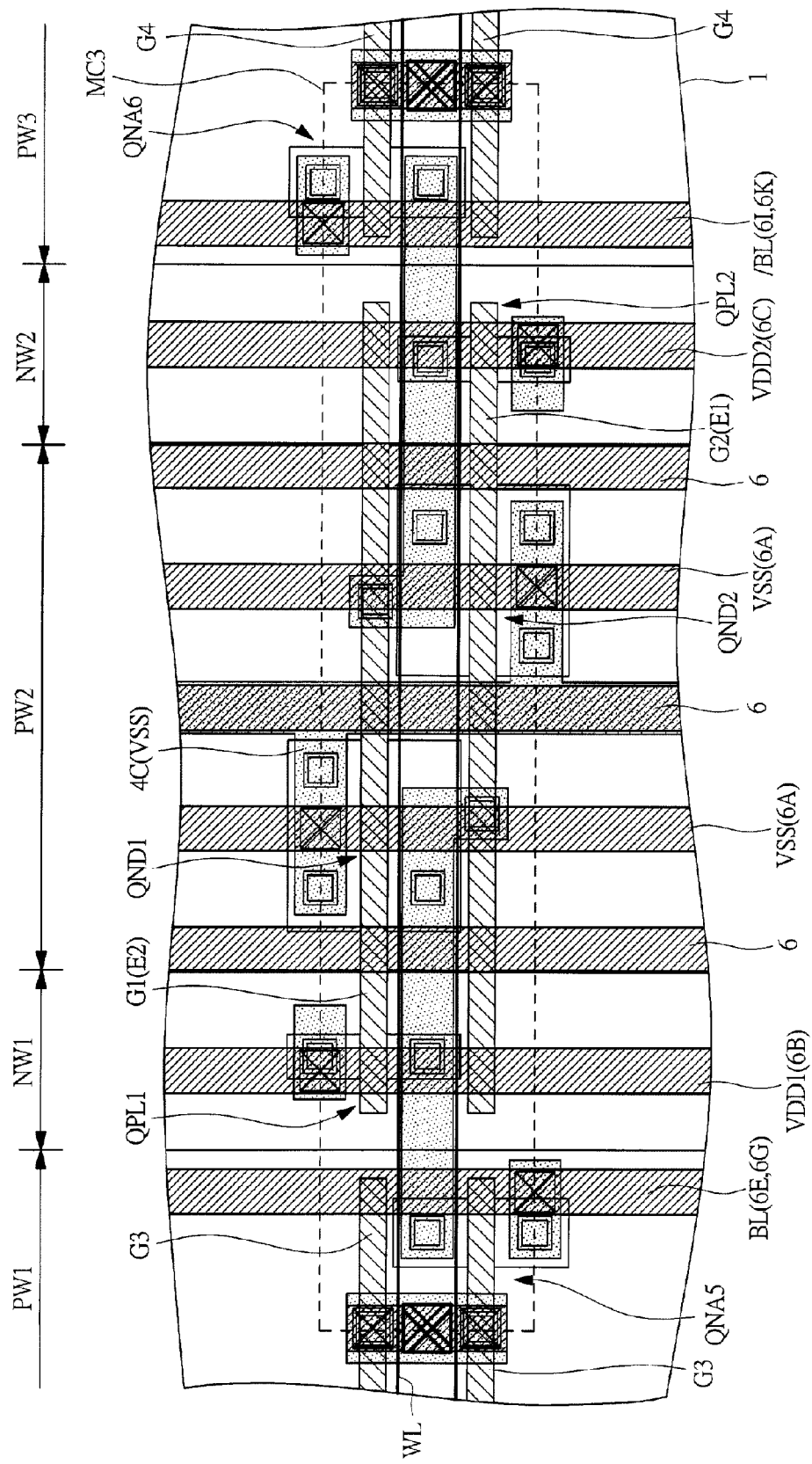
FIG. 28 is a plan view of relevant parts showing one memory cell in the SRAM of the semiconductor device, which is the third embodiment of the present invention.
Figure 29:
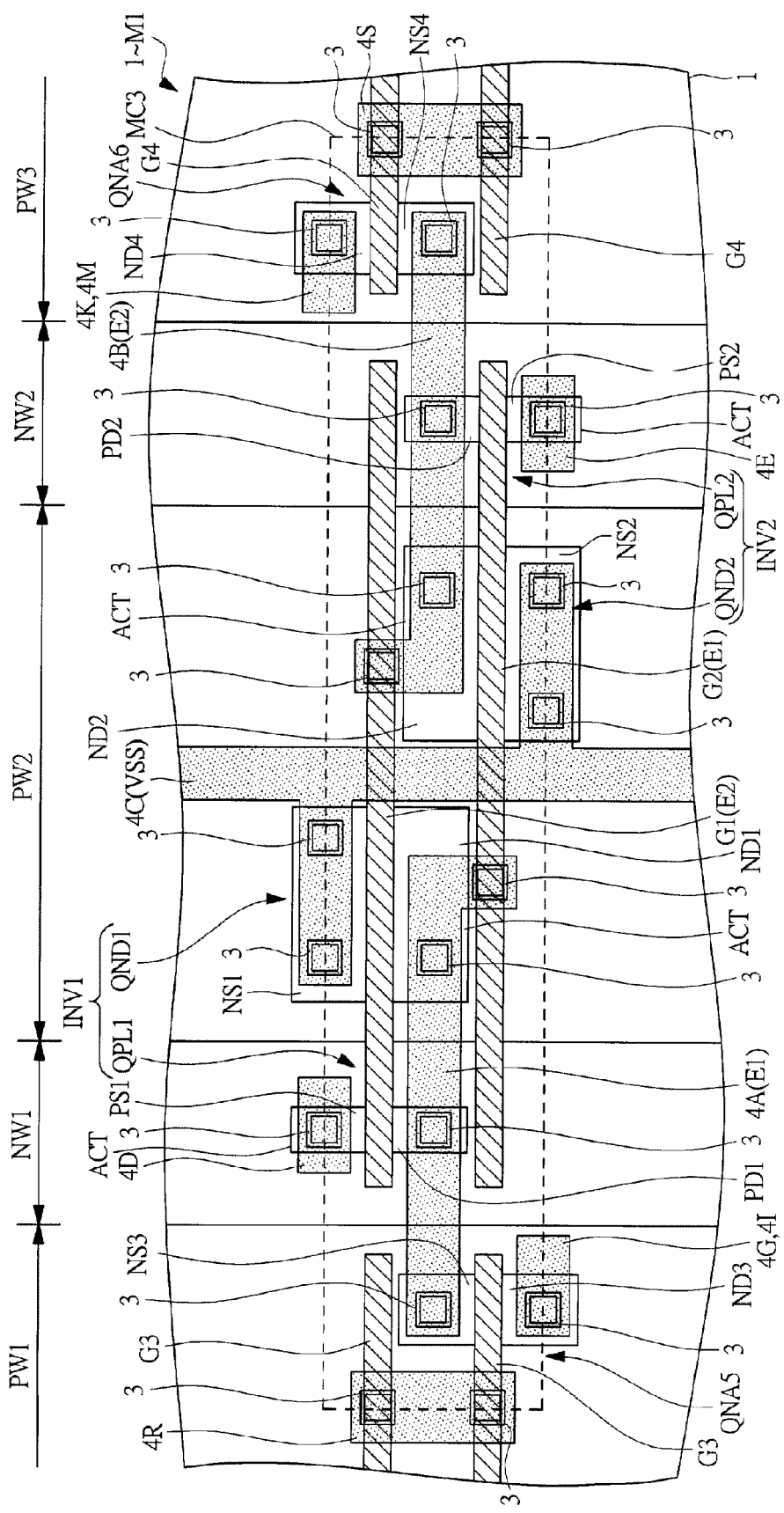
FIG. 29 is a plan view of relevant parts showing part of the plan view of relevant parts in FIG. 28.
Figure 30:
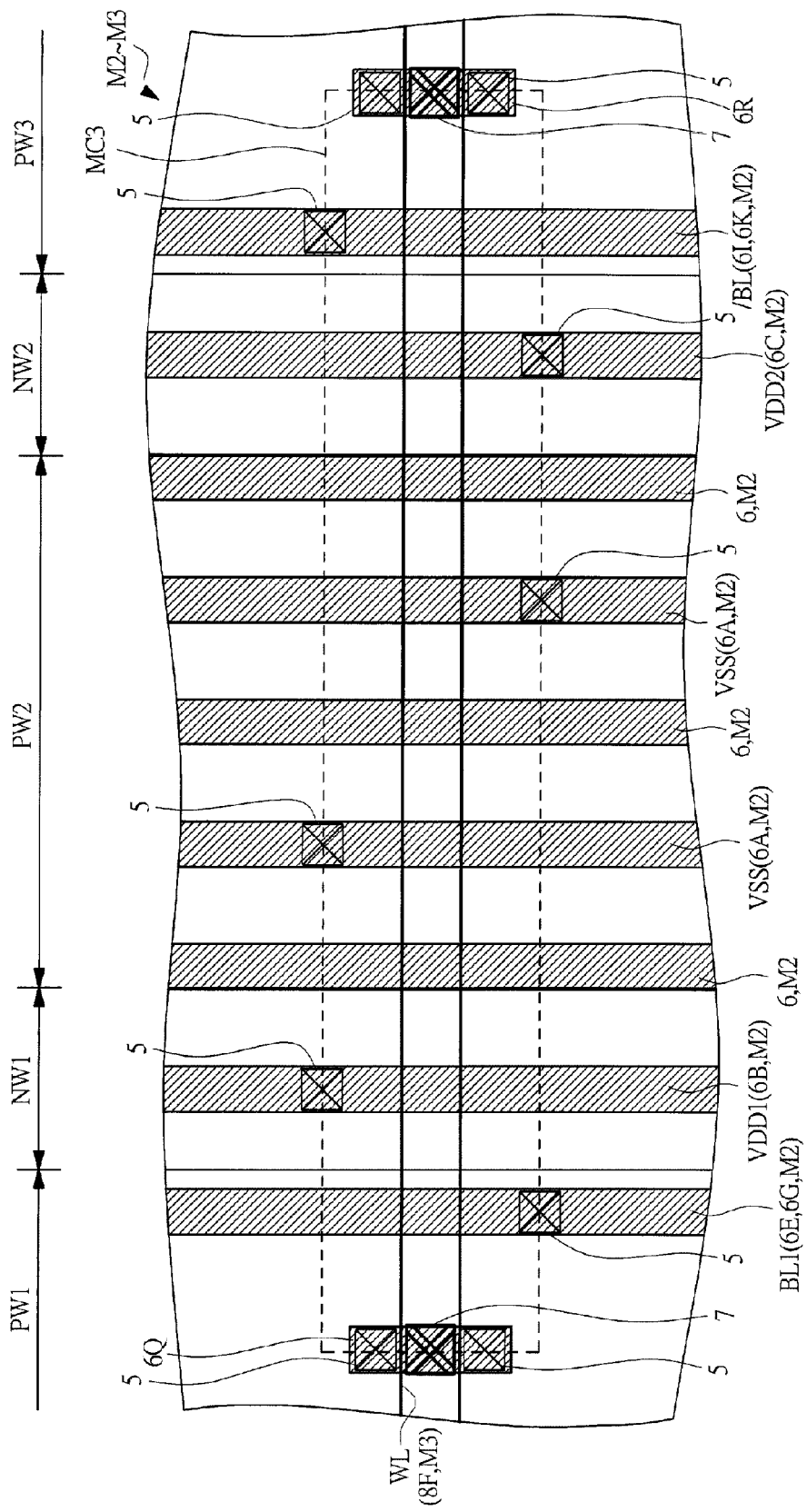
FIG. 30 is a plan view of relevant parts showing part of the plan view of relevant parts in FIG. 28.
Figure 31:
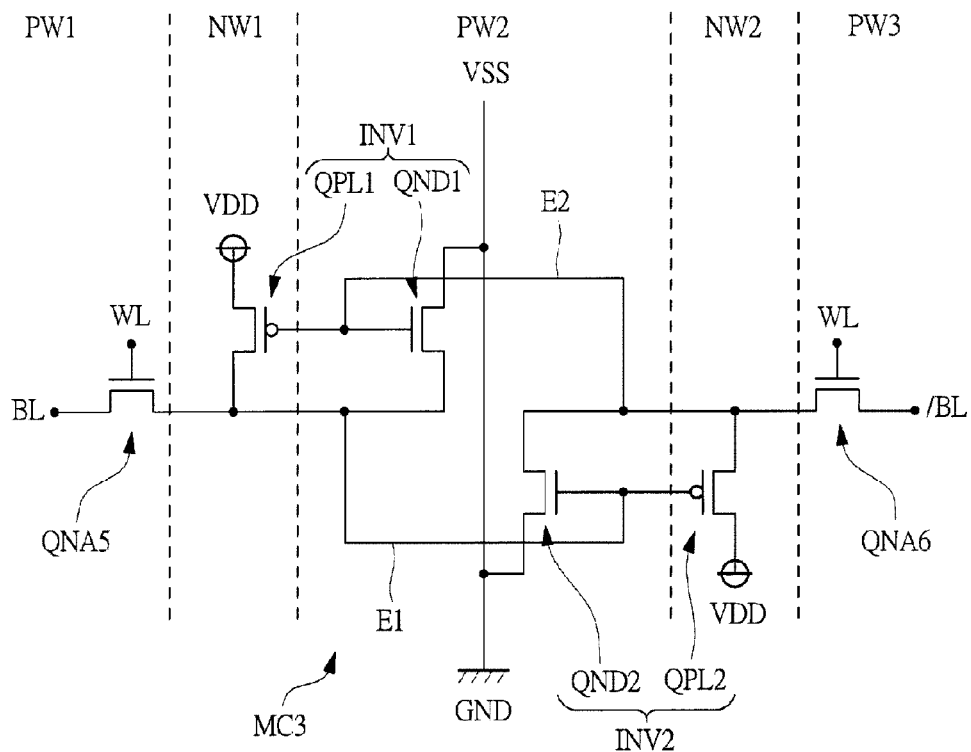
FIG. 31 is an equivalent circuit diagram of the memory cell in the third embodiment of the present invention, an equivalent circuit diagram corresponding to the circuit diagram in FIG. 27.

FIG. 27 shows a circuit diagram of one memory cell (static memory cell) MC3 in the single-port SRAM in the third embodiment. FIG. 28 shows a plan view of relevant parts of the memory cell MC3 in the third embodiment. FIG. 29 shows a plan view of relevant parts representing from the silicon substrate 1 to the first wiring layer M1 of the plan view of relevant parts in FIG. 28. FIG. 30 shows a plan view of relevant parts representing from the second wiring layer M2 to the third wiring layer M3 of the plan view of relevant parts in FIG. 28. FIG. 31 corresponds to the circuit diagram in FIG. 27, particularly showing an equivalent circuit diagram in which each element and wire are rearranged according to an actual layout. With reference to FIG. 27 to FIG. 31, the single-port SRAM of a semiconductor device in the third embodiment is explained.

As shown in FIG. 27 and FIG. 31, in the single-port SRAM of the semiconductor device in the third embodiment, the circuit configuration of one memory cell MC3 differs from that of the memory cell MC1 in the first embodiment in the following points. That is, the SRAM in the third embodiment is a single-port SRAM, and therefore, has only a set of a positive-phase access transistor QNA5 and a negative-phase access transistor QNA6 as access transistors. Then, the single-port SRAM has one word line WL that switches ON/OFF of the positive-phase access transistor QNA5 and the negative-phase access transistor QNA6, and has the positive-phase bit line BL or the negative-phase bit line /BL as bit lines, respectively, to access the positive-phase access transistor QNA5 or the negative-phase access transistor QNA6. As described above, the memory cell MC3 in the third embodiment differs from the memory cell MC1 in that the number of access transistors to access the complementary inverters INV1, INV2 configuring the flip-flop is two and other parts of the circuit configuration are the same as those of the memory cell MC1 in the first embodiment.

The above-mentioned configuration is explained as an element configuration over the silicon substrate 1 using FIG. 28 to FIG. 30.

In the memory cell MC3 in the third embodiment, the positive-phase access transistor QNA5 is disposed in the first p well PW1 and the negative-phase access transistor QNA6 is disposed in the third p well PW3. The gate G3 of the positive-phase access transistor QNA5 is electrically coupled to the word line WL, which is a third metal wire 8F in the third wiring layer M3, via the contact plug 3, a first metal wire 4R in the first wiring layer M1, the first via plug 5, a second metal wire 6Q in the second wiring layer M2, and the second via plug 7. The gate G4 of the negative-phase access transistor QNA6 is electrically coupled to the word line WL, which is the third metal wire 8F in the third wiring layer M3, via the contact plug 3, a first metal wire 4S in the first wiring layer M1, the first via plug 5, a second metal wire 6R in the second wiring layer M2, and the second via plug 7. As described above, the gates G3, G4 of both the access transistors QNA5, QNA6 are electrically coupled to the same word line WL.

The configuration over the silicon substrate 1 of the memory cell MC3 in the third embodiment is the same as the configuration of the memory cell MC1 in the first embodiment except for the contents described above. That is, in the memory cell MC3 in the third embodiment also, the access transistors QNA5, QNA6 and the driver transistors QND1, QND2 that share the same storage nodes E1, E2 are arranged in the different p wells PW1, PW2 and PW3. More specifically, the positive-phase access transistor QNA5 and the first driver transistor QND1 that share the first storage node E1 are arranged respectively in different p wells separated by the first n well NW1, such as the first p well PW1 and the second p well PW2. The negative-phase access transistor QNA6 and the second driver transistor QND2 that share the second storage node E2 are arranged respectively in different p wells separated by the second n well NW2, such as the third p well PW3 and the second p well PW2. Due to this, in the memory cell MC3 in the third embodiment also, it is possible to obtain the same effect as that explained using FIG. 9 in the first embodiment. That is, it is possible to make it hard to cause the soft error (multi-bit error in the row direction) that occurs at the same time in the memory cells neighboring in the row direction. As a result, it is possible to improve reliability of a semiconductor device by applying the SRAM in the third embodiment.

Figure 32:
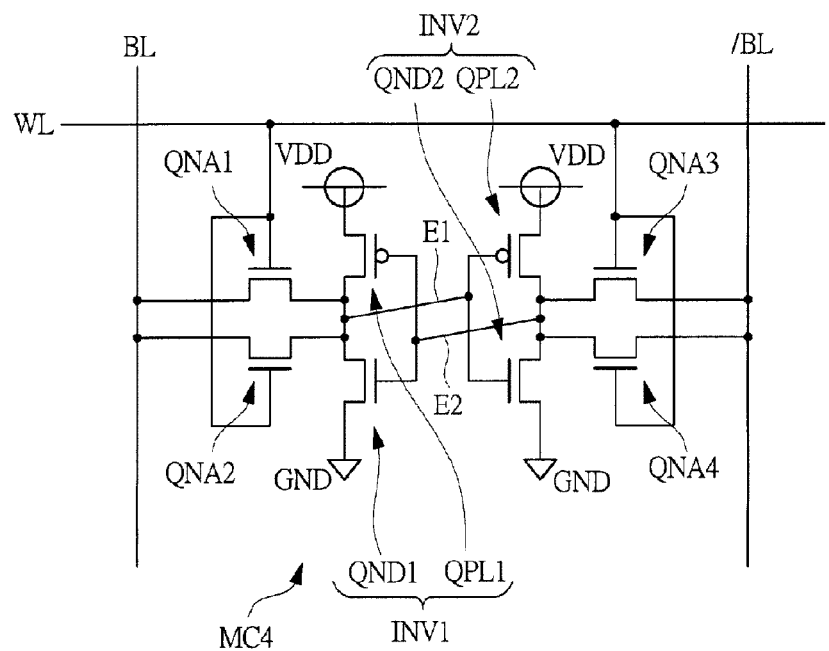
FIG. 32 is a circuit diagram showing one memory cell in another SRAM of the semiconductor device, which is the third embodiment of the present invention.
Figure 33:
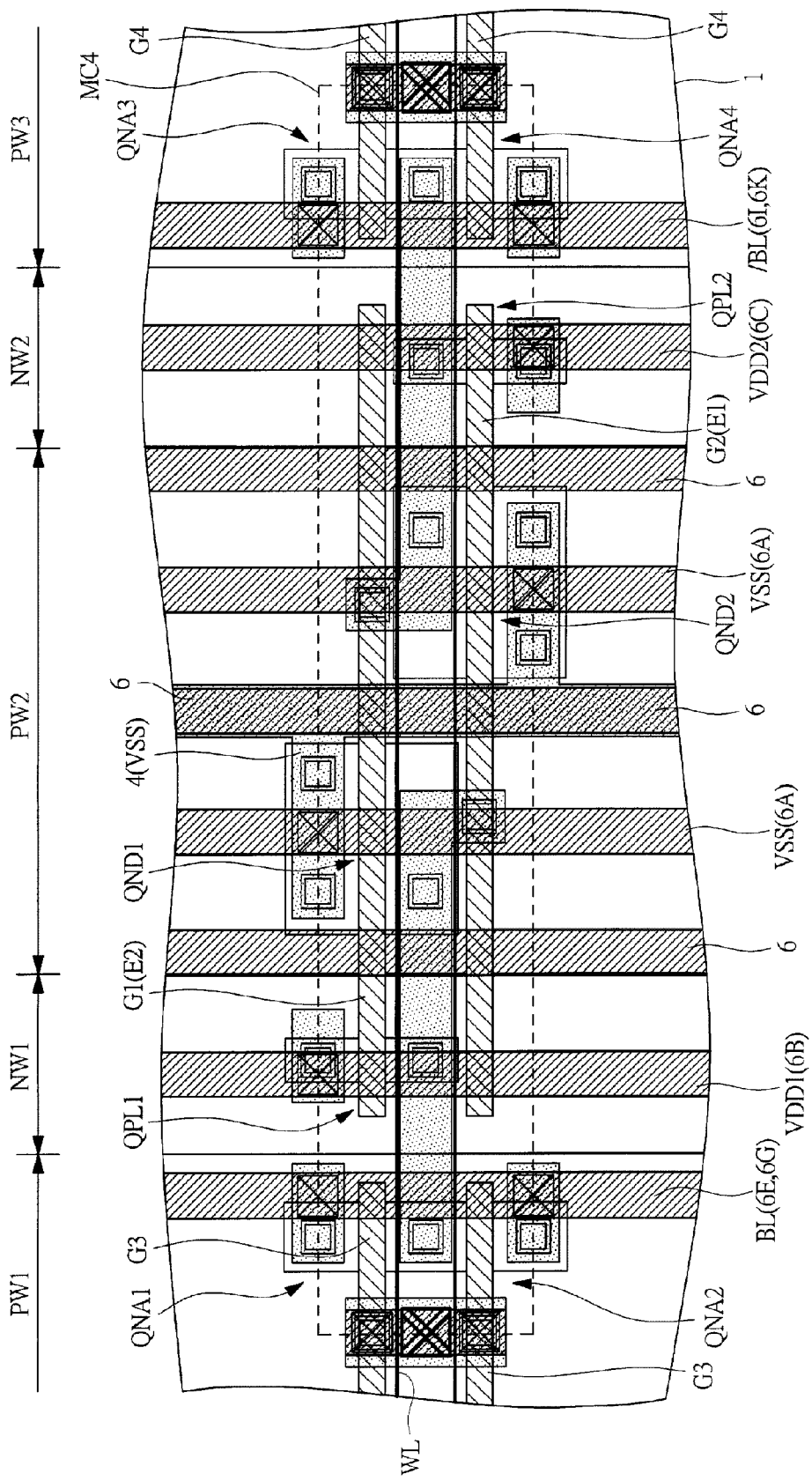
FIG. 33 is a plan view of relevant parts showing one memory cell in another SRAM of the semiconductor device, which is the third embodiment of the present invention.
Figure 34:
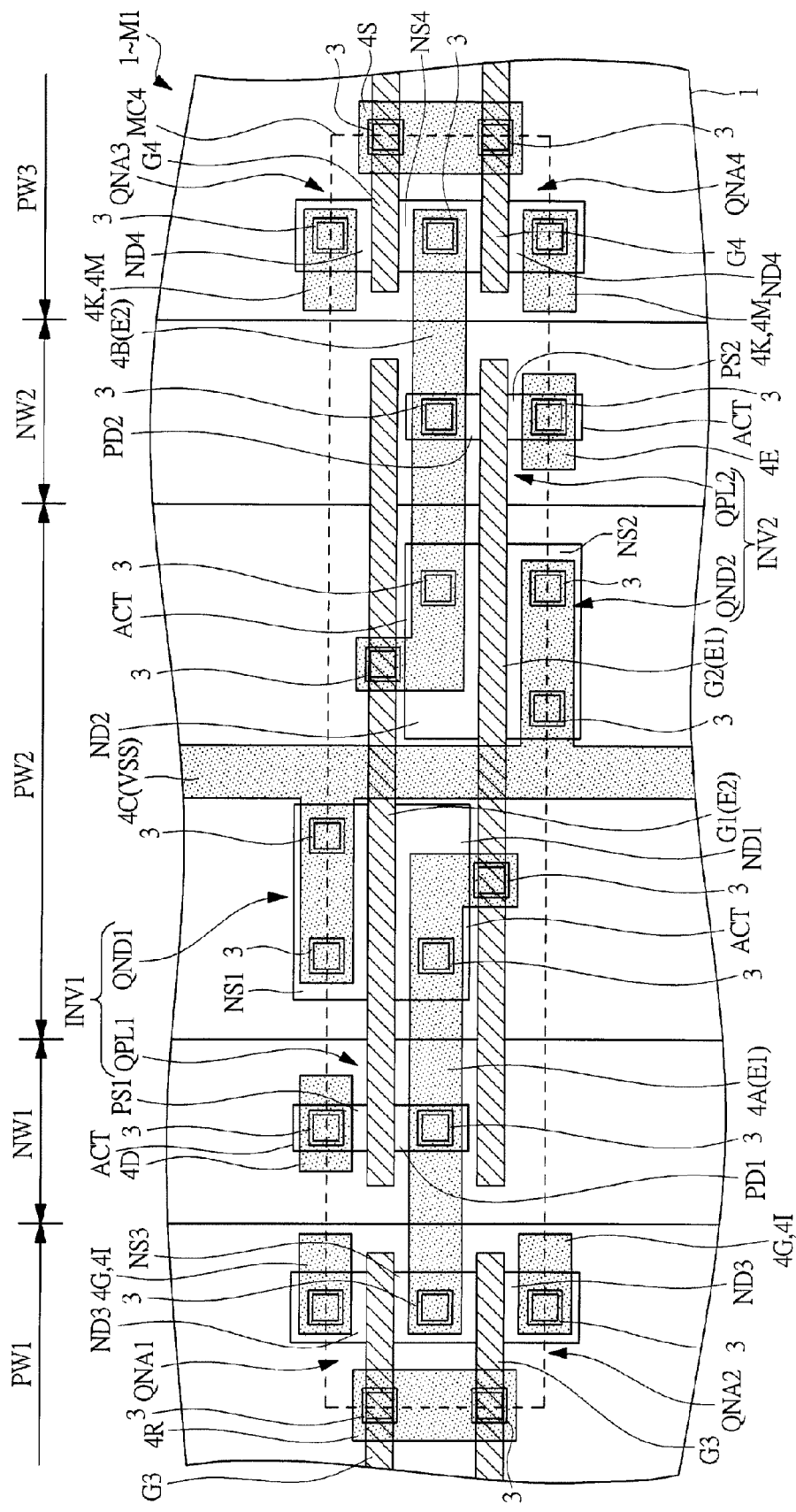
FIG. 34 is a plan view of relevant parts showing part of the plan view of relevant parts in FIG. 33.
Figure 35:
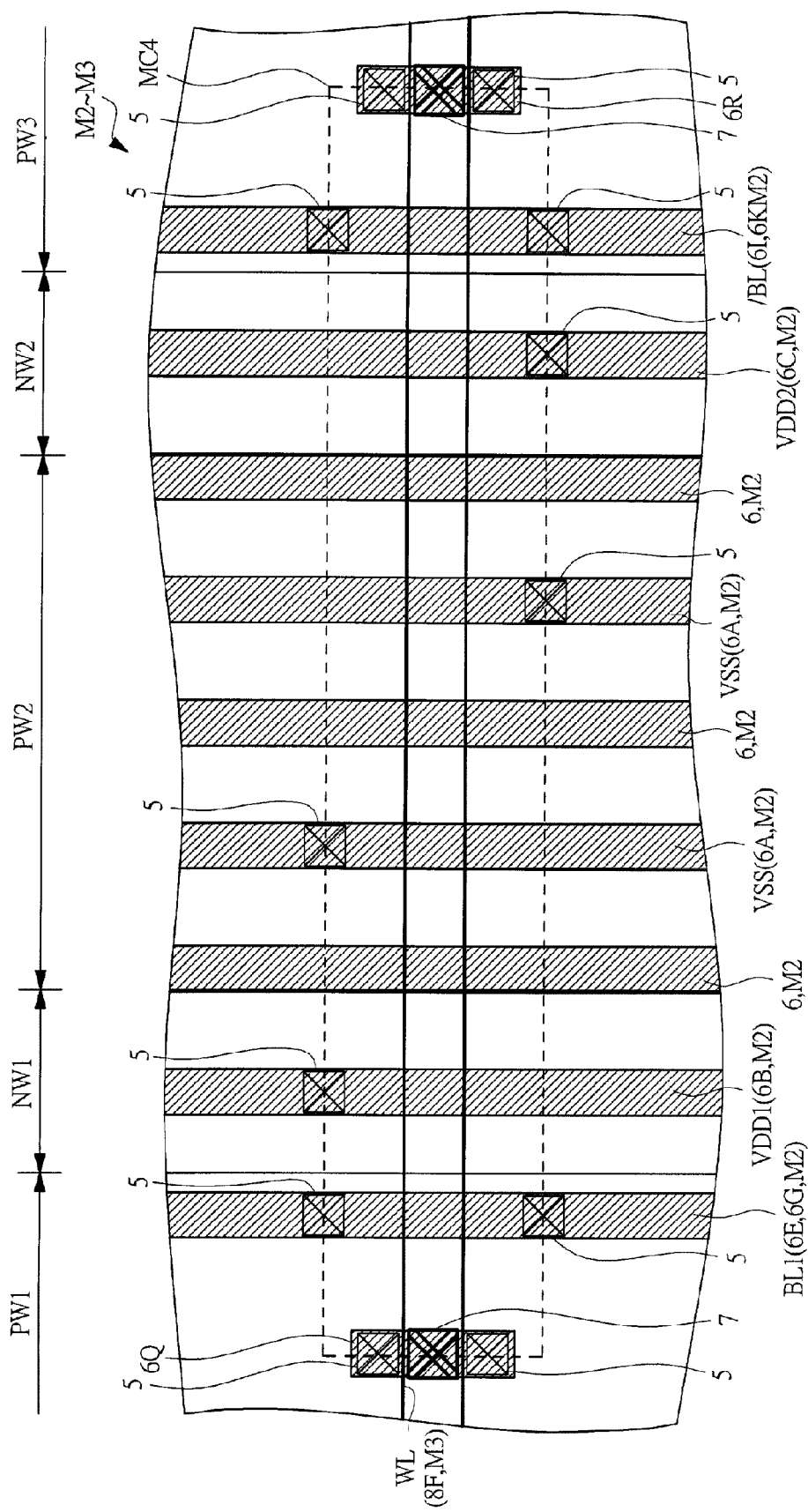
FIG. 35 is a plan view of relevant parts showing part of the plan view of relevant parts in FIG. 33.
Figure 36:
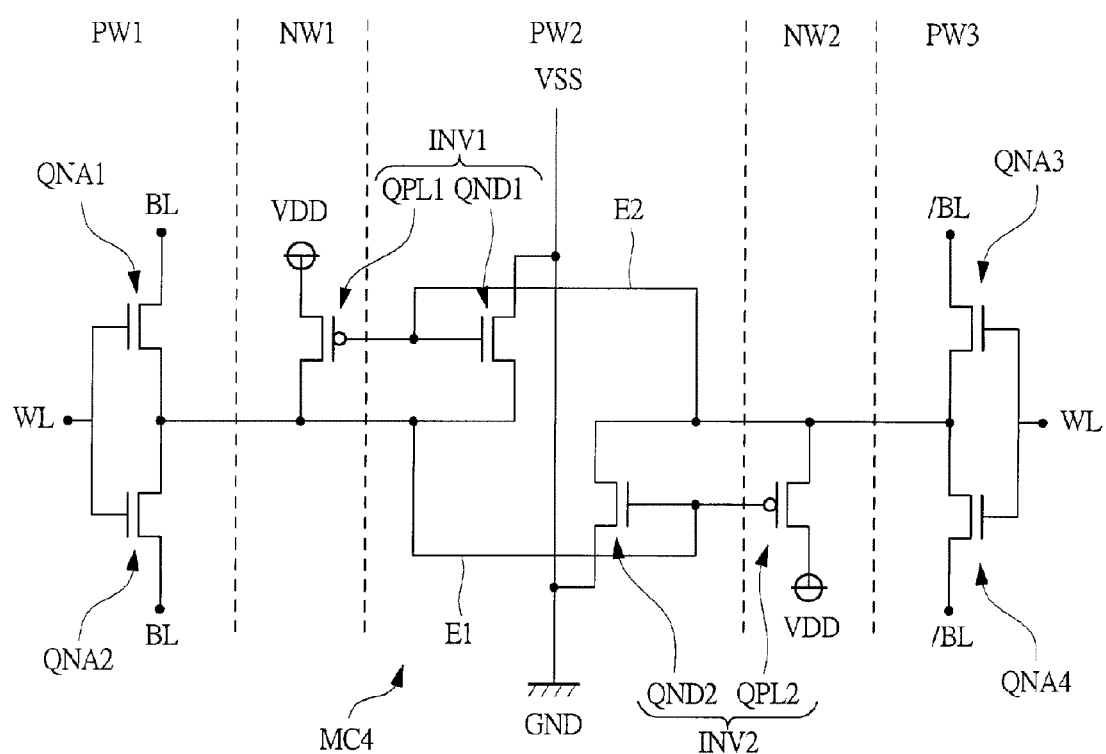
FIG. 36 is an equivalent circuit diagram of another memory cell in the third embodiment of the present invention, an equivalent circuit diagram corresponding to the circuit diagram in FIG. 32.

A modified example of the single-port SRAM in the third embodiment explained using FIG. 27 to FIG. 31 is explained using FIG. 32 to FIG. 36. FIG. 32 shows a circuit diagram of one memory cell (static memory cell) MC4 of another single-port SRAM in the third embodiment. FIG. 33 shows a plan view of relevant parts of the memory cell MC4 in the third embodiment. FIG. 34 shows a plan view of relevant parts representing from the silicon substrate 1 to the first wiring layer M1 of the plan view of relevant parts in FIG. 33. FIG. 35 shows a plan view of relevant parts representing from the second wiring layer M2 to the third wiring layer M3 of the plan view of relevant parts in FIG. 33. FIG. 36 corresponds to the circuit diagram in FIG. 32, particularly showing an equivalent circuit diagram in which each element and wire are rearranged according to an actual layout. With reference to FIG. 32 to FIG. 36, a modified example of the single-port SRAM of a semiconductor device in the third embodiment is explained.

The memory cell MC4 to be explained here is a single-port SRAM having two pairs of complementary pair of access transistors. That is, the memory cell MC4 has the first positive-phase access transistor QNA1 and the first negative-phase access transistor QNA3, and the second positive-phase access transistor QNA2 and the second negative-phase access transistor QNA4. The possession of the two pairs of complementary pair of access transistors as described above is the same as that in the memory cell MC1 in the first embodiment. However, the memory cell MC4 in the third embodiment is a cell configuring a single-port SRAM and the gate G3 of the pair of the positive-phase access transistors QNA1, QNA2 and the gate G4 of the pair of the negative-phase access transistors QNA3, QNA4 are electrically coupled to the same word line WL. Further, the pair of the positive-phase access transistors QNA1, QNA2 is electrically coupled to the same positive-phase bit line BL and the pair of the negative-phase access transistors QNA3, QNA4 is electrically coupled to the same negative-phase bit line /BL. As described above, the fact that one word line WL is used to turn ON/OFF the access transistor and the pair of the complementary bit lines BL, /BL is used to access the access transistor is the same as that in the memory cell MC3 described above. In other words, the structure of the memory cell MC4 is such one in which two MIS transistors are used in parallel as a positive-phase access transistor and two MIS transistors are used in parallel as a negative-phase access transistor in the memory cell MC3 described above.

The configuration over the silicon substrate 1 is the same as that of the memory cell MC3 explained using FIG. 27 to FIG. 31 except in that the two positive-phase access transistors QNA1, QNA2 are disposed in the first p well PW1 and the two negative-phase access transistors QNA3, QNA4 are disposed in the third p well PW3. That is, in the memory cell MC4 also, the access transistors QNA1, QNA2, QNA3 and QNA4 and the driver transistors QND1, QND2 that share the same storage nodes E1, E2 are disposed in different p wells. More specifically, the positive-phase access transistors QNA1, QNA2 and the first driver transistor QND1 that share the first storage node E1 are arranged in different p wells separated by the first n well NW1, such as the first p well PW1 and the second p well PW2. The negative-phase access transistors QNA3, QNA4 and the second driver transistor QND2 that share the second storage node E2 are arranged in different p wells separated by the second n well NW2, such as the third p well PW3 and the second p well PW2. Due to this, in the memory cell MC4, it is also possible to obtain the same effect as that of the memory cell MC3 described above. That is, it is possible to make it hard to cause the soft error (multi-bit error in the row direction) that occurs at the same time in memory cells neighboring in the row direction. As a result, by applying the SRAM in the third embodiment, it is possible to improve the reliability of the semiconductor device.

Fourth Embodiment

Figure 37:
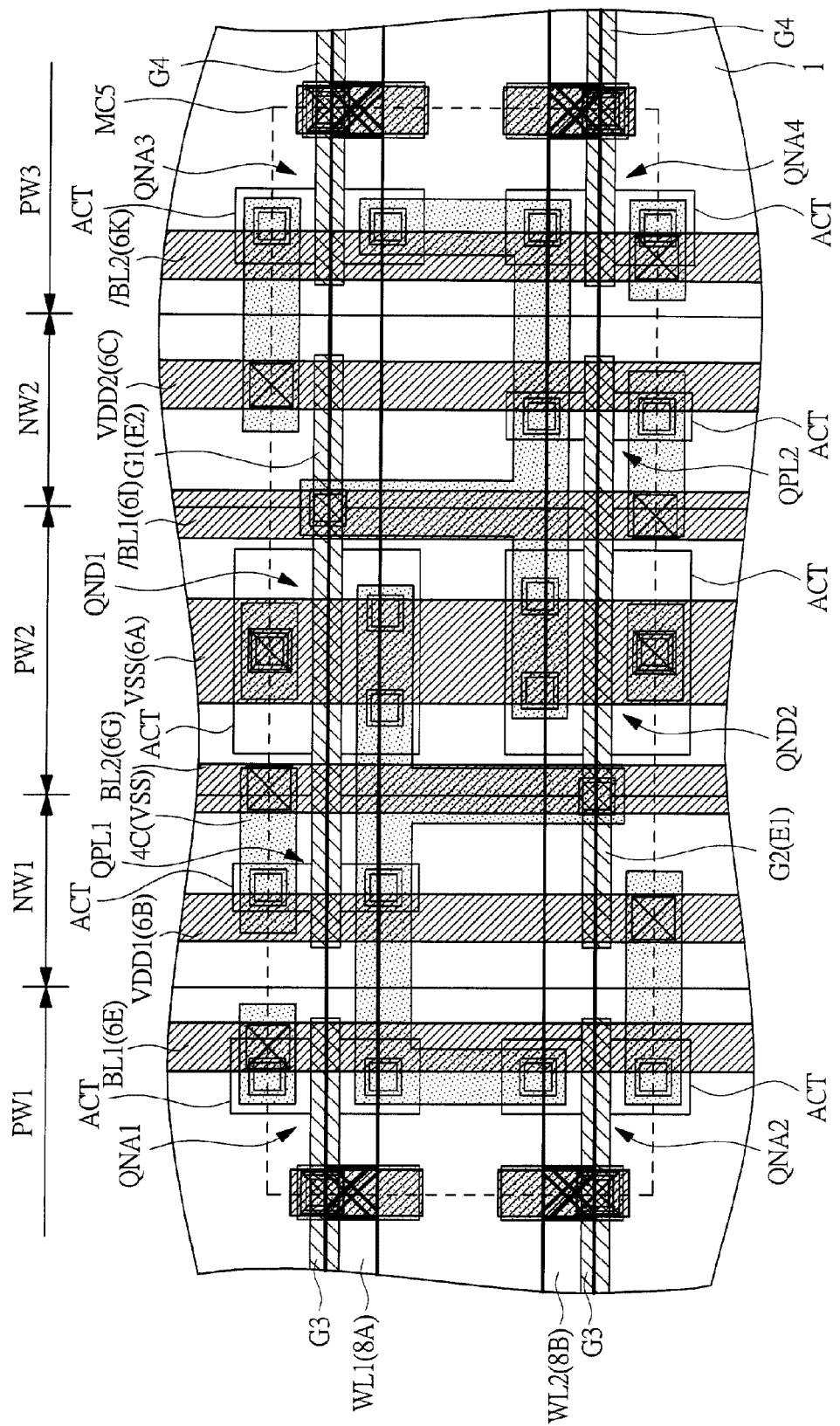
FIG. 37 is a plan view of relevant parts showing one memory cell in an SRAM of a semiconductor device, which is a fourth embodiment of the present invention.
Figure 38:
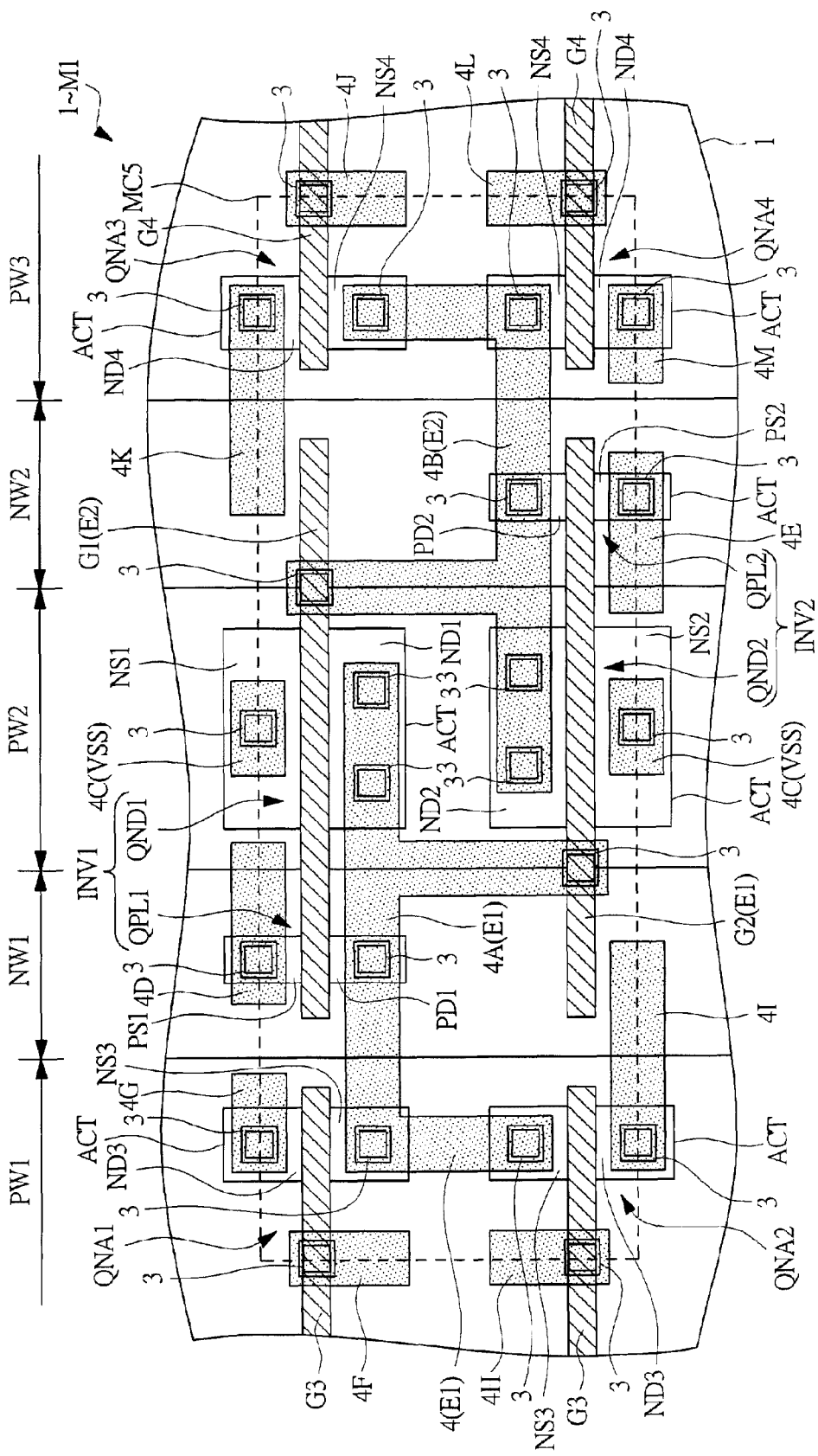
FIG. 38 is a plan view of relevant parts showing part of the plan view of relevant parts in FIG. 37.
Figure 39:
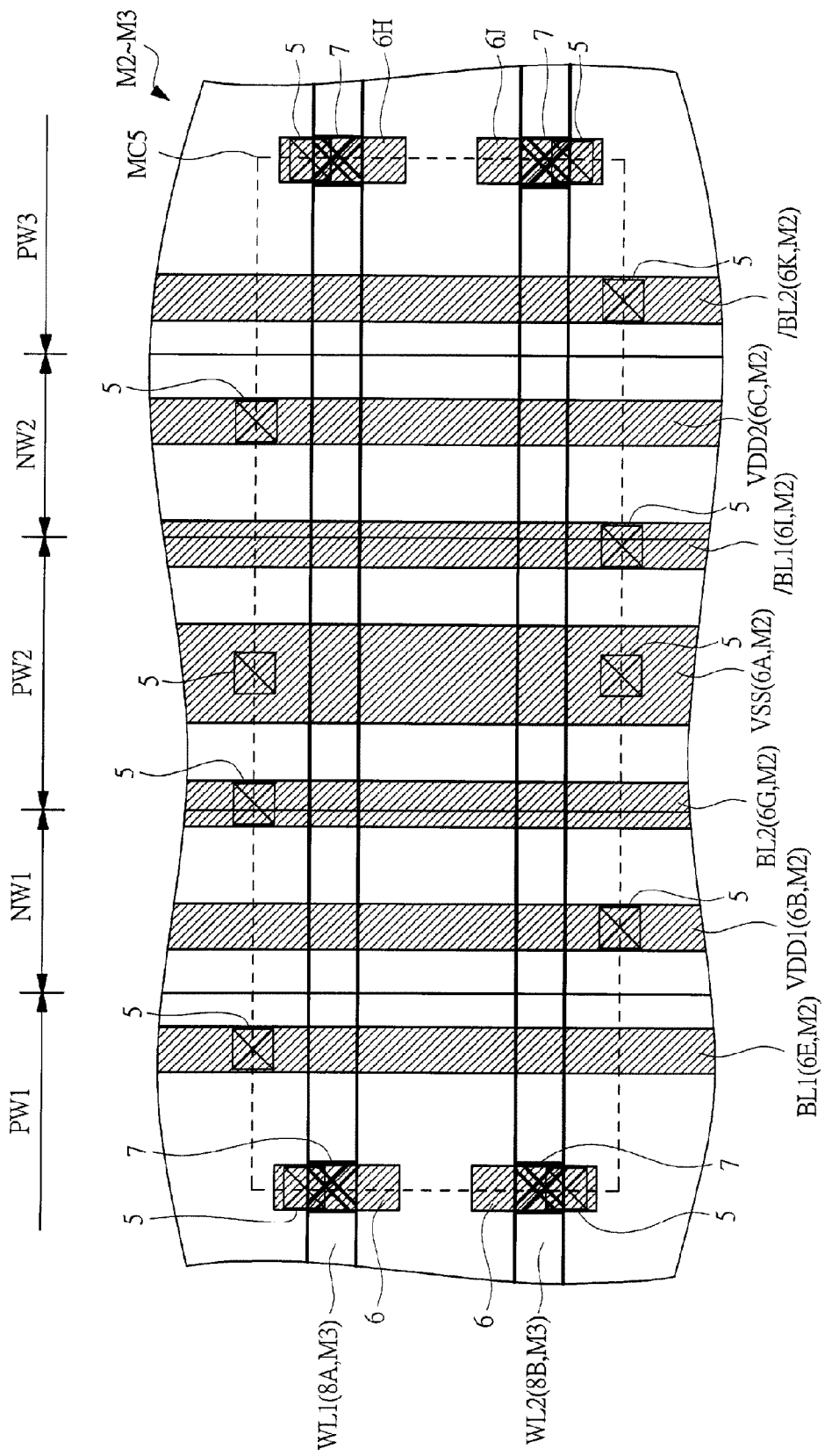
FIG. 39 is a plan view of relevant parts showing part of the plan view of relevant parts in FIG. 37.

FIG. 37 shows a plan view of relevant parts of one memory cell (static memory cell) MC5 in a dual-port SRAM in a fourth embodiment. FIG. 38 shows a plan view of relevant parts representing from the silicon substrate 1 to the first wiring layer M1 of the plan view of relevant parts in FIG. 37. FIG. 39 shows a plan view of relevant parts representing from the second wiring layer M2 to the third wiring layer M3 of the plan view of relevant parts in FIG. 37. With reference to FIG. 37 to FIG. 39, the dual-port SRAM of a semiconductor device in the fourth embodiment is explained.

In the dual-port SRAM of the semiconductor device in the fourth embodiment, the circuit configuration itself of one memory cell MC5 is the same as that of the memory cells MC1, MC2 in the first and second embodiments. The memory cell MC5 in the fourth embodiment differs from, for example, the memory cell MC1 in the first embodiment in the following points of the layout of elements arranged over the silicon substrate 1. That is, as shown in FIG. 38, in the memory cell MC5 in the fourth embodiment, the active region ACT in which the first driver transistor QND1 is disposed and the active region ACT in which the second driver transistor QND2 is disposed are arranged side by side along the column direction in the second p well PW2. In other words, the active regions ACT in which the driver transistors QND1, QND2 are disposed, respectively, are arranged in the second p well PW2 so that the distance from the first n well NW1 does not differ from the distance from the second n well NW2. In further other words, the active region AT in which the first driver transistor QND1 is disposed and the active region ACT in which the second driver transistor QND2 is disposed are arranged side by side along the column direction and so that there are no regions that overlap each other when viewed from the section in the row direction.

With such a structure, it is possible to reduce the dimension in the row direction of the second p well PW2 at the center of the respective wells NW1, NW2, PW1, PW2 and PW3 configuring the memory cell MC5 in the fourth embodiment. More specific explanation is given below. In the two active regions ACT, the larger the regions that overlap when viewed from the section in the column direction, the smaller the magnitude of the spread in the row direction. Consequently, it is possible to make small the well that forms the active region ACT accordingly. Here, by arranging the two active regions ACT in the second well PW2 side by side along the column direction, that is, by arranging both the active regions ACT so that both overlap when viewed from the section in the column direction, the spread when viewed in the row direction can be reduced. With this arrangement, it is possible to reduce the dimension in the row direction of the second p well PW2 in which the active regions ACT of the driver transistors QND1, QND2 are disposed. Usually, the dimensions of both the active regions ACT are made the same in view of the symmetry of both the driver transistors QND1, QND2. At this time, when the two active regions ACT are arranged so as to overlap completely when viewed from the section in the column direction, the spread in the row direction is minimized and the dimension in the row direction of the second p well PW2 can be minimized.

On the other hand, with the structure of the memory cell MC5 in the fourth embodiment, it is difficult to put the two active regions ACT in the second p well PW2 closer to each other in the column direction, and therefore, it is difficult to reduce the dimension of the cell in the column direction. From this viewpoint, as a structure to reduce the dimension in the column direction, the memory cells MC1, MC2 explained in the first and second embodiments are preferable.

FIG. 37 to FIG. 39 show a structure in which the first positive-phase access transistor QNA1 and the second positive-phase access transistor QNA2 are formed in the different active regions ACT in the first p well PW1. Similarly, FIG. 37 to FIG. 39 show a structure in which the first negative-phase access transistor QNA3 and the second negative-phase access transistor QNA4 are formed in the different active regions ACT in the third p well PW3.

Figure 40:
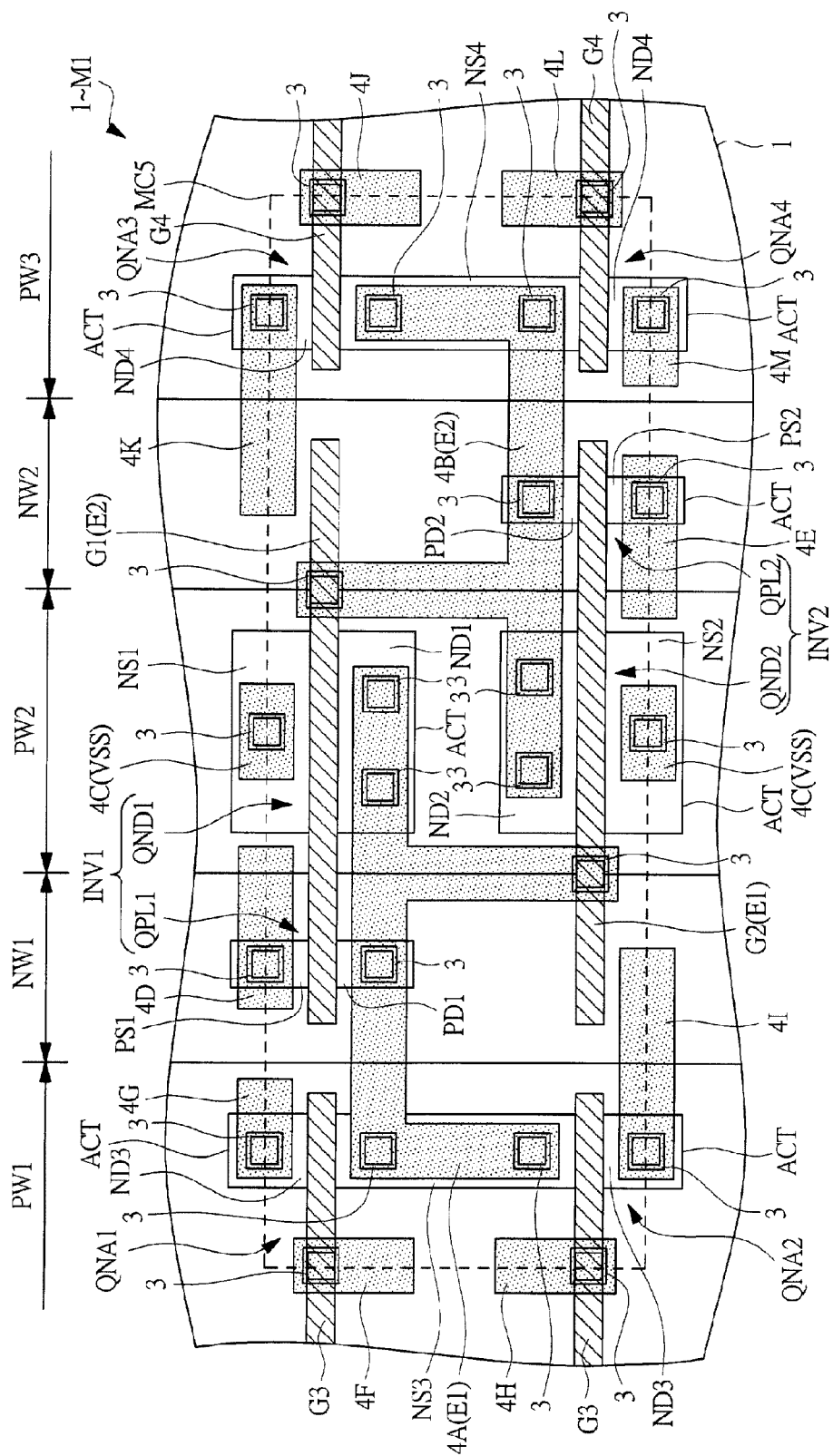
FIG. 40 is a plan view of relevant parts showing one memory cell in another SRAM of the semiconductor device, which is the fourth embodiment of the present invention.

In contrast to this, as shown in FIG. 40, it may also be possible to dispose both the positive-phase access transistors QNA1, QNA2 in the same active region ACT in the first p well PW1 and dispose both the negative-phase access transistors QNA3, QNA4 in the same active region ACT in the third p well PW3. In order to do so, the active regions ACT in the first and third p wells PW1, PW3 are formed into a shape that extends along the column direction. More specifically, such a structure may be accepted, in which the first positive-phase access transistor QNA1 and the second positive-phase access transistor QNA2 are disposed in the same active region ACT that extends in the column direction in the first p well PW1. Similarly, such a structure may be accepted, in which the first negative-phase access transistor QNA3 and the second negative-phase access transistor QNA4 are disposed in the same active region ACT that extends in the column direction in the second p well PW2. In such a structure, the active region ACT in the first p well PW1 and the active region ACT in the third p well PW3 extend continuously in the column direction, and therefore, the pattern shape becomes rectilinear and variations can be reduced. Further, it is possible to couple the two contact plugs 3 to the n-type source diffusion layer NS3 in the first p well PW1 and the n-type source diffusion layer NS4 in the third p well PW3, and yields can be improved.

Figure 41:
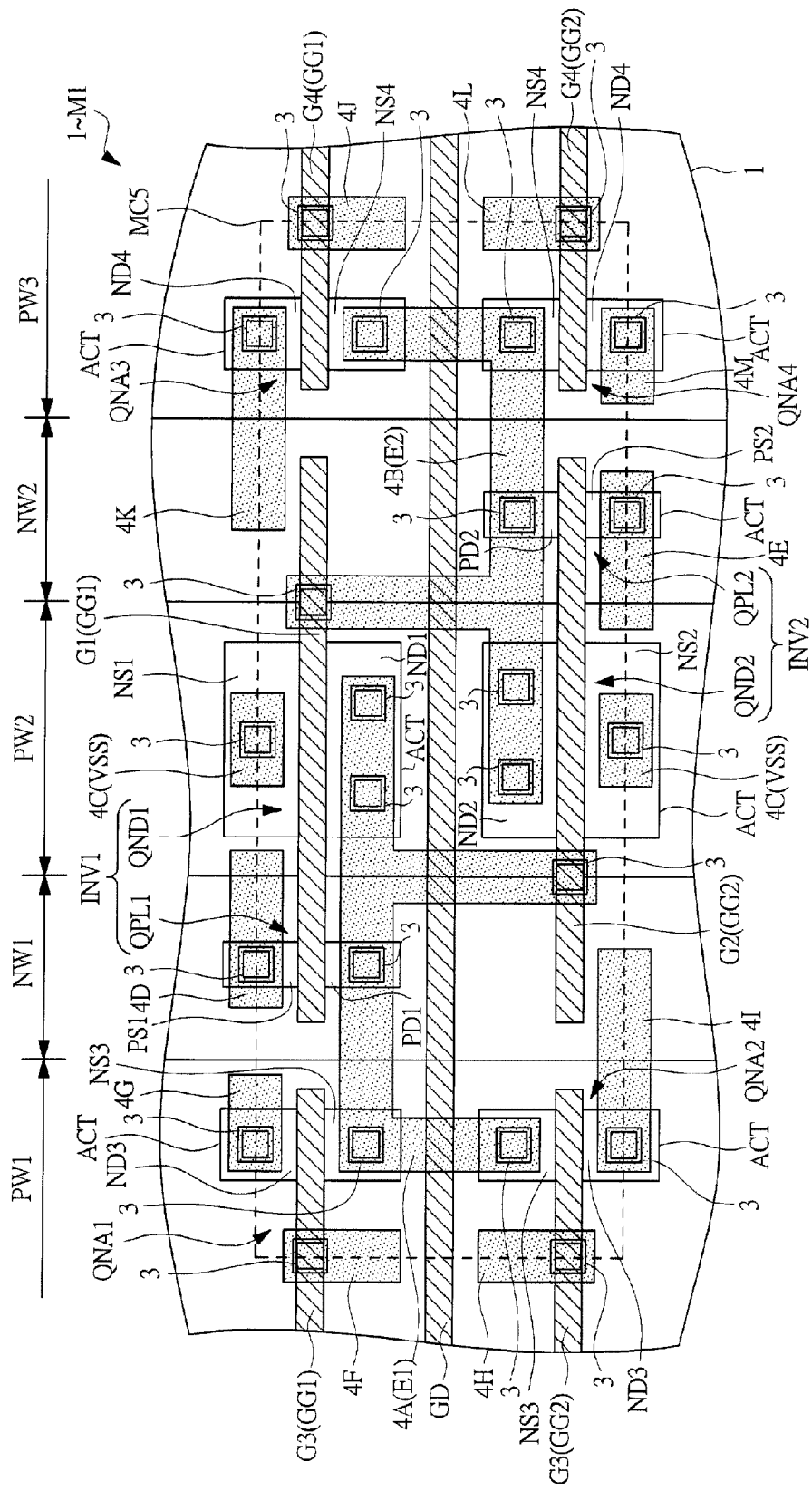
FIG. 41 is a plan view of relevant parts showing one memory cell in still another SRAM of the semiconductor device, which is the fourth embodiment of the present invention.

Further, in the memory cell MC5 in the fourth embodiment, it may also be possible to dispose a dummy gate GD so as to extend along the row direction as shown in FIG. 41. More detailed explanation will be given below.

The memory cell MC5 in the fourth embodiment has a structure in which the cell dimension in the row direction can be reduced by arranging the two active regions ACT to be disposed in the second p well PW2 side by side along the column direction. On the other hand, when viewed in the column direction, the cell dimension is greater, for example, compared to that of the memory cell MC1 in the first embodiment. Hence, FIG. 41 shows a structure in which the dummy gate GD is disposed in a space made by the structure extending in the column direction.

In the memory cells MC1 to MC4 in the first to third embodiments as well as the memory cell MC5 in the fourth embodiment, the gates G1, G2, G3 and G4 configuring one cell are configured by two gate groups extending along the row direction. For example, in the memory cell MC5 in the fourth embodiment, the gate G3 of the first positive-phase access transistor QNA1, the gate 1 of the first inverter INV1 (the first driver transistor QND1 and the first load transistor QPL1), and the gate G4 of the first negative-phase access transistor are arranged extending along the same row direction. Here, these are referred to as a first gate group GG1 (refer to FIG. 41). Further, the gate G3 of the second positive-phase access transistor QNA2, the gate 2 of the second inverter INV2 (the second driver transistor QND2 and the second load transistor QPL2), and the gate G4 of the second negative-phase access transistor are arranged extending along the same row direction. Here, these are referred to as a second gate group GG2 (refer to FIG. 41).

Then, in the memory cell MC5 in the fourth embodiment, as shown in FIG. 41, between the first gate group GG1 and the second gate group GG2 extending respectively along the row direction, the dummy gate GD extending similarly along the row direction is disposed. The dummy gate GD is arranged so that the distance from the first gate GG1 and the distance from the second gate group GG2 are equal. In other words, the dummy gate GD is arranged in a position equidistant from both the first gate group GG1 and the second gate group GG2. The dummy gate GD is not a component that configures the memory cell MC5 and not electrically coupled to any other components. By arranging the dummy gate GD in this manner, it is possible to arrange the gates at an equal pitch in the column direction and the lithography precision in the gate machining/forming process can be improved. As a result, it is possible to reduce variations in dimensions of the gate length.

The configuration over the silicon substrate 1 of the memory cell MC5 in the fourth embodiment is the same as the configuration of the memory cell MC1 in the first embodiment except for the contents described above. That is, in the memory cell MC5 in the fourth embodiment also, the access transistors QNA1, QNA2, QNA3 and QNA4 and the driver transistors QND1, QND2 that share the same storage nodes E1, E2 are disposed in different p wells. More specifically, the positive-phase access transistors QNA1, QNA2 and the first driver transistor QND1 that share the first storage node E1 are disposed respectively in different p wells separated by the first n well NW1, such as the first p well PW1 and the second p well PW2. The negative-phase access transistors QNA3, QNA4 and the second driver transistor QND2 that share the second storage node E2 are disposed respectively in different p wells separated by the second n well NW2, such as the third p well PW3 and the second p well PW2. With this arrangement, in the memory cell MC5 in the fourth embodiment also, it is possible to obtain the same effect as that explained using FIG. 9 in the first embodiment. That is, it is possible to make it hard to cause the soft error (multi-bit error in the row direction) that occurs at the same time in the memory cells neighboring in the row direction. As a result, it is possible to improve reliability of a semiconductor device by applying the SRAM in the fourth embodiment.

Fifth Embodiment

Figure 42:
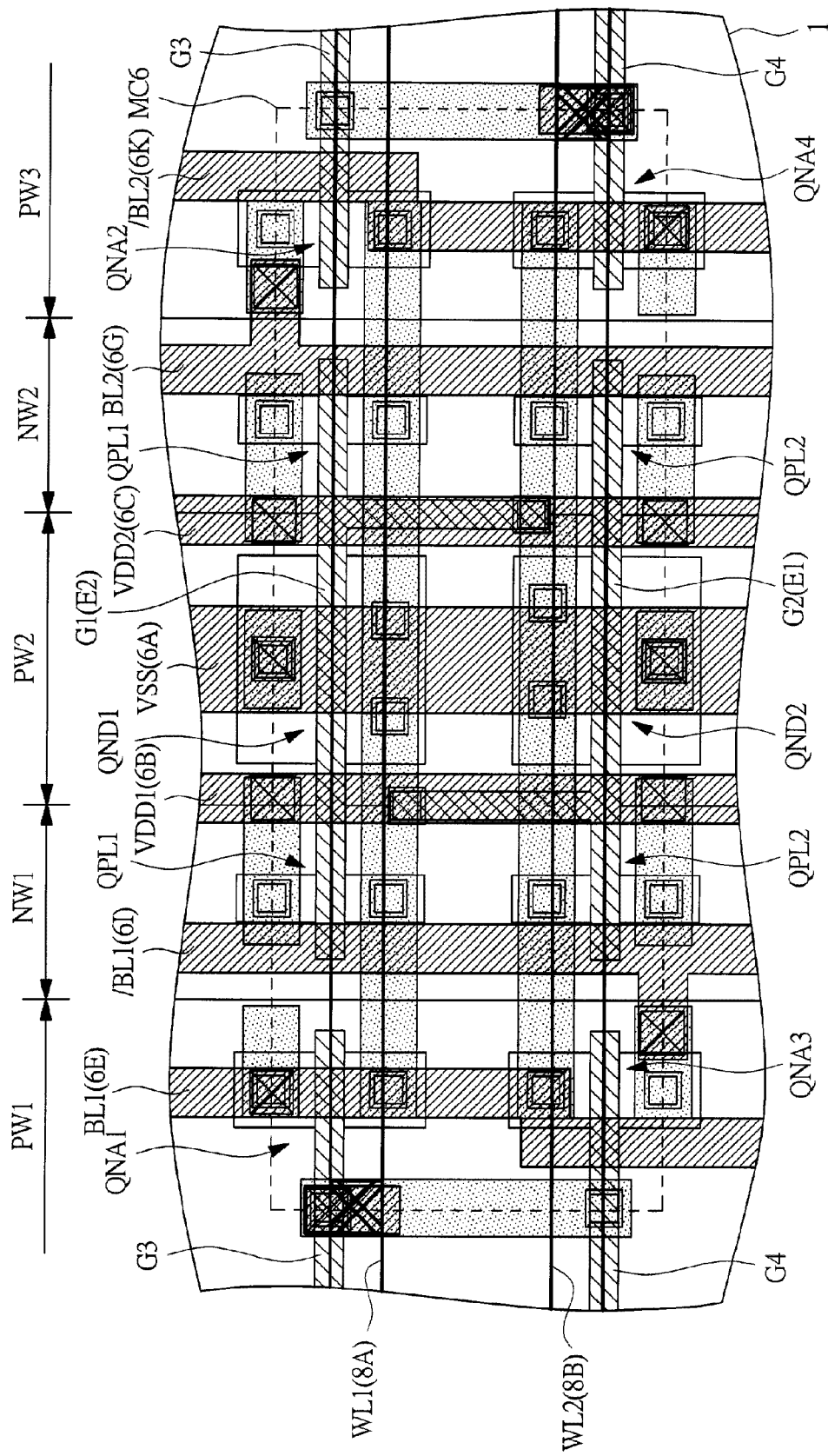
FIG. 42 is a plan view of relevant parts showing one memory cell in an SRAM of a semiconductor device, which is a fifth embodiment of the present invention.
Figure 43:
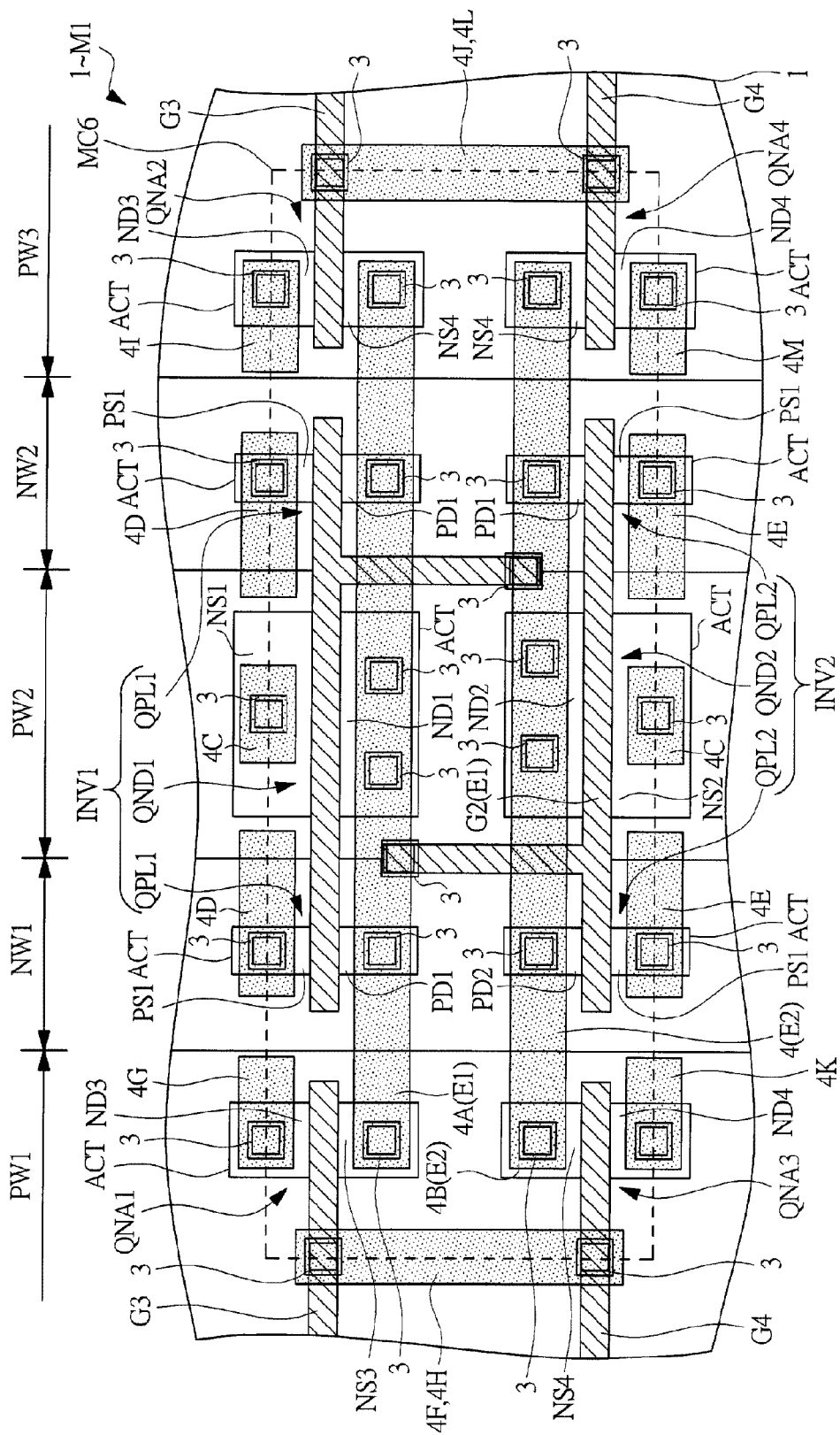
FIG. 43 is a plan view of relevant parts showing part of the plan view of relevant parts in FIG. 42.
Figure 44:
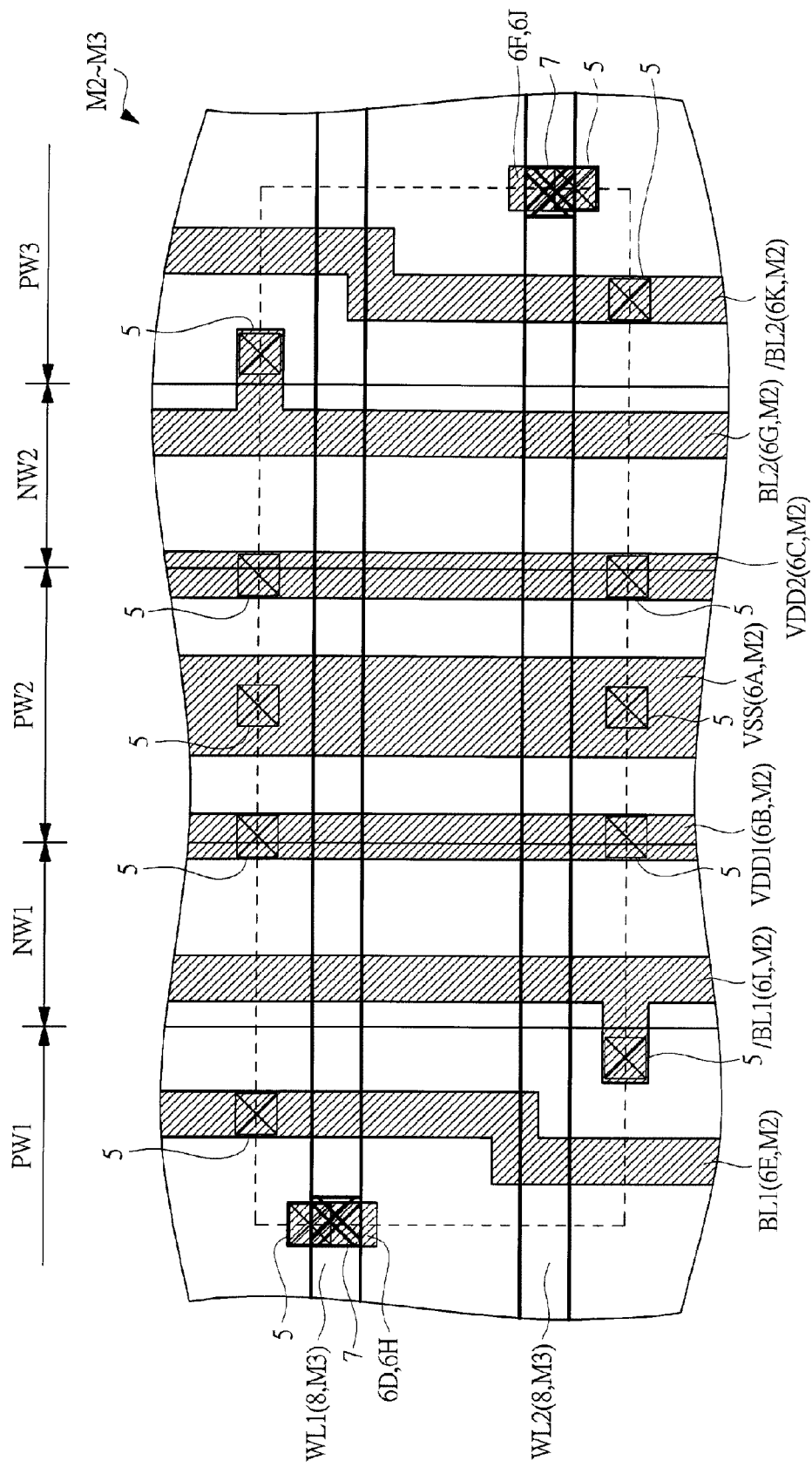
FIG. 44 is a plan view of relevant parts showing part of the plan view of relevant parts in FIG. 42.
Figure 45:
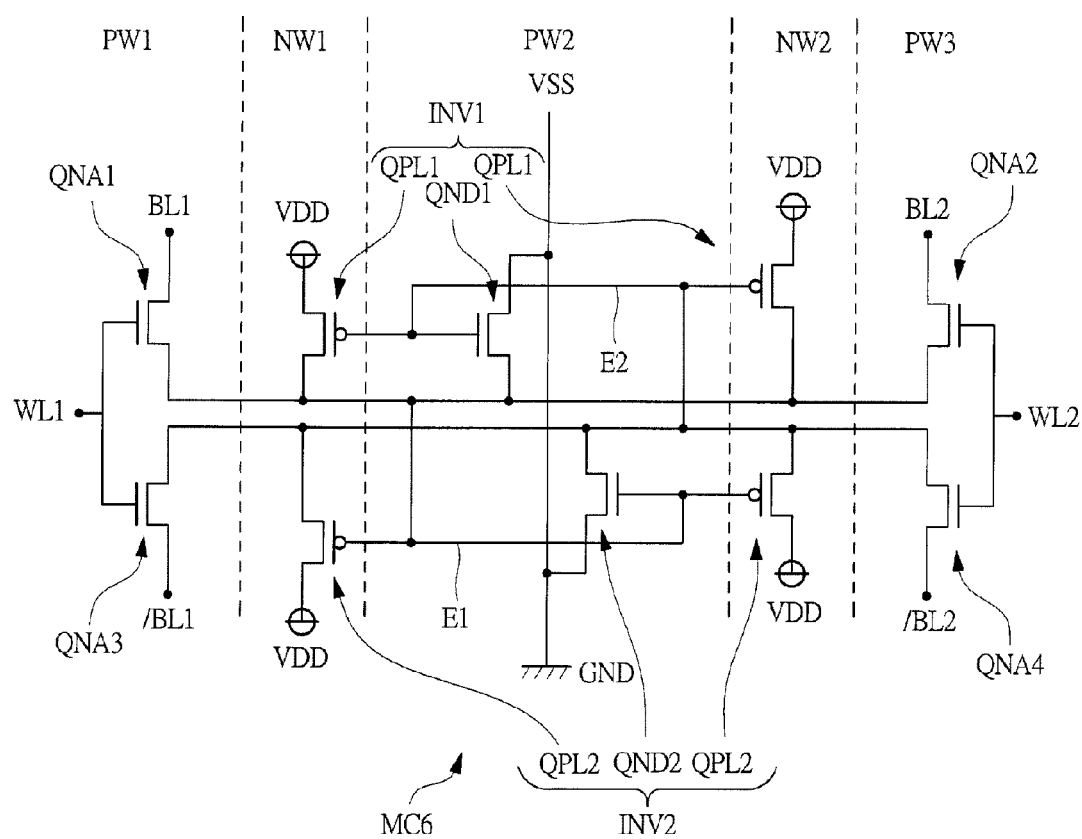
FIG. 45 is an equivalent circuit diagram of the memory cell in the fifth embodiment of the present invention.
Figure 46A:
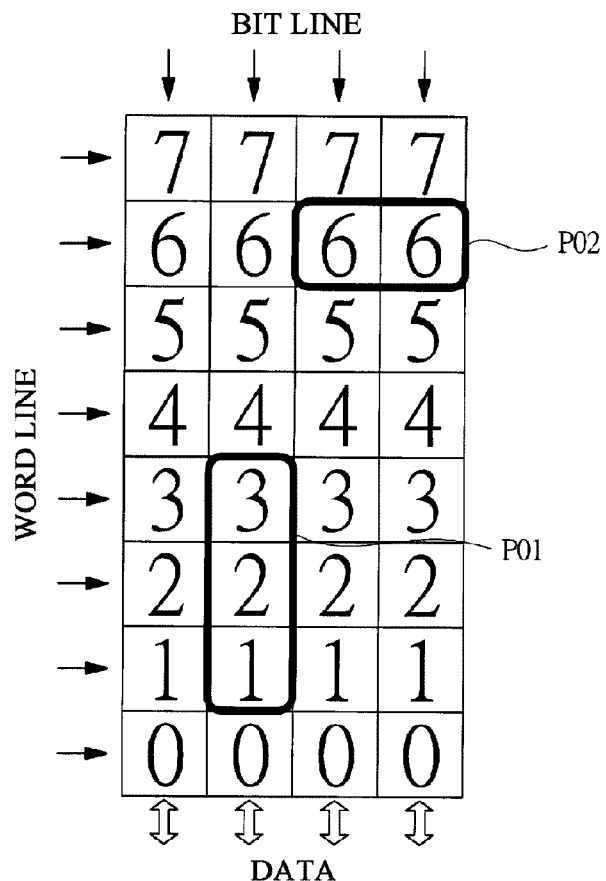
Figure 46B:
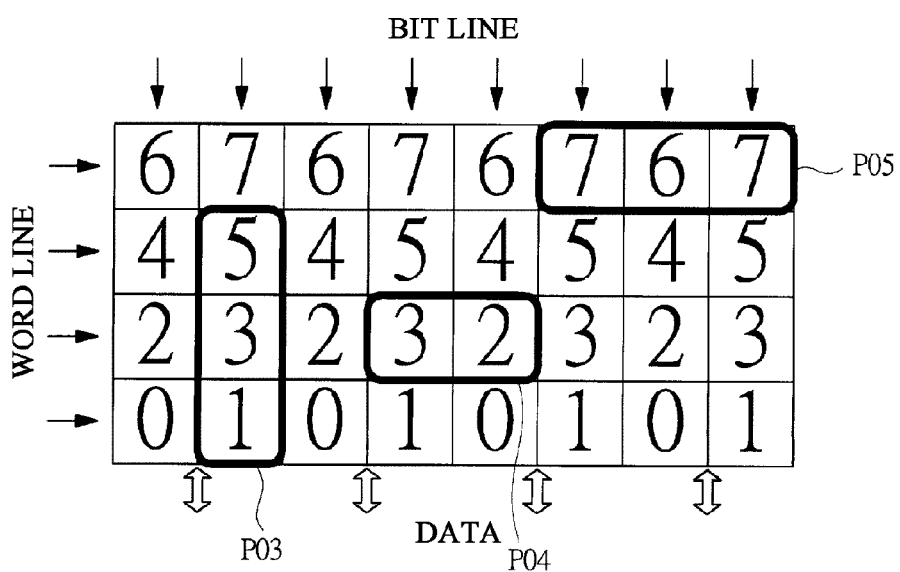

FIG. 42 shows a plan view of relevant parts of one memory cell (static memory cell) MC6 in a dual-port SRAM in a fifth embodiment. FIG. 43 shows a plan view of relevant parts representing from the silicon substrate 1 to the first wiring layer M1 of the plan view of relevant parts in FIG. 42. FIG. 44 shows a plan view of relevant parts representing from the second wiring layer M2 to the third wiring layer M3 of the plan view of relevant parts in FIG. 42. FIG. 45 shows an equivalent circuit diagram in which each element and wire are arranged according to an actual layout in the memory cell MC6 in the fifth embodiment. With reference to FIG. 42 to FIG. 45, the dual-port SRAM of a semiconductor device in the fifth embodiment is explained.

In the dual-port SRAM of the semiconductor device in the fifth embodiment, the circuit configuration itself of one memory cell MC6 is the same as that of the memory cells MC1, MC2 and MC5 in the first, second and fourth embodiments. The different points are as follows in the configuration of elements arranged over the silicon substrate 1.

As shown in FIG. 42 and FIG. 43, in the memory cell MC6 in the fifth embodiment, in the first p well PW1, the first positive-phase access transistor QNA1 and the first negative-phase access transistor QNA3 are disposed and in the third p well PW3, the second positive-phase access transistor QNA2 and the second negative-phase access transistor QNA4 are disposed. In other words, in the same p well, the access transistors to be coupled to the two storage nodes E1, E2 complementary to each other are disposed. With this arrangement, even if excessive charges are generated in, for example, the first p well PW1, by the alpha ray or the neutron beam, the amount of charges collected in the n-type source diffusion layer NS3 of the first positive-phase access transistor QNA1 is substantially the same as that collected in the n-type source diffusion layer NS4 of the first negative-phase access transistor QNA3. Consequently, such a state becomes hard to occur, where only one of the first storage node E1 and the second storage node E2 is reversed. Because of this common mode noise effect, the soft error can be reduced. This is also effective in the third p well PW3. Then, the first p well PW1 and the third p well PW3 are those shared by the memory cells MC6 neighboring in the row direction, and therefore, it is possible to reduce the multi-bit error due to the structure in which the soft error resulting from the p well region can be reduced. As a result, by applying the SRAM in the fifth embodiment, it is possible to improve the reliability of the semiconductor device.

Further, in the memory cell MC6 in the fifth embodiment, as shown in FIG. 43, it may also be possible to configure the first inverter INV1 by the first driver transistor QND1 and the two first load transistors QPL1, and the second inverter INV2 by the second driver transistor QND2 and the two second load transistors QPL2. In this case, in the circuit configuration, the two first load transistors QLP1 are coupled in parallel with each other and the two second load transistors QLP2 are coupled in parallel with each other. This means that the gate width of each of the load transistors QPL1, QPL2 becomes greater effectively. Due to this, local variations are reduced and the operating margin can be improved. In the above-mentioned configuration, as shown in FIG. 43, one of the two first load transistors QPL1 is disposed in the first n well NW1 and the other is disposed in the second n well NW2. Further, one of the two second load transistors QPL2 is disposed in the first n well NW1 and the other is disposed in the second n well NW2.

In the memory cell MC6 in the fifth embodiment, by disposing the first positive-phase access transistor QNA1 and the first negative-phase access transistor QNA3 in the first p well PW1 and the second positive-phase access transistor QNA2 and the second negative-phase access transistor QNA4 in the third p well PW3 as described above, the array of the bit lines is changed as follows. That is, as shown in FIG. 42 and FIG. 44, in the memory cell MC6 in the fifth embodiment, the second metal wires 6A, 6B, 6C, 6E, 6G, 6I and 6K in the second wiring layer M2 are arranged in order of the first positive-phase bit line BL1 (6E), the first negative-phase bit line /BL1 (6I), the first power source potential line VDD1 (6B), the ground potential line VSS (6A), the second power source potential line VDD2 (6C), the second positive-phase bit line BL2 (6G), and the second negative-phase bit line /BL2 (6K) when viewed in the row direction. In other words, when the ground potential line VSS is viewed at the center, the first positive-phase bit line BL1 and the first negative-phase bit line /BL1 are arranged on the side of the first p well PW1 and the second positive-phase bit line BL2 and the second negative-phase bit line /BL2 are arranged on the side of the third p well PW3. In further other words, in this structure, a pair of complementary bit lines is arranged side by side on the same side when the ground potential line VSS is viewed at the center. As described above, by arranging the bit lines complementary to each other side by side, such as the first positive-phase bit line BL1 and the first negative-phase bit line /BL1, it is possible to reduce interference between ports.

As above, the invention made by the inventors of the present invention is explained specifically based on the embodiments, however, it is needless to say that the present invention is not limited to the embodiments and there can be various modified examples within the scope not deviating from its gist.

As a semiconductor device having an SRAM, any semiconductor device can be applied, which mounts an SRAM, such as a microprocessor and a system-on-chip (SOC).

The present invention can be applied widely to the manufacture of semiconductor devices having an SRAM.

What is claimed is:
1. A semiconductor device having a plurality of memory cells arranged in a row direction and a column direction of a semiconductor substrate,
   wherein for the semiconductor substrate, a first n well and a second n well of n-conductive type extending in the column direction, and a first p well, a second p well and a third p well of p-conductive type extending in the column direction, respectively, are formed, and the first p well, the first n well, the second p well, the second n well and the third p well are arranged in this order when viewed in the row direction;
   wherein the memory cell has a first inverter including a first driver transistor of n-channel type and a first load transistor of p-channel type, a second inverter including a second driver transistor of n-channel type and a second load transistor of p-channel type, and a positive-phase access transistor and a negative-phase access transistor of n-channel type;
   wherein cells of the memory cells, which are arranged side by side in the row direction, are connected by a word line extending along the row direction and cells of the memory cells, which are arranged side by side in the column direction, are connected by a positive-phase bit line and a negative-phase bit line extending along the column direction;
   wherein an output terminal of the first inverter is coupled to an input terminal of the second inverter as a first storage node and an input terminal of the first inverter is coupled to an output terminal of the second inverter as a second storage node;
   wherein in the positive-phase access transistor, a gate and the word line, a drain and the positive-phase bit line, and a source and the first storage node are coupled, respectively;
   wherein in the negative-phase access transistor, a gate and the word line, a drain and the negative-phase bit line, and a source and the second storage node are coupled, respectively;
   wherein the positive-phase access transistor is disposed in the first p well, the first load transistor is disposed in the first n well, the first driver transistor and the second driver transistor are disposed in the second p well, the second load transistor is disposed in the second n well, and the negative-phase access transistor is disposed in the third p well; and
   wherein cells of the memory cells, which neighbor each other when viewed in the row direction, share the first p well and the third p well, respectively.

2. The semiconductor device according to claim 1,
   wherein the positive-phase access transistor has a first positive-phase access transistor and a second positive-phase access transistor and the negative-phase access transistor has a first negative-phase access transistor and a second negative-phase access transistor.

3. The semiconductor device according to claim 2,
   wherein the word line has a first word line and a second word line, the positive-phase bit line has a first positive-phase bit line and a second positive-phase bit line, and the negative-phase bit line has a first negative-phase bit line and a second negative-phase bit line;
   wherein in the first positive-phase access transistor, a gate and the first word line, and a drain and the first positive-phase bit line are coupled, respectively, and in the second positive-phase access transistor, a gate and the second word line, and a drain and the second positive-phase bit line are coupled, respectively; and
   wherein in the first negative-phase access transistor, a gate and the first word line, and a drain and the first negative-phase bit line are coupled, respectively, and in the second negative-phase access transistor, a gate and the second word line, and a drain and the second negative-phase bit line are coupled, respectively.

4. The semiconductor device according to claim 3,
   wherein in the second p well, an active region in which the first driver transistor is disposed is arranged at a position nearer to the first n well than the second n well, and an active region in which the second driver transistor is disposed is arranged at a position nearer to the second n well than the first n well.

5. The semiconductor device according to claim 4,
   wherein over the semiconductor substrate, a first wiring layer, a second wiring layer and a third wiring layer are arranged via an interlayer insulating film in between;
   wherein sources of the first driver transistor and the second driver transistor are coupled to an identical ground potential line; and
   wherein the ground potential line is disposed in the first wiring layer and the second wiring layer and extends along the column direction.

6. The semiconductor device according to claim 5,
   wherein a source of the first load transistor is coupled to a first power source potential line and a source of the second load transistor is coupled to a second power source potential line;
   wherein the first power source potential line and the second power source potential line extend along the column direction and to the first power source potential line and the second power source potential line, an identical power source potential is supplied; and wherein the first power source potential line is disposed between the first positive-phase bit line and the second positive-phase bit line and the second power source potential line is disposed between the first negative-phase bit line and the second negative-phase bit line.

7. The semiconductor device according to claim 6,
wherein the first positive-phase bit line, the second positive-phase bit line, the first negative-phase bit line, the second negative-phase bit line, the ground potential line, the first power source potential line, and the second power source potential line are disposed in the second wiring layer.

8. The semiconductor device according to claim 7,
wherein the first positive-phase bit line, the first power source potential line, the second positive-phase bit line, the ground potential line, the second negative-phase bit line, the second power source potential line, and the first negative-phase bit line are arranged in this order when viewed in the row direction.

9. The semiconductor device according to claim 8,
wherein the first word line and the second word line are disposed in the third wiring layer;
wherein the first word line is coupled to a gate of the first positive-phase access transistor and a gate of the first negative-phase access transistor via a first word coupling wire disposed in the first wiring layer;
wherein the second word line is coupled to a gate of the second positive-phase access transistor and a gate of the second negative-phase access transistor via a second word coupling wire disposed in the first wiring layer;
wherein the first word coupling wire and the second word coupling wire are formed so as to extend along the column direction;
wherein in memory cells of the memory cells, which neighbor each other in the row direction, the first word coupling wire and the second word coupling wire are arranged side by side; and
wherein in memory cells of the memory cells, which neighbor each other in the column direction, the first word coupling wire and the second word coupling wire are arranged side by side.

10. The semiconductor device according to claim 9,
wherein a coupling plug that couples the first word coupling wire and a gate of the first positive-phase access transistor or a gate of the first negative-phase access transistor is formed at a position that overlaps in a planar manner an active region in which the first positive-phase access transistor or the first negative-phase access transistor is disposed; and
wherein a coupling plug that couples the second word coupling wire and a gate of the second positive-phase access transistor or a gate of the second negative-phase access transistor is formed at a position that overlaps in a planar manner an active region in which the second positive-phase access transistor or the second negative-phase access transistor is disposed.

11. The semiconductor device according to claim 3,
wherein in the second p well, an active region in which the first driver transistor is disposed and an active region in which the second driver transistor is disposed are arranged side by side along the column direction.

12. The semiconductor device according to claim 11,
wherein in the first p well, the first positive-phase access transistor and the second positive-phase access transistor are disposed in an identical active region that extends in the column direction; and
wherein in the third p well, the first negative-phase access transistor and the second negative-phase access transistor are disposed in an identical active region that extends in the column direction.

13. The semiconductor device according to claim 12,
wherein a first gate group including a gate of the first positive-phase access transistor, a gate of the first inverter, and a gate of the first negative-phase access transistor is disposed extending along the identical row direction;
wherein a second gate group including a gate of the second positive-phase access transistor, a gate of the second inverter, and a gate of the second negative-phase access transistor is disposed extending along the identical row direction;
wherein between the first gate group and the second gate group, a dummy gate that extends along the row direction and which is disposed so as to be equidistant from the first gate group and the second gate group is formed; and
wherein the dummy gate is not electrically coupled to any of the memory cells.

14. A semiconductor device having a plurality of memory cells arranged in a row direction and a column direction of a semiconductor substrate,
wherein for the semiconductor substrate, a first n well and a second n well of n-conductive type extending in the column direction, and a first p well, a second p well and a third p well of p-conductive type extending in the column direction, respectively, are formed, and the first p well, the first n well, the second p well, the second n well and the third p well are arranged in this order when viewed in the row direction;
wherein the memory cell has a first inverter including a first driver transistor of n-channel type and a first load transistor of p-channel type, a second inverter including a second driver transistor of n-channel type and a second load transistor of p-channel type, and a first positive-phase access transistor, a second positive-phase access transistor, a first negative-phase access transistor, and a second negative-phase access transistor of n-channel type;
wherein cells of the memory cells, which are arranged side by side in the row direction, are coupled by a first word line and a second word line extending along the row direction and cells of the memory cells, which are arranged side by side in the column direction, are coupled by a first positive-phase bit line, a second positive-phase bit line, a first negative-phase bit line, and a second negative-phase bit line extending along the column direction;
wherein an output terminal of the first inverter is coupled to an input terminal of the second inverter as a first storage node and an input terminal of the first inverter is coupled to an output terminal of the second inverter as a second storage node;
wherein in the first positive-phase access transistor, a gate and the first word line, a drain and the first positive-phase bit line, and a source and the first storage node are coupled, respectively, and in the second positive-phase access transistor, a gate and the second word line, a drain and the second positive-phase bit line, and a source and the first storage node are coupled, respectively;
wherein in the first negative-phase access transistor, a gate and the first word line, a drain and the first negative-phase bit line, and a source and the second storage node are coupled, respectively, and in the second negative-phase access transistor, a gate and the second word line, a drain and the second negative-phase bit line, and a source and the second storage node are coupled, respectively;

wherein the first positive-phase access transistor and the first negative-phase access transistor are disposed in the first p well, the first driver transistor and the second driver transistor are disposed in the second p well, and the second positive-phase access transistor and the second negative-phase access transistor are disposed in the third p well; and wherein cells of the memory cells, which neighbor each other when viewed in the row direction, share the first p well and the third p well, respectively.

15. The semiconductor device according to claim 14,
wherein the first inverter includes the first driver transistor and the two first load transistors coupled in parallel with each other;
wherein the second inverter includes the second driver transistor and the two second load transistors coupled in parallel with each other;
wherein one of the two first load transistors is disposed in the first n well and the other is disposed in the second n well; and
wherein one of the two second load transistors is disposed in the first n well and the other is disposed in the second n well.

16. The semiconductor device according to claim 15,
wherein a source of the first load transistor is coupled to a first power source potential line and a source of the second load transistor is coupled to a second power source potential line;
wherein the first power source potential line and the second power source potential line extend along the column direction and to the first power source potential line and the second power source potential line, an identical power source potential is supplied;
wherein sources of the first driver transistor and the second driver transistor are coupled to an identical ground potential line;
wherein over the semiconductor substrate, a first wiring layer, a second wiring layer, and a third wiring layer are arranged via an interlayer insulating film in between;
wherein the first positive-phase bit line, the second positive-phase bit line, the first negative-phase bit line, the second negative-phase bit line, the ground potential line, the first power source potential line, and the second power source potential line are disposed in the second wiring layer; and
wherein the first positive-phase bit line, the first negative-phase bit line, the first power source potential line, the ground potential line, the second power source potential line, the second positive-phase bit line, and the second negative-phase bit line are arranged side by side in this order when viewed in the row direction.

17. A semiconductor device having a plurality of static memory cells arranged in a row direction and a column direction of a semiconductor substrate,
wherein the static memory cell has a first inverter including a first driver transistor of n-channel type and a first load transistor of p-channel type, a second inverter including a second driver transistor of n-channel type and second load transistor of p-channel type, and a positive-phase access transistor and a negative-phase access transistor of n-channel type;

wherein cells of the static memory cells, which are arranged side by side in the row direction, are coupled by a word line that extends along the row direction and cells of the static memory cells, which are arranged side by side along the column direction, are coupled by a positive-phase bit line and a negative-phase bit line that extend along the column direction;

wherein an output terminal of the first inverter is coupled to an input terminal of the second inverter as a first storage node and an input terminal of the first inverter is coupled to an output terminal of the second inverter as a second storage node;

wherein in the positive-phase access transistor, a gate and the word line, a drain and the positive-phase bit line, and a source and the first storage node are coupled, respectively;

wherein in the negative-phase access transistor, a gate and the word line, a drain and the negative-phase bit line, and a source and the second storage node are coupled, respectively;

wherein the positive-phase access transistor, the first load transistor, the first driver transistor and the second driver transistor, the second load transistor, and the negative-phase access transistor are arranged in this order along the row direction; and wherein in cells of the static memory cells, which neighbor each other when viewed in the row direction, the positive-phase access transistors or the negative-phase access transistors neighbor each other.

18. The semiconductor device according to claim 17,
wherein the positive-phase access transistor has a first positive-phase access transistor and a second positive-phase access transistor; and
wherein the negative-phase access transistor has a first negative-phase access transistor and a second negative-phase access transistor.

19. The semiconductor device according to claim 18,
wherein the word line has a first word line and a second word line, the positive-phase bit line has a first positive-phase bit line and a second positive-phase bit line, and the negative-phase bit line has a first negative-phase bit line and a second negative-phase bit line;
wherein in the first positive-phase access transistor, a gate and the first word line, and a drain and the first positive-phase bit line are coupled, respectively, and in the second positive-phase access transistor, a gate and the second word line, and a drain and the second positive-phase bit line are coupled, respectively; and
wherein in the first negative-phase access transistor, a gate and the first word line, and a drain and the first negative-phase bit line are coupled, respectively, and in the second negative-phase access transistor, a gate and the second word line, and a drain and the second negative-phase bit line are coupled, respectively.

20. The semiconductor device according to claim 19,
wherein an active region in which the first driver transistor is disposed and an active region in which the second driver transistor is disposed are arranged in this order along the row direction.

* * * * *